(12) United States Patent
Swisher

(10) Patent No.: US 11,999,864 B2
(45) Date of Patent: Jun. 4, 2024

(54) MOLECULAR INK AND METHOD FOR PRINTING RESISTIVE FILM COATINGS

(71) Applicant: Liquid X Printed Metals, Inc., Pittsburgh, PA (US)

(72) Inventor: Robert Swisher, Pittsburgh, PA (US)

(73) Assignee: LIQUID X PRINTED METALS, INC., Pittsburgh, PA (US)

(*) Notice: Subject to any disclaimer, the term of this patent is extended or adjusted under 35 U.S.C. 154(b) by 145 days.

(21) Appl. No.: 17/839,133

(22) Filed: Jun. 13, 2022

(65) Prior Publication Data

US 2022/0306888 A1    Sep. 29, 2022

Related U.S. Application Data

(63) Continuation-in-part of application No. PCT/US2021/016080, filed on Feb. 1, 2021.
(Continued)

(51) Int. Cl.
*C09D 11/52* (2014.01)
*B41M 3/00* (2006.01)
(Continued)

(52) U.S. Cl.
CPC .............. *C09D 11/52* (2013.01); *B41M 3/006* (2013.01); *B41M 5/0023* (2013.01);
(Continued)

(58) Field of Classification Search
CPC ..... C09D 11/52; C09D 11/033; C09D 11/037; C09D 11/32; C09D 11/322; C09D 11/36;
(Continued)

(56) References Cited

U.S. PATENT DOCUMENTS

| 4,803,096 A | 2/1989 | Kuhn et al. |
| 5,408,873 A | 4/1995 | Schmidt et al. |

(Continued)

FOREIGN PATENT DOCUMENTS

| WO | 2009132665 A1 | 11/2009 |
| WO | 2018032026 A1 | 2/2018 |

OTHER PUBLICATIONS

International Search Report and Written Opinion dated Sep. 12, 2022 for corresponding PCT Application No. PCT/US2022/031639.
(Continued)

*Primary Examiner* — Mark Kopec
*Assistant Examiner* — Jaison P Thomas
(74) *Attorney, Agent, or Firm* — Dentons Cohen & Grigsby P.C.

(57) ABSTRACT

Described herein are molecular inks, methods for printing the molecular inks on flexible substrates, and methods for forming printed electronic elements, such as resistive heaters, force sensors, motion sensors, and devices that include these elements, such as force responsive conductive heaters. The methods include printing a molecular ink on a flexible substrate that is heated to 30° C. to 90° C. before and/or during the printing process and curing the substrate to produce a conductive pattern thereon. The molecular inks generally include a particle-fee metal-complex composition formulated from at least one metal complex and a solvent, and optionally, a conductive filler material, and/or surfactant.

23 Claims, 32 Drawing Sheets

Related U.S. Application Data

(60) Provisional application No. 62/967,858, filed on Jan. 30, 2020, provisional application No. 62/967,883, filed on Jan. 30, 2020, provisional application No. 62/968,007, filed on Jan. 30, 2020.

(51) Int. Cl.
| | |
|---|---|
| *B41M 5/00* | (2006.01) |
| *C09D 11/033* | (2014.01) |
| *C09D 11/037* | (2014.01) |
| *C09D 11/32* | (2014.01) |
| *C09D 11/322* | (2014.01) |
| *C09D 11/36* | (2014.01) |
| *C09D 11/38* | (2014.01) |
| *G01L 1/18* | (2006.01) |
| *G01L 5/22* | (2006.01) |
| *H05B 1/02* | (2006.01) |
| *H05B 3/03* | (2006.01) |
| *H05B 3/12* | (2006.01) |
| *H05B 3/34* | (2006.01) |
| *H05K 1/03* | (2006.01) |
| *H05K 1/09* | (2006.01) |
| *H05K 3/12* | (2006.01) |

(52) U.S. Cl.
CPC ......... *B41M 5/0047* (2013.01); *C09D 11/033* (2013.01); *C09D 11/037* (2013.01); *C09D 11/32* (2013.01); *C09D 11/322* (2013.01); *C09D 11/36* (2013.01); *C09D 11/38* (2013.01); *G01L 1/18* (2013.01); *G01L 5/22* (2013.01); *H05B 1/0213* (2013.01); *H05B 1/0238* (2013.01); *H05B 3/03* (2013.01); *H05B 3/12* (2013.01); *H05B 3/34* (2013.01); *H05K 1/032* (2013.01); *H05K 1/038* (2013.01); *H05K 1/0393* (2013.01); *H05K 1/092* (2013.01); *H05K 3/125* (2013.01); *H05B 2203/013* (2013.01); *H05B 2203/029* (2013.01); *H05B 2214/02* (2013.01); *H05K 2203/11* (2013.01)

(58) Field of Classification Search
CPC ..... C09D 11/38; B41M 3/006; B41M 5/0023; B41M 5/0047; B41M 5/0011; B41M 5/0064; B41M 7/0081; B41M 7/009; G01L 1/18; G01L 5/22; H05B 1/0213; H05B 1/0238; H05B 3/03; H05B 3/12; H05B 3/34; H05B 2203/013; H05B 2203/029; H05B 2214/02; H05B 2203/036; H05K 1/032; H05K 1/038; H05K 1/0393; H05K 1/092; H05K 3/125; H05K 2203/11; D06M 11/74; D06M 11/83; D06M 13/188; D06M 13/192; D06M 13/332; D06M 15/227; D06M 15/233; D06M 15/61; D06M 15/63; D06M 23/16; D06P 5/30

See application file for complete search history.

(56) References Cited

U.S. PATENT DOCUMENTS

| | | | |
|---|---|---|---|
| 6,155,120 A | 12/2000 | Taylor | |
| 6,229,123 B1 * | 5/2001 | Kochman | H05B 3/58 |
| | | | 219/549 |
| 6,516,546 B1 | 2/2003 | Bremick | |
| 6,543,299 B2 | 4/2003 | Taylor | |
| 7,132,630 B2 | 11/2006 | Qi et al. | |
| 8,161,826 B1 | 4/2012 | Taylor | |
| 8,661,915 B2 | 3/2014 | Taylor | |
| 9,487,669 B2 | 11/2016 | McCullough et al. | |
| 9,920,212 B2 | 3/2018 | McCullough et al. | |
| 10,180,721 B2 | 1/2019 | Hoen et al. | |
| 10,738,211 B2 | 8/2020 | McCullough et al. | |
| 11,118,078 B2 | 9/2021 | McCullough et al. | |
| 2008/0073130 A1 | 3/2008 | Bulgajewski et al. | |
| 2008/0202251 A1 | 8/2008 | Serban et al. | |
| 2011/0111138 A1 * | 5/2011 | McCullough | C09D 11/322 |
| | | | 556/113 |
| 2011/0240751 A1 | 10/2011 | Rauh et al. | |
| 2013/0236656 A1 * | 9/2013 | McCullough | C09D 11/322 |
| | | | 427/532 |
| 2016/0062526 A1 | 3/2016 | Delmaere et al. | |
| 2018/0132310 A1 | 5/2018 | Unalan et al. | |
| 2018/0362547 A1 | 12/2018 | Shukla et al. | |
| 2019/0003818 A1 | 1/2019 | Asaka et al. | |
| 2019/0112055 A1 | 4/2019 | Burton et al. | |
| 2019/0249026 A1 * | 8/2019 | Gwengo | B41M 3/006 |
| 2020/0283653 A1 | 9/2020 | Swisher et al. | |
| 2020/0369061 A1 | 11/2020 | Petrak et al. | |
| 2022/0099504 A1 | 3/2022 | Yuan et al. | |
| 2023/0064831 A1 | 3/2023 | Gwengo et al. | |

OTHER PUBLICATIONS

International Search Report dated Apr. 14, 2021 for corresponding International Application No. PCT/US2021/016080.
International Search Report dated Oct. 12, 2023 for corresponding International Application No. PCT/US2023/025180.

* cited by examiner

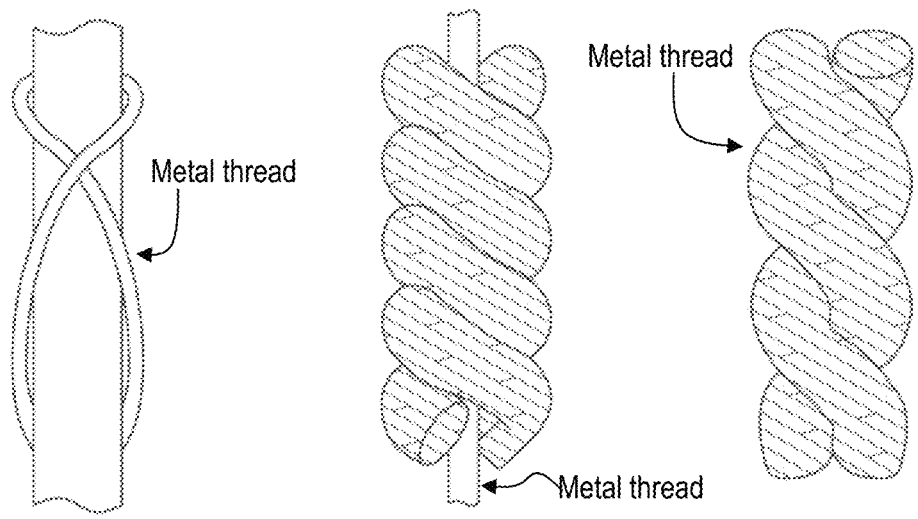
(PRIOR ART)
FIG. 1A
(PRIOR ART)
FIG. 1B
(PRIOR ART)
FIG. 1C
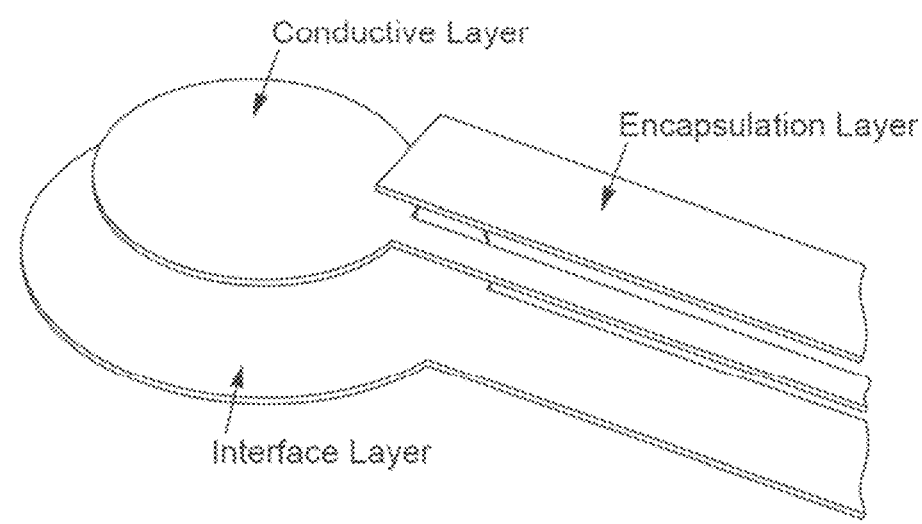
(PRIOR ART)
FIG. 2

FIG. 3A PRIOR ART
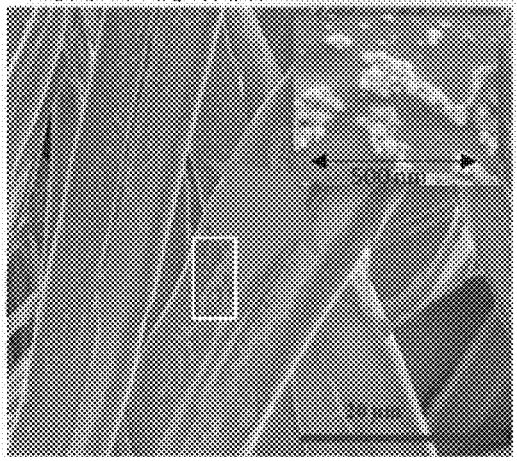
FIG. 3B PRIOR ART
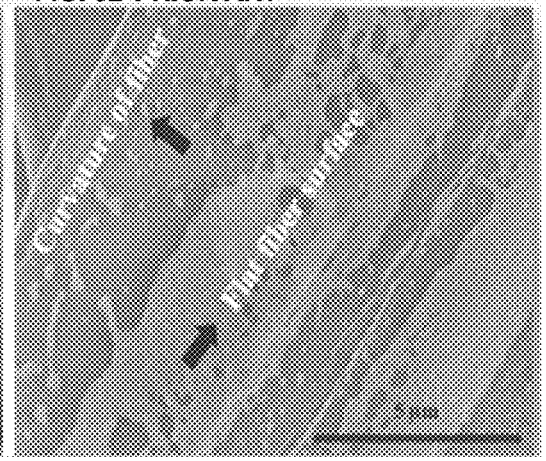
FIG. 3C PRIOR ART
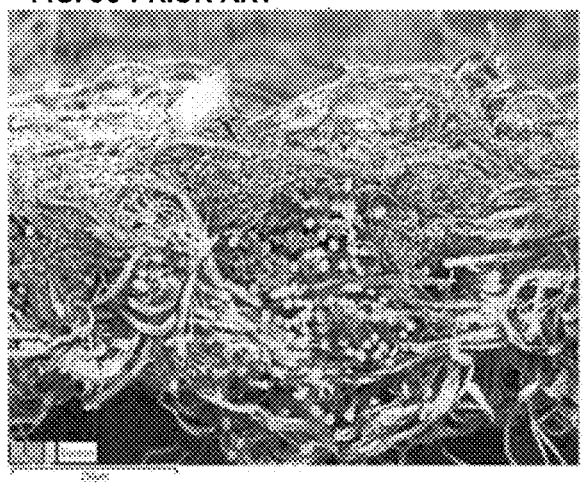
FIG. 3D PRIOR ART
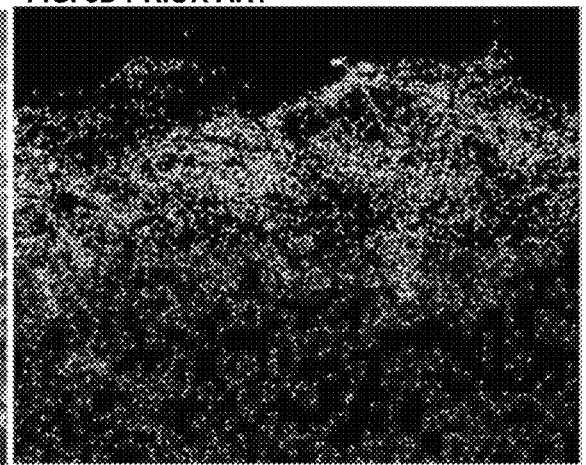
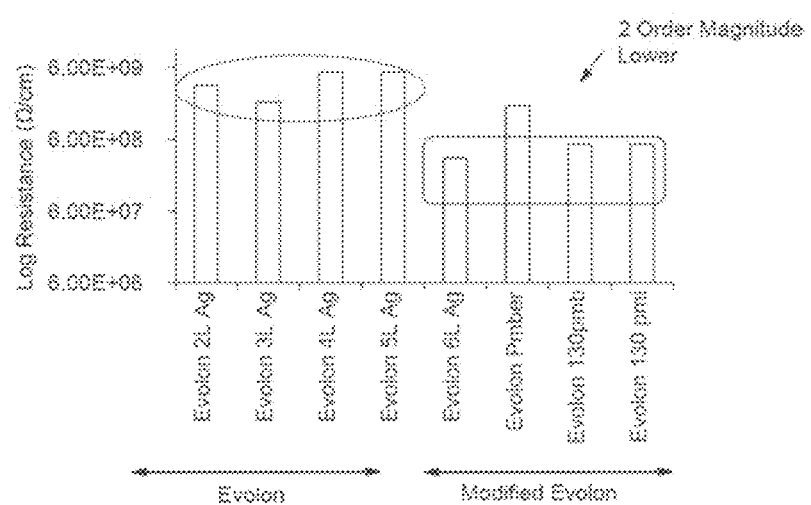
FIG. 3E PRIOR ART

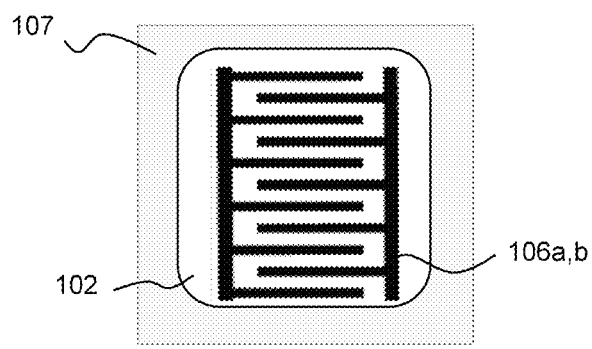
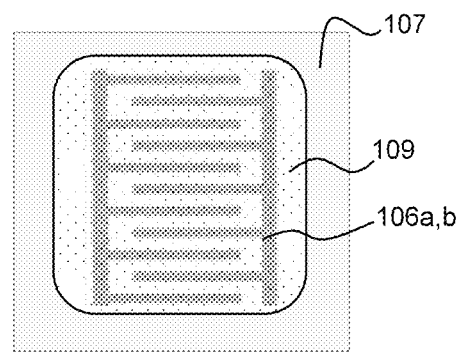
FIG. 24B   FIG. 24C
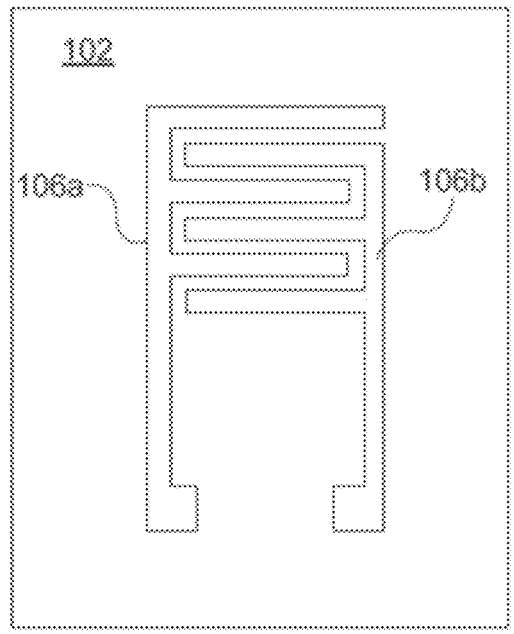
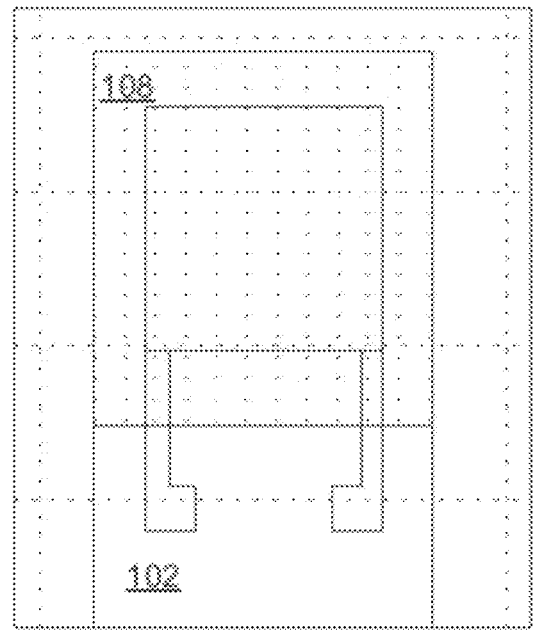
FIG. 25A   FIG. 25B

MOLECULAR INK AND METHOD FOR PRINTING RESISTIVE FILM COATINGS

CROSS-REFERENCE TO RELATED APPLICATIONS

The present application is a continuation-in-part filed under 35 U.S.C. § 111(a) of International Application PCT/US2021/016080, filed on Feb. 1, 2021, which claims the benefit under 35 U.S.C. § 119(e) of prior U.S. Provisional Application Ser. No. 62/967,858 titled "Fabric Based Force Sensor", U.S. Provisional Application Ser. No. 62/967,883 titled "Flexible Conductive Heating Elements", and U.S. Provisional Application Ser. No. 62/968,007 titled "Force Sensor Controlled Conductive Heating Elements", all filed Jan. 30, 2020, the entire contents of each incorporated herein.

TECHNICAL FIELD

This disclosure pertains generally to metal and metal alloy inks, methods for printing the inks on flexible substrates, flexible substrates having resistive and/or conductive patterns printed thereon, and flexible printed electronics formed using the inks.

BACKGROUND

Printed electronics is one of the fastest growing technologies in the world, providing integration of complex electronic functionality into a wide range of products. Suitable inks are essential for the manufacture of these printed electronics, with conductive inks considered the most important materials for a variety of electrodes. In general, conductive inks composed of conductive metal nanoparticles are used to print or coat a substrate using a range of printing systems and techniques, followed by drying or sintering to form a metal trace or wire with a desired shape. While these inks offer a solution to some of the difficulties with prior art methods for providing conductive paths on substrates such as glass, they are generally not suitable for textiles that may melt or deform at the high sintering temperatures employed in curing the inks, and/or are not suitable for flexible substrates as they frequently demonstrate reduced conductivity upon bending or stretching of the textile.

Nonetheless, the current interest in flexible electronics such as electronic textiles or "e-textiles" has led to the development of a wide range of electronic elements. For example, US Pat. Application Publication 2018/0132310 describes conductive heating elements formed by inclusion of metal nanowires in the weave of a textile; and U.S. Pat. No. 7,132,630 describes inclusion of conductive polyaniline fibers in the textile to provide resistive heating with an applied voltage. European Pat. Application Publication 0302590 describes conductive fabrics formed by application of an aqueous solution of a pyrrole or aniline compound to the fabric, whereupon polymerization of the pyrrole or aniline in the fabric weave provides a resistive heater.

Force resistive sensors are also described in the prior art, but are generally stiff and non-stretchable, a limitation that is particularly relevant in e-textiles. Such elements have been included in the soles or inner soles of shoes to generate data regarding the user's gait, pressure distribution and/or pronation. See for example U.S. Pat. Nos. 6,155,120 and 6,516,545, which describe piezoresistive pressure sensors for use on the insoles of shoes. The sensors are formed by impregnating a top and bottom layer of mesh fabric with a conductive carbon black particulate material and placing a piezoresistive material therebetween. See also U.S. Pat. No. 5,408,873, which discloses electrically isolated conductive paths as columns of aligned conductive particles extending between a first face of electrically resistive carbon ink and a second face of conductive silver ink.

More flexible force sensors, such as disclosed in U.S. Pat. Nos. 6,543,299, 8,161,826, and 8,661,915, include pressure transducer arrays formed from rows and columns of electrically conductive wire core covered by a piezoresistive material; and U.S. Pat. No. 10,180,721, which describes a fabric-based force sensor formed with electrodes of electrically conductive strands on a compressible polymer substrate.

While certain of these solutions provide flexible resistive heaters and force sensors, each describes the use of conductive strands of material that are woven to form the conductive element in the flexible substrate, or conductive inks that perform poorly when the flexible substrate undergoes normal stresses, such as bending and stretching. Accordingly, there is still need in the art to develop inks and methods that provide flexible electronic elements integral with the textile.

SUMMARY

Described herein are molecular inks and methods for printing those inks on flexible substrates to form flexible printed electronics and/or resistive coatings. Accordingly, the present disclosure relates to metal and metal alloy inks, methods of printing those inks on flexible substrates to form conductive and/or resistive patterns, and flexible printed electronics comprising those conductive and/or patterns, such as sensors, electrodes, traces, antennae, heating elements, and the like.

The molecular inks are generally particle-free solutions comprising at least one metal complex and a solvent. The molecular inks may further comprise additional components such as conductive filler materials and/or surfactants. Upon deposition, the molecular inks conformally coat the substrate, and in particular for textile substrates, fibers of the substrate. After curing, the molecular inks form continuous conductive or resistive patterns or coatings that comprise metal nanoparticles.

The at least one metal complex of the particle-free metal complex composition, i.e., molecular ink, generally comprises at least one metal, at least one first ligand, and at least one second ligand. Exemplary metals include silver, gold, platinum, and copper. Exemplary first ligands include amines and sulfur containing compounds, and exemplary second ligands include carboxylic acids, dicarboxylic acids, and tricarboxylic acids.

The molecular inks may comprise one or more metal complexes, such as a first metal complex and a second metal complex. Exemplary combinations of metal complexes comprise any combination of silver, gold, platinum, and copper complexes, such as silver complexes and copper complexes, or silver complexes and gold complexes, etc. The molecular inks may comprise various ratios of the first and second metal complex, such as 1-99 wt. % or the first metal complex and 99-1 wt. % of the second metal complex. As a specific example, the molecular inks may comprise 99 to 75 wt. % silver complex, such as a silver amine carboxylate, and 1 to 25 wt. % of a copper complex, such as a copper amine carboxylate.

According to certain aspects, the molecular inks disclosed herein may comprise conductive filler materials. The conductive filler materials may comprise one or more of a conductive polymer, a metal oxide, and a carbon-based material. Exemplary conductive filler materials include at least carbon black, graphite, polypyrrole (PPy), poly[3,4-ethylenedioxythiophene] (PEDOT), polyacetylene, polythiophene (PT), graphene, polyphenylene, carbon nanotubes (CNTs), polyaniline (PANT), and polyphenylene ethylene. When a conductive filler is included in the molecular ink, the at least one metal complex and the at least one conductive filler may be provided in a ratio of metal complex to conductive filler of 50:50 to 99:1.

According to certain aspects, the molecular inks disclosed herein may comprise one or more surfactants. The surfactants may comprise anionic, cationic, nonionic, or amphoteric surfactants, which may be present in the amount of 0.001-5 wt. %, such as 0.01-3 wt. %, or 0.01-2 wt. %, or not more than 0.01 wt. %, based on the total weight of the ink. Exemplary surfactants may be those useful to reduce the surface tension of the molecular inks, such as silicone-based surfactants. Exemplary surfactants of particular use include polydimethyl siloxanes and modified polydimethyl siloxanes, e.g., polyether-modified polydimethylsiloxane.

The molecular inks disclosed herein comprise a solvent. The solvent may be a hydrocarbon solvent. Alternatively, the solvent may comprise one or more polar protic solvents, such as at least two polar protic solvents selected from the group comprising at least water, alcohols, amines, amino alcohols, polyols, and combinations thereof, and may be substantially free of hydrocarbon solvents.

The metal complexes in the molecular inks may have a solubility at 25° C. in the solvent of at least 50 mg/ml, or at least 250 mg/ml, or at least 500 mg/ml, or at least 1,000 mg/ml, or at least 1,500 mg/ml, or at least 2,000 mg/ml.

The methods of printing the molecular inks generally comprise depositing the molecular ink on a flexible substrate and curing the substrate to produce a conductive pattern thereon. Curing the flexible substrate may be accomplished by exposing the substrate to heat and/or light. For example, the substrate may be cured by exposure to heat, such as at temperatures of less than 250° C., or less than 200° C., or less than 150° C. Alternatively, or in addition, curing may include irradiating the textile substrate, such as by exposure to 2 to 20 pulses of light, e.g., photonic curing, or may include exposure to infrared radiation.

Once cured, the conductive pattern on the substrate may have a sheet resistance as low as 5Ω/□, 2Ω/□, 1Ω/□, or even lower. The conductive pattern on the substrate may have a conductivity of at least 1,000 S/m, such as at least 5,000 S/m, or at least 10,000 S/m, or at least 50,000 S/m, or at least 100,000 S/m, or at least 1,000,000 S/m, or at least 10,000,000 S/m, or even $2\times10^7$ S/m.

Mixtures of metal complexes may be used to tune the conductivity of the cured molecular inks. For example, mixtures of silver and copper complexes may be used to form a molecular ink capable of providing a conductive pattern or coating having a resistance of $10^{-3}$ to $10^{-5}$ ohm-cm (i.e., conductivity in the range of 10,000 S/m to 1,000,000 S/m or even 10,000 S/m to 10,000,000 S/m), or resistivity of 0.5 to 200 Ohm/square, or even higher.

The substrate may be heated to a temperature of 30° C. to 90° C. before and/or during the deposition process, such as 30° C. to 60° C., or 40° C. to 90° C. before and/or during the deposition process.

Deposition on the substrate may be via flexographic printing, gravure printing, gravure offset printing, rotary screen process printing, pneumatic aerosol jet printing, ultrasonic aerosol jet printing, extrusion printing, slot die printing, microdispersion, direct write printing, inkjet printing or a combination. When the molecular ink remains particle-free it may be printed via inkjet printing to produce a printed pattern that exhibits an ink bleed of less than 0.5 mm, such as less than 0.2 mm, or even less than 0.1 mm.

The printed pattern may include one or more layers of the molecular ink, such as at least 2 layers, or at least 4 layers, or at least 6 layers or more of the molecular ink.

The flexible substrate may include polymers, organic and synthetic fibers, plastics, leather, metals, ceramics, glasses, silicon, semiconductors, and other solids can be used. Organic and inorganic substrates can be used. The substrate may be a textile such as a knit, woven, or nonwoven textile or fabric formed of organic or synthetic fibers. Exemplary fibers of such textile substrates include at least polyester, polyamides, nylon, Evolon®, elastane, and other synthetic materials, in addition to organic materials (e.g., cotton, cellulose, silk, wood, wool fibers, leather). The substrate may be a flexible polymer, such as polyimide (PI) films such as Kapton®, polyethylene terephthalate (PET) films, polyethersulfone (PES) films, polyetheretherketone (PEEK) films, and polyamide (PA) and polyamideimide (PAI) films.

The presently disclosed inks and methods for printing those inks allow conductive patterns to be printed on flexible substrates, thus greatly broadening the range of products in which electronic elements may be incorporated. For example, the present disclosure provides force sensors and resistive heaters provided on a flexible substrate, and systems that provide force activated control of a resistive heater such as in a seat cushion and/or seat base. The present inks may be used to provide resistive coatings or patterns, such as to form large scale heaters, e.g., airplane wing deicing, and/or to dissipate electric energies from lightning strikes.

Accordingly, the present disclosure also relates to resistive heaters comprising a flexible substrate having at least one conductive pattern printed thereon configured to carry a current and generate heat. The resistive heater may further comprise at least one trace or bus connected to the at least one conductive pattern and configured to provide electric connection to a heater controller and a power source. The at least one trace or bus may be printed using the molecular inks and methods of the present disclosure or may include wired components and/or contacts. According to certain aspects, a portion of the conductive pattern and/or printed bus may be over-coated with a protective dielectric coating.

When connected to an electrical system, such as a 5-15 volt automotive electrical system, the resistive heater may heat at a rate of about 0.1° C./second to about 1° C./second; may be configured to have a resistance of 1-30 ohms; may generate 10-400 watts per square meter at −40° C. to 60° C.; and/or may be configured to carry a power density of at least 400 watts per square meter. The resistivity of the molecular inks may be tuned by use of combinations of metal complexes, such as combinations of silver and coper complexes. As such, the molecular inks may provide resistive coatings and patterns configured to have a resistivity of 1 to 200 ohms/square (i.e., 1 to 25 wt. % copper based on the total metal content), resistance of 30-600 ohms and/or may be configured to carry a power density of at least 500 watts per square meter, such as at least 5,000 watts per square meter or at least 10,000 watts per square meter.

The present disclosure also relates to flexible force sensitive resistors, or force sensors, that may be directly printed on a flexible substrate. The force sensing devices generally comprise at least one electrode layer separated from at least one conductive layer by a gap having a separation distance. The at least one electrode layer may comprise at least one electrode printed using any of the molecular inks disclosed herein. The at least one electrode layer may comprise first and second electrodes that are printed on the flexible substrate using the molecular ink, wherein the first and second electrodes may be arranged parallel or interdigitally to one another. The at least one conductive layer may be printed with the presently disclosed molecular ink, a resistive carbon-based ink, a conductive paint, indium tin oxide (ITO), or a combination thereof, or may comprise any of a poly(3, 4-ethylenedioxythiophene) polystyrene sulfonate (PEDOT: PSS), a carbon nanotube-based thin film (CNT), a carbon-loaded thermoplastic polymer, carbon-loaded silicone, carbon-loaded polymeric foil, velostat, or any combination thereof.

The force sensitivity range for individual sensors may be controlled by the separation distance between the printed conductive layers, the conductivity of the various layers, and/or the number of conductive layers incorporated into the sensor.

The various flexible substrates of the flexible sensor may be position so that the at least one electrode faces and is separated from the at least one conductive layer by a gap having a separation distance. As a force is applied to the force sensor, the at least one electrode and conductive layer are brought into closer proximity, thus reducing the separation distance and an electrical resistivity of the force sensor and generating an electrical signal indicative of the force applied to the force sensor.

The force sensor may further comprise a control circuitry, a transceiver, and a controller, wherein the control circuitry is configured to carry the electrical signal to the transceiver and communicate a registered force or change in resistance to the controller.

The controller device may communicate the registered force with an external, connectable machine to control specific actions, such as powering a connected device to initiate movement, lighting, heating, and the like. For example, force sensor(s) and resistive heater(s) according to the present disclosure may be connected to provide a force sensor controlled resistive heater.

Accordingly, the present disclosure also relates to a device for sensor control of a resistive heater. Such a device may generally comprise at least one heating layer including a resistive heater, at least one sensing element including a force sensor, an electronic element configured to relay power to the device and sense contact with the device via at least one force sensor of the sensing element. A sensing controller may be configured to receive an electrical signal from the sensing element and, responsive of the electrical signal, send a control signal to the resistive heater. In this way, individual forces on the sensing element(s) may provide feedback to the heating element(s) to provide fine-tuned control of the heating element(s) and allow for conservation of battery use, or improved comfort control for the user. For example, should a user manually turn on a heater but not be positioned in the seat, the heater may turn off, or should a user shift in a seat so that contact is no longer made with a back portion of the seat, as sensed by at least one of the force sensors, the heater in the back portion of the seat may turn off or provide a higher or lower power.

BRIEF DESCRIPTION OF THE DRAWINGS

Aspects, features, benefits and advantages of the embodiments herein will be apparent with regard to the following description, appended claims, and accompanying drawings. In the following figures, like numerals represent like features in the various views. It is to be noted that features and components in these drawings, illustrating the views of embodiments of the present disclosure, unless stated to be otherwise, are not necessarily drawn to scale.

FIGS. 1A-1C illustrate prior art methods for incorporating conductive materials to a textile, such as by incorporating conductive threads.

FIG. 2 illustrates a prior art method for incorporating conductive traces between insulating or protective layers.

FIGS. 3A-3E illustrate aspects of the prior art nanoparticle inks printed on a non-woven textile, where FIGS. 3A and 3B are two different magnifications of scanning electron micrograph (SEM) images of a single layer of nanoparticle silver ink printed on Evolon®; FIG. 3C is a cross sectional view SEM image of the same textile, wherein the fibers are colored green and the nanoparticle silver ink is shown in red; FIG. 3D shows the distribution of the nanoparticle silver ink throughout the textile shown in FIG. 3C (i.e., only the nanoparticle silver ink is shown); and FIG. 3E shows resistance readings for 2 to 5 layers of nanoparticle inks printed on Evolon® or modified Evolon®.

FIGS. 24B and 24C illustrate top views of an electrode layer of a force sensor of the present disclosure showing a spacer frame and spacer dots, respectively, for maintaining the gap between the electrode layer and a conductive layer.

FIGS. 25A-25B are photographs of electrodes 1 and 2 of the force sensing devices of the present disclosure, wherein FIG. 25B includes a conductive layer over the electrode layer.

FIGS. 29A and 29B illustrate exemplary functionality of the car seat shown in FIG. 28, wherein FIG. 29A illustrates an inside view of force sensors in the seat bolster material, and FIG. 29B illustrates an inside view of force sensors in the head rest material.

FIGS. 32 and 33 illustrate electrical signaling, i.e., a change in the resistance, from a force sensor to a transceiver in electrical communication with a controller according to aspects of the present disclosure, wherein FIG. 32 shows a configuration when the force sensor and transceiver are part of a car seat.

DETAILED DESCRIPTION

Figure 4A:
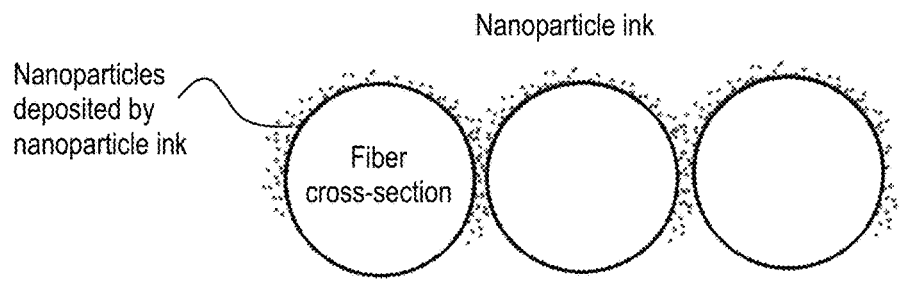
FIGS. 4A and 4B are schematic diagrams showing the coating of textile fibers by a nanoparticle ink of the prior art and conformal coating of textile fibers by the particle-free inks of the present disclosure, respectively.

In the following description, the present disclosure is set forth in the context of various alternative embodiments and implementations involving molecular inks, methods for printing these inks on textiles and flexible substrates, conductive traces printed on flexible substrates such as textiles, and electronic devices (e.g., e-textiles) comprising these conductive traces. While the following description discloses numerous exemplary embodiments, the scope of the present patent application is not limited to the disclosed embodiments, but also encompasses combinations of the disclosed embodiments, as well as modifications to the disclosed embodiments.

Definitions and Abbreviations.

Various aspects of the molecular inks, traces printed using those inks, and printed electronic elements and devices disclosed herein may be illustrated by describing components that are coupled, attached, and/or joined. As used herein, the terms "coupled", "attached", and/or "joined" are interchangeably used to indicate either a direct connection between two components or, where appropriate, an indirect connection to one another through intervening or intermediate components. In contrast, when a component is referred to as being "directly coupled", "directly attached", and/or "directly joined" to another component, there are no intervening elements shown in said examples.

Various aspects of the molecular inks, traces, printed electronic elements and devices, and methods disclosed herein may be described and illustrated with reference to one or more exemplary implementations. As used herein, the term "exemplary" means "serving as an example, instance, or illustration," and should not necessarily be construed as preferred or advantageous over other variations of the devices, systems, or methods disclosed herein. "Optional" or "optionally" means that the subsequently described event or circumstance may or may not occur, and that the description includes instances where the event occurs and instances where it does not. In addition, the word "comprising" as used herein means "including, but not limited to".

Relative terms such as "lower" or "bottom" and "upper" or "top" may be used herein to describe one element's relationship to another element illustrated in the drawings. It will be understood that relative terms are intended to encompass different orientations of the elements and/or devices disclosed herein in addition to the orientation depicted in the drawings. By way of example, if aspects of a force sensor shown in the drawings are turned over, elements described as being on the "bottom" side of the other elements would then be oriented on the "top" side of the other elements as shown in the relevant drawing. The term "bottom" can therefore encompass both an orientation of "bottom" and "top" depending on the particular orientation of the drawing.

It must also be noted that as used herein and in the appended claims, the singular forms "a", "an", and "the" include the plural reference unless the context clearly dictates otherwise. For example, although reference is made to "a" textile, "an" upper layer, "a" metal, "an" ink, and "the" metal complex, one or more of any of these components and/or any other components described herein can be used.

Moreover, other than in any operating examples, or where otherwise indicated, all numbers expressing, for example, quantities of ingredients used in the specification and claims are to be understood as being modified in all instances by the term "about". Accordingly, unless indicated to the contrary, the numerical parameters set forth in the following specification and appended claims are approximations that may vary depending upon the desired properties to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

"Substantially free", as used herein, is understood to mean inclusive of only trace amounts of a constituent. "Trace amounts" are those quantitative levels of a constituent that are barely detectable and provide no benefit to the functional properties of the subject composition, process, or articles formed therefrom. For example, a trace amount may constitute 1.0 wt. %, 0.5 wt. %, 0.1 wt. %, 0.05 wt. %, or even 0.01 wt. % of a component of any of the particle-free ink formulations disclosed herein. "Totally free", as used herein, is understood to mean completely free of a constituent.

The terms flexible substrate and textile substrate are used interchangeably throughout the specification and may be understood to mean any woven or non-woven, organic or synthetic substrate unless specifically indicated otherwise. Moreover, when a fiber is referred to, it may be part of a woven or non-woven flexible substrate unless specifically indicated otherwise.

Unless defined otherwise, all technical and scientific terms used herein have the same meanings as commonly understood by one of ordinary skill in the art.

Aspects of the Invention

The invention provided in the present disclosure includes novel molecular inks and methods for printing these molecular inks on textiles and other flexible substrates to form conductive and resistive traces, coatings, and patterns (used interchangeably and referred to herein as "conductive traces"). These conductive traces may be patterned to form flexible electronic elements, e.g., when printed on a textile the conductive traces may form part or all of an e-textile.

Flexible electronic elements find use in a range of different applications, including at least wearable sensors for fitness and health monitoring, gas sensors and filters for use in industrial applications, antimicrobial dressings for use in medical applications, flexible energy storage devices, flexible force sensors, heating elements, resistive films, batteries, and communication devices. In preferred applications, the flexible electronic elements formed by the presently disclosed molecular inks and methods include force sensitive resistors, i.e., force sensors, and flexible resistive heaters, such as a silver-based textile heater, and combinations thereof, such as force sensor-controlled heating elements. In other preferred applications, the molecular inks may be printed on flexible substrates such as polymeric substrates, to form resistive films and heaters, such as may find use on airplane wings for deicing and/or energy dissipation (e.g., from lightning strikes).

A novel and unique aspect of the presently disclosed conductive traces is that they are formed using molecular inks that comprise particle-free compositions of stoichiometric metal complexes dissolved in a solvent. This affords printing of traces that are narrow and may be precisely deposited. When printed on a woven or non-woven textile substrate, these molecular inks conformally coat fibers of the flexible substrate, and are resistant to degradation by the standard strains and forces exerted upon such substrates, e.g., bending, stretching, twisting, washing, abrasion, etc. As such, the molecular inks and electronic elements formed according to the present disclosure provide dramatic improvements over those disclosed in the prior art.

For example, certain prior art conductive traces, such as e-textiles, have included conductive elements as part of the yarn used to form the textile, such as shown in FIGS. 1A-1C. That is, conductive metal threads have been woven with standard organic, polymeric, or synthetic threads to form conductive yarns, to produce a textile having conductive elements. FIG. 1A shows a metal wrapped yarn, FIG. 1B shows a metal filled yarn, and FIG. 1C shows a metal yarn (i.e., yarn formed wholly of metal threads or wire). These textiles tend to be rough and/or porous and can be costly due to the expense of the conductive materials (generally metals). These costs can be reduced by using the yarns to produce specific conductive patterns in the textile, but this generally requires changes to manufacturing processes that are not easily altered.

Alternatively, conductive patterns have been incorporated on flexible substrates, as shown in FIG. 2, which are then adhered to the textile to form the flexible electronics. These patterns may not be stretchable and/or washable, and application of the patterns may require additional manual and/or manufacturing processes.

Direct print methods have been used to form conductive patterns. Such methods would be easily scalable, easily integrated into current textile manufacturing processes, and provide a high throughput, highly automated means to provide conductive elements, and thus electronic elements into textiles. The molecular inks of the prior art, however, often do not show good results. For example, inkjet printing with nanoparticle inks has proven challenging due to clogging of the nozzle and either too little interaction with the textile surface, e.g., pooling, or too much interaction with the textile surface, e.g., spreading due to capillary effects. As shown in FIGS. 3A and 3B, for example, nanoparticle inks printed on nonwoven textiles such as Evolon® can pool, failing to coat the fibers to the extent required to form a conductive pattern. Even after multiple layers are applied, such as the 6 layers of ink shown in FIGS. 3C and 3D, scanning electron micrograph images show that the ink is pooled into islands separated by non-coated areas. For example, FIGS. 3C and 3D show that the Evolon® nonwoven fiber (green) includes the ink (red dots) discontinuously on the top (FIG. 3C) and throughout the thickness of the textile via capillary spreading (FIG. 3D).

As shown in FIG. 3E, because these nanoparticle inks fail to form a continuous pattern, they demonstrate extremely high resistance (i.e., fail to form conductive traces). Moreover, additional coating layers of the nanoparticle inks does not reduce the resistance of these printed patterns. Modification of the textile to decrease surface resistance is possible, such as up to 2 orders of magnitude, but still does not form conductive patterns (FIG. 3E at right). The (red) dots on the (green) background in FIGS. 3C and 3D represent clustered silver particles with little silver-to-silver fusion or connectivity; hence the poor conductivity of silver nanoparticle films (see FIG. 4A). The poor conductivity is further worsened by the low temperature limitation of most textile substrates, such as fabrics, which makes it impossible to systematically fuse silver particles with the high temperatures often required for nanoparticle ink curing.

Figure 5:
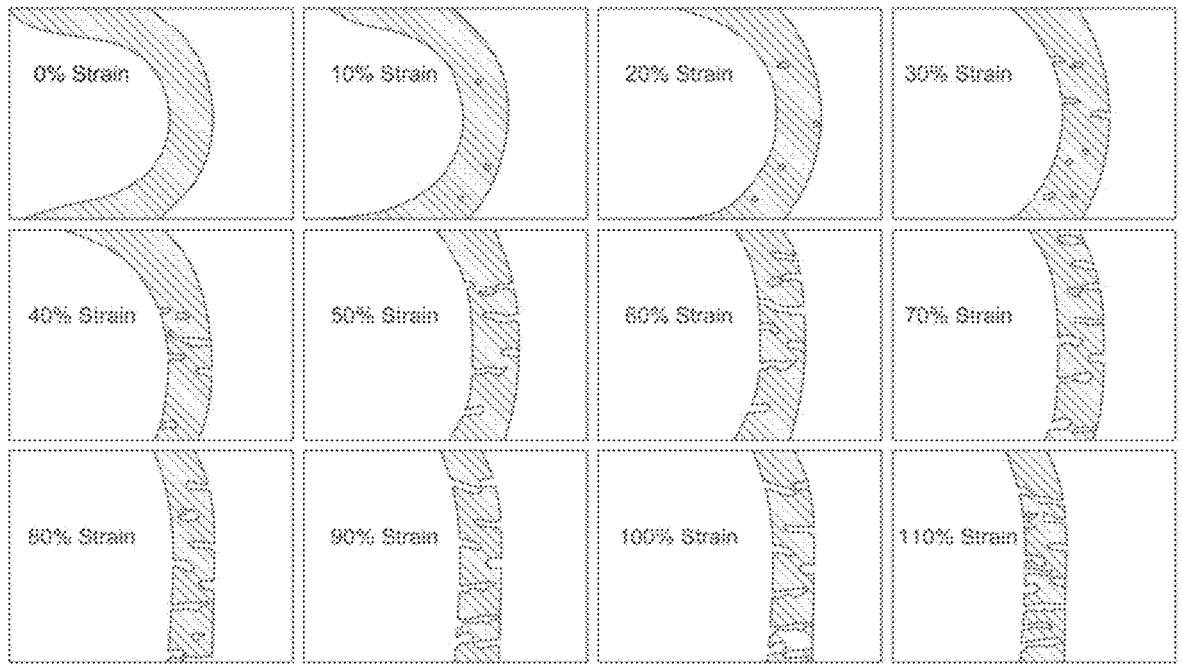
FIG. 5 illustrates knit textiles screen-printed with conductive materials of the prior art under different amounts of strain (i.e., stretch of the textile).

Moreover, patterns formed on textiles with nanoparticle inks generally show poor flexibility during use of the textile (e.g., multiple wear and/or wash cycles). As illustrated in FIG. 5, strain such as by stretching a screen-printed woven textile leads to breaks in the conductive pattern, rendering the pattern non-conductive over time. In fact, as little as 10% strain on the textile can lead to an observable increase in breaks in the printed pattern and loss of conductivity.

The inventive processes disclosed herein circumvent many of these difficulties by directly printing a pattern on the flexible substrate, e.g., woven or non-woven textile or flexible polymeric substrate, using molecular inks that comprise particle-free compositions of a metal complex dissolved in a solvent, and thus provide highly scalable and automated methods for producing printed flexible electronics that maintain integrity through multiple types of stress and strain. The methods generally comprise using a direct printing process to deposit the molecular ink on the flexible substrate, which is then cured to produce a conductive pattern thereon. As such, the conductive patterns may be formed on the flexible substrate, such as a textile, in a manner that is easily integrated into current manufacturing processes, and more importantly, is easily scalable and can be highly automated. Moreover, the methods disclosed herein provide conformal coating of the molecular ink on the textile fibers of a textile flexible substrate (FIG. 4B) that allows for greatly improved conductivity and longevity of the conductive trace. As used herein, the term "conformal" shall be taken to mean a coating that covers at least the surface of a textile, fiber, or substrate, and which follows the contours of the surface.

Molecular Inks

The molecular inks of the present disclosure include a particle-free metal complex composition comprising at least one metal complex dissolved in at least one solvent. Such molecular inks have been described in US Patent Application Publication No. 2019/0249026 and 2020/0369061.

The metal complex can be mononuclear, dinuclear, trinuclear, and higher. For example, the metal complex may be a neutral metal complex comprising at least one metal, at least one first ligand, and at least one second ligand. The metal complex may be as described in US Patent Application Publications 2011/0111138, 2013/0236656, and 2020/0369061. The metal complex may comprise a first metal complex having at least one first metal, and a second metal complex having at least one second metal. The metal complex may be as described in U.S. Pat. Nos. 9,487,669, and 9,920,212, and 10,738,211, and 11,118,078.

For example, a neutral metal complex may be formed by first forming a complex between the metal (M) and the second ligand ($L_2$), such as by reacting a metal, metal salt, or metal oxide with the second ligand. The metal-second ligand complex may then be reacted with an excess of the first ligand ($L_1$) to form the neutral metal complex. The stoichiometric reaction ratio between the first ligand and the metal-second ligand complex can be, for example, at least 10:1, such as at least 13:1, or at least 15:1, or at least 20:1. When formulated in this way, the reaction mixture remains substantially or totally free of particles, and progresses to completion forming a metal complex having stoichiometric amounts of the first and second ligands and the metal.

The excess, unreacted first ligand may be removed to provide the metal complex having stoichiometric amounts of the metal, first ligand, and second ligand (i.e., free of unliganded first ligand). For example, the excess, unreacted first ligand may be removed by vacuum evaporation of the complex and may include one or more wash steps with an appropriate solvent, to yield a final dry powder having stoichiometric amounts of the metal, first ligand, and second ligand. For silver metal complexes, this powder is typically white.

The resulting purified metal complexes are substantially or totally free of particles (particle-free) including nanoparticles and microparticles and are highly soluble in various solvents. This differs greatly from prior art complexes that do not include stoichiometric amounts of the metal, first ligand, and second ligand and/or may include residual unliganded first ligand, and accordingly generally include particles such as nanoparticles and/or microparticles (see additional discussion in the Examples). Printing of these prior art nanoparticle inks on certain textiles has demonstrated that they often do not penetrate into the textile, but rather pool on top of the textile, as observed in the scanning electron microscopy images shown in FIGS. 3A-3D, and the schematic in FIG. 4A, and thus do not form conductive traces (see FIG. 3E). The molecular inks of the present disclosure are capable of conformally coating fibers of a textile substrate (see FIG. 4B) and form highly conductive traces.

The molecular inks may optionally further include at least one conductive filler material. Exemplary filler materials include at least conductive polymers, metal oxides, and carbon-based materials, such as carbon nanotubes (CNTs), graphene, and graphite. The conductive filler material can be preferentially selected from commercially available conductive polymers or carbon-based materials. Possible conducting filler materials include carbon black, graphite, polypyrrole (PPy), poly[3,4-ethylenedioxythiophene] (PEDOT), polyacetylene, polythiophene (PT), graphene, polyphenylene, CNTs, polyaniline (PANI), and polyphenylene ethylene.

Among the different types of conductive polymers that have been applied to textiles, PANI, PT and PPy provide high electrical conductivity and simple processing. PPy and PANI, in particular, provide excellent stability under environmental conditions, good conductivity, ease of fabrication onto flexible substrates such as fabrics, simple synthesis methods, and corrosion resistance. A general concern around the use of certain polymeric fillers in the presently disclosed molecular inks is poor mechanical properties. However, in those instances such concerns can be mitigated by incorporating polymer additives and binders such as nitrocellulose, which is characterized by its thermoplastic behavior, fast solvent evaporation, good compatibility with a wide range of materials, excellent processability and good mechanical properties. Thus, the molecular inks comprising a conductive filler may optionally comprise an additional binder material.

The molecular inks may optionally comprise one or more surfactants. The surfactants may comprise anionic, cationic, nonionic, or amphoteric surfactants, which may be present in the amount of 0.001-5 wt. %, such as 0.001-3 wt. %, or 0.01-2 wt. %, or not more than 0.1 wt. %, such as 0.001-0.1 wt. %, based on the total weight of the ink. Exemplary surfactants may be those useful to reduce the surface tension of the molecular inks, such as silicone-based surfactants (i.e., silyl surfactant). Exemplary surfactants of particular use include polydimethyl siloxanes and modified polydimethyl siloxanes, e.g., polyether-modified polydimethylsiloxane.

The molecular inks may be formulated by dissolving the at least one purified metal complex, i.e., complex that is free of any unreacted first ligand, and any optional components, such as the conductive filler(s), surfactant(s), and any additional binder material(s), in an organic solvent system such as a hydrocarbon solvent system.

The molecular inks may be formulated by dissolving the at least one purified metal complex, i.e., complex that is free of any unreacted first ligand, and any optional components, such as the conductive filler(s), surfactant(s), and any additional binder material(s), in at least one polar protic solvent, such as at least two polar protic solvents. In general, polar protic solvents can have high polarity and high dielectric constants. Polar protic solvents may comprise, for example, at least one hydrogen atom bound to an oxygen or a nitrogen. Polar protic solvents may comprise, for example, at least one acidic hydrogen. Polar protic solvents may comprise, for example, at least one unshared electron pair. Polar protic solvents may display, for example, hydrogen bonding.

Polar protic solvents may be particularly useful for depositing the molecular inks on certain substrates, since hydrocarbon solvent(s) may not be compatible with the substrate and/or may not be recommended in some situations. Moreover, polar protic solvents may provide a more environmentally friendly ink solution.

Examples of polar protic solvents include water, linear or branched alcohols, amines, amino alcohols, and hydroxyl-terminated polyols including glycols. The polar protic solvent may also be, for example, ethylene and higher glycols, as well as alcohols. Particular examples of polar protic solvents include water, methanol, ethanol, n-propanol, isopropanol, n-butanol, acetic acid, formic acid, and ammonia.

The polar protic solvent may comprise, for example, water and at least one amine solvent. The amine solvent may have a molecular weight of, for example, about 200 g/mol or less, or about 100 g/mol or less. The amine solvent may be, for example, at least one monodentate amine, at least one bidentate amine, and/or at least one polydentate amine. The amine solvent may be, for example, at least one primary amine or at least one secondary amine. In one embodiment, the amine solvent may comprise at least one alkyl group bonded to at least one primary or secondary amine. The amine solvent may comprise at least two primary or secondary amine groups connected by a linear or branched alkyl group. The amine solvent may comprise at least two linear or branched alkyl groups connected by at least one secondary amine. Advantages of the amine solvent include, for example, improved solubility and thus higher possible concentrations of the metal complex in the solvent, as well as lower decomposition temperatures for the metal complex.

The solvent may be a mixed solvent system comprising, for example, two or more polar protic solvents, such as at least one alcohol, at least one amine, and optionally, a surfactant. For example, a mixed solvent system may comprise at least one alkyl alcohol, at least one diol, at least one amine, at least one thiolalkyldiol, and at least one surfactant, such as a silyl surfactant, wherein the at least one alkyl alcohol, the at least one diol, and the at least one thiolalkyldiol are not the same. Exemplary alkyl alcohols of the mixed solvent system may comprise 1-6 carbons atoms, such as at least methanol, ethanol, 1-propanol, 2-propanol, n-butanol, 2-butanol, 2-methyl-1-propanol, 2-methyl-2-propanol, 2-methyl-1-butanol, and 2-methyl-2-butanol. Exemplary diols of the mixed solvent system include at least ethylene glycol, 1,2-hexanediol, diethylene glycol, triethylene glycol, 1,3-propanediol, 1,3-butanediol, 1,2-butanediol, 2,3-butanediol, propylene glycol, dipropylene glycol, tripropylene glycol, trimethylene glycol, and 1,4-butanediol. Exemplary amines of the mixed solvent system include at least ammonium hydroxide, tetramethylammonium hydroxide, tetraethylammonium hydroxide, ethylenediamine, propylene diamine, 1,2-diaminopropane, and diethyl ethylenediamine. Exemplary thiolalkyldiols of the mixed solvent system include at least thiodiglycol, 1,4-dithiane-2,5-diol, and 3,6-diathiaoctane-1,8-diol.

An exemplary mixed solvent system may comprise 15 to 25 wt. % of the at least one alkyl alcohol; 10 to 15 wt. % of the at least one diol; 1 to less than 3 wt. % of the at least one amine, 1 to 5 wt. % of the at least one thiolalkyldiol, and less than 0.1 wt. % of the surfactant (such as 0.001 to 0.1 wt. %), based on the total weight of the ink composition. Such a mixed solvent system may be preferred for certain metal complexes, such as a gold complex, which may be included in this solvent system at 5 to 50 wt. %, such as 5 to 25 wt. %, or 5 to 15 wt. % based on the total weight of the ink composition.

The molecular inks can be prepared by mechanical mixing of the at least one polar protic solvent(s) and the at least one metal complex (e.g., an amine silver carboxylate, an amine copper carboxylate), and any of the optional components, such as the conductive fillers, surfactants, and any binders.

When included, the conductive filler can be blended with the particle-free metal complex, such as a particle-free silver precursor, in various weight ratios. Exemplary weight ratios include 50:50 metal complex:conductive filler, such as 60:40 metal complex:conductive filler, or 70:30 metal complex:conductive filler, or 80:20 metal complex:conductive filler, or 90:10 metal complex:conductive filler, or even 99:1 metal complex:conductive filler, and other ratios in-between.

As indicated, the molecular inks may comprise at least one conductive polymer. According to specific aspects, the ink may comprise a mixture of polypyrrole (PPy) and polyaniline (PANI). Formation of interpenetrated PANI/PPy networks play a decisive role in enhancing the conductive polymer film integrity and offer good film conformality during printing.

Certain conducting organic polymers are known to be excellent hosts for metal nanoparticles where cured nanoparticles may be embedded in the polymer matrix. In the past, PANI- or PPy-coated textiles have been used as substrates for a second coating with another conductive polymer such as PEDOT, PPy or PANI. In this case, such precoated textiles can be used to seed surfaces for silver printing which afford reduced temperature curing. In fact, the PPy-aided silver metalation can yield silver particles with different shapes and sizes in the nanometer and micrometer range. In addition to tuning the particle size of cured silver, the low temperature used for curing silver-printed textiles may not decompose the conductive fillers or seed layer.

The present inventors have recognized the potential of PPy to reduce amine silver carboxylates to metallic silver and use this potential as a new route to lower temperature curing of particle-free silver inks. Thus, the blending of conductive fillers in the molecular inks can enhance the performance of flexible electronic elements printed using such inks through improved mechanical, thermal, electrical, and other processing properties. The blending approach can minimize fabrication cost and promote easy process scale-up and commercialization by enabling sheet-to-sheet and roll-to-roll processing.

An exemplary molecular ink according to the present disclosure may comprise 10-40 wt % of the at least one conductive filler material mixed with a metal complex at any of the above indicated ratios, 2-10 wt % of alcohol or amine, 2-15 wt % of glycol, 10-25 wt % of a conductive filler solubilizer, and 40-70 wt % of water. An exemplary filler solubilizer includes at least N-methyl-2-pyrrolidone.

To enhance the textile coating homogeneity, multiple printing cycles can be repeated from 1 to 20, as necessary. The printed textile can be cured or dried in between prints to avoid textile saturation. The resistance of the coated textile is optimally within 0.01-500Ω/□, such as 0.01-300Ω/□, or even 0.01-100Ω/□ based on the film thickness and printed textile.

The viscosity of hydrogen bonding solvents is inherently greater than non-hydrogen bonding solvents such as hydrocarbons. Further the elevated solvent boiling points (due to energetically greater intermolecular forces) and polar ink nature render them capable and competent systems for the formation of thin films and structures of greater quality than strictly hydrocarbon or aromatic hydrocarbon delivery systems due to slower controlled drying times, surface tensions, and surface wetting properties. Thus, mixed solvent systems can provide superior application, solubility, and performance for the presently disclosed molecular inks.

The molecular inks of the present disclosure may be formulated to include hydrogels and/or polymers, such as polyacrylic acids, having lower molecular weights, and which may function as viscosity modifiers. For example, the compositions may include up to 5 wt. % of a hydrogel and/or polymer, such as up to 4 wt. %, or up to 3 wt. %, or up to 2 wt. %, or up to 1 wt. %, or up to 0.5 wt. %, or up to 0.1 wt. %, or up to 0.05 wt. %. The compositions may include hydrogels and/or polymers at from 0.01 wt. % to 5 wt. %, such as 0.01 wt. % to 4 wt. %, or 0.01 wt. % to 3 wt. %, or 0.01 wt. % to 2 wt. %, or 0.01 wt. % to 1 wt. %. The polymer may be a conductive polymer, such as any of the polyacetylenes, polyanilines, polyphenylenes, polypyrenes, polypyrroles, polythiophenes, etc. known in the art.

The metal complexes described herein may have a solubility in at least one polar protic solvent at 25° C. of at least 50 mg/ml, or at least 100 mg/ml, or at least 150 mg/ml, or at least 200 mg/ml, or at least 250 mg/ml, or at least 300 mg/ml, or at least 400 mg/ml, or at least 500 mg/ml, or at least 1,000 mg/ml, or at least 1,500 mg/ml, or even or at least 2,000 mg/ml.

The amount of organic solvent in the molecular inks disclosed herein can be, for example, less than 30 wt. %, less than 20 wt. %, less than 10 wt. %, less than 5 wt. %, less than 3 wt. %, less than 1 wt. %, less than 0.1 wt. % or less than 0.01 wt. %. The molecular ink formulations may be substantially or totally free of organic solvent.

The viscosity of the ink formulations measured at 25° C. can be, for example, about 800 cps or less, about 500 cps or less, about 250 cps or less, or about 100 cps or less. According to certain other aspects, the viscosity of the ink formulations measured at 25° C. can be, for example, about 50 cps or less, 40 cps or less, 30 cps or less, 25 cps or less, 20 cps or less, or even 10 cps or less. According to yet other aspects, the ink formulations have a viscosity of about 2 cps to about 20 cps, or about 2 cps to about 15 cps, or about 2 cps to about 10 cps.

The viscosity of the ink formulations measured at 25° C. can be, for example, about 800 cps or more, such as about 1500 cps or more, about 2,500 cps or more, about 5,000 cps or more, or even about 10,000 cps or more.

The molecular inks can be formulated for a total metal complex concentration of 3 g/ml to 0.1 g/ml, 2 g/ml to 0.1 g/ml, such as 1.5 g/ml to 0.1 g/ml, or 1 g/ml to 0.1 g/ml, or 2 g/ml to 0.4 g/ml, or 1.5 g/ml to 0.4 g/ml. The molecular inks can be formulated for a pH in the range of 7 to 12. The molecular inks can be formulated for a viscosity of at least 2 cP such as at least 5 cP, or at least 10 cP.

Analysis of the molecular ink formulations, in either of the organic or polar protic solvent systems, has shown that the amounts of the metal, and first and second ligands, in the ink solutions are stoichiometric (see Examples).

The molecular ink formulations may be substantially or totally free of particles, microparticles, and nanoparticles, and metal particles, such as metal microparticles and metal nanoparticles. In particular, the molecular ink formulations comprising the metal complex may be substantially or totally free of nanoparticles and/or metal nanoparticles before deposition or printing, and during deposition or printing. The molecular ink may be substantially or totally free of particles, including nanoparticles and/or metal nanoparticles, after deposition but before reduction to metal (e.g., before curing). For example, the level of nanoparticles can be less than 1 wt. %, less than 0.1 wt. %, or less than 0.01 wt. %, or less than 0.001 wt. %. The level of metal nanoparticles can be less than 1 wt. %, less than 0.1 wt. %, or less than 0.01 wt. %, or less than 0.001 wt. %. One can examine the composition for particles using methods known in the art including, for example, SEM and TEM, spectroscopy including UV-Vis, dynamic light scattering, plasmon resonance, and the like. Nanoparticles can have diameters of, for example, 1 nm to 500 nm, or 1 nm to 100 nm. Microparticles can have diameters of, for example, 0.5 µm to 500 µm, or 1 µm to 100 µm.

Figure 8A:
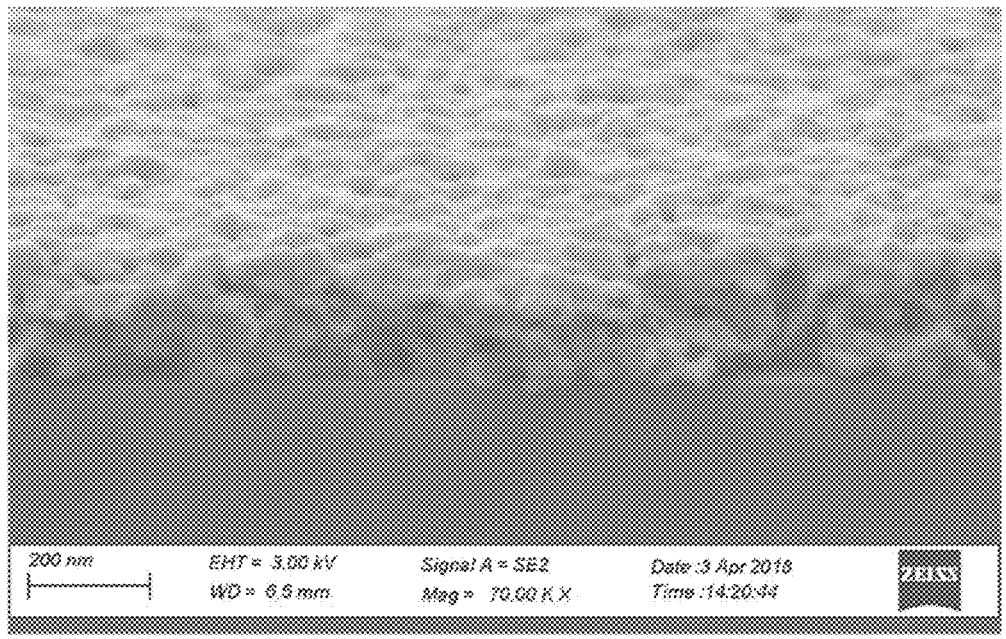
FIGS. 8A and 8B are cross sectional view SEM images of a textile having a molecular ink of the present disclosure printed thereon (perspective and side views, respectively at 70,000×)
Figure 8B:
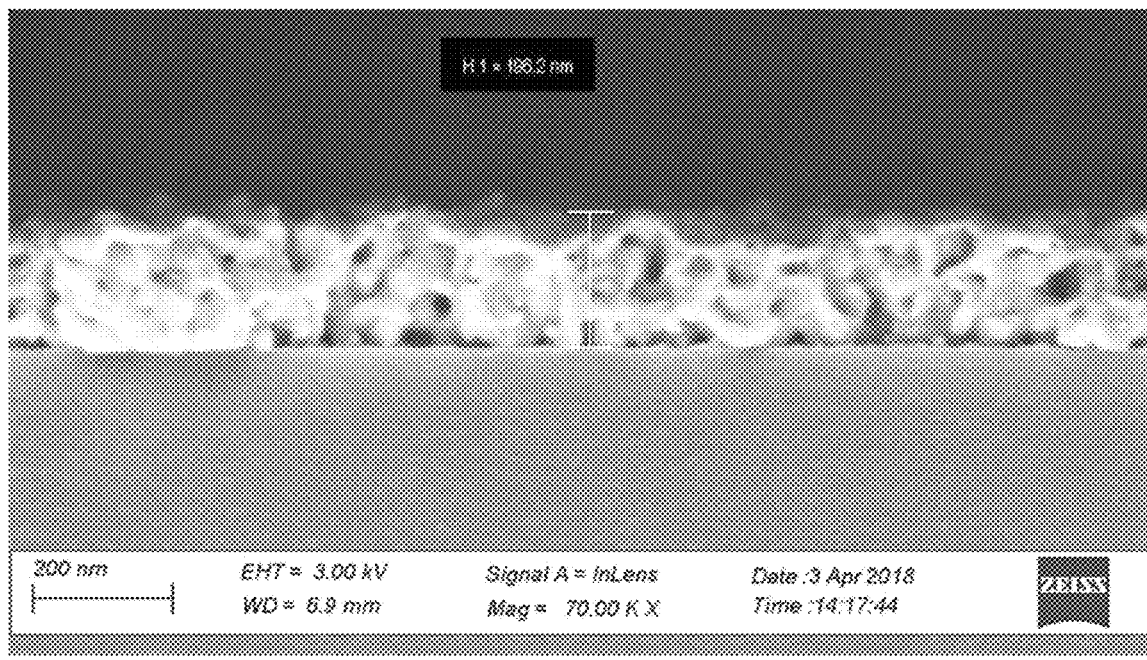
Figure 8C:
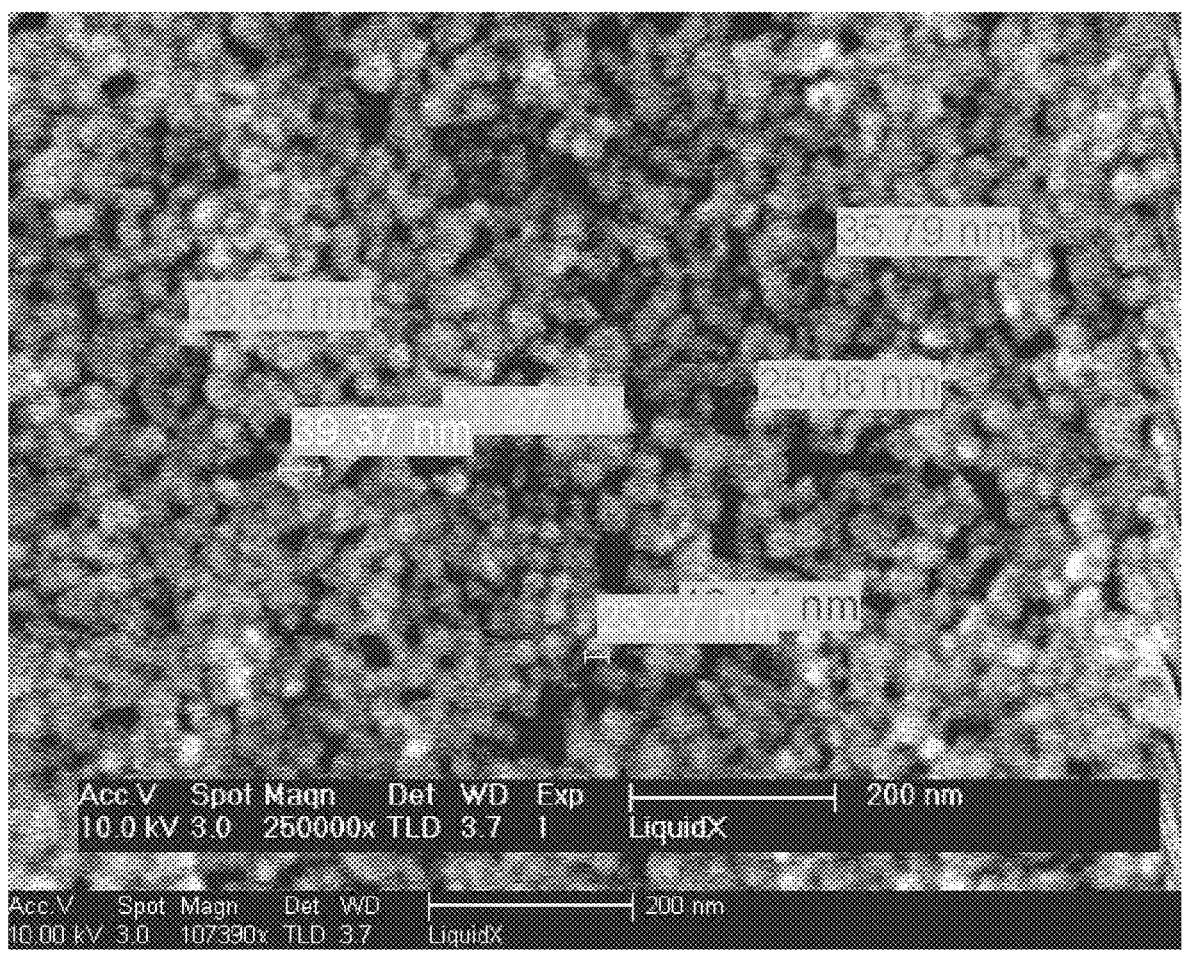
FIG. 8C is an SEM image at high magnification (250,000×) showing the conductive trace includes nanoparticles.

Upon cure, the ink forms a continuous conductive trace on the substrate, e.g., flexible substrate, and may include metal nanoparticles formed in situ during cure (see FIGS. 8A-8B). The metal nanoparticles may have diameters of 1-500 nM, such as 5-100 nM, or 10-50 nM, or even 20-40 nM (see FIG. 8C).

Metal Complex

The metal complex may comprise a metal useful for forming electrically conducting lines, particularly those metals used in the semiconductor and electronics industries. Exemplary metals include at least silver, gold, copper, platinum, ruthenium, nickel, cobalt, palladium, zinc, iron, tin, indium, and alloys thereof. The metal complexes may comprise a single metal center or two metal centers.

For example, the metal complex may be a neutral metal complex comprising at least one metal, at least one first ligand, and at least one second ligand. The first ligand may be adapted to volatilize when heated without formation of a solid product. For example, the first ligand may volatize upon heating at a temperature of, for example, 250° C. or less, or 200° C. or less, or 150° C. or less. Heating can be done in the presence or absence of oxygen. The first ligand may be a reductant for the metal. The first ligand may be in neutral state, such as neither an anion nor a cation.

The first ligand may be a monodentate ligand, or a polydentate ligand including, for example, a bidentate or a tridentate ligand. The first ligand may be a thioether, such as tetrahydrothiophene, a phosphine, or an amine compound. In certain examples, the first ligand may be a thioether, such as a thioether having the formula $R_1$—S—$R_2$, wherein $R_1$ and $R_2$ may be independently selected from $C_1$-$C_3$ alkyl or may form a saturated heterocyclic compound with the sulfur. Exemplary thioethers include at least dimethyl sulfide, diethyl sulfide, dipropyl sulfide, diisopropyl sulfide, ethyl methyl sulfide, and tetrahydrothiophene. In certain examples, the first ligand may comprise an amine compound having at least two primary amine groups. Primary amines are stronger reducing agents than alcohols and can form homogenous solutions with polar protic solvents. Moreover, the first ligand may comprise two primary amine end groups and no secondary amine group, or one primary amine end group and one secondary amine end group. In this latter example, the secondary amine end group may be substituted with a linear alkane or a polar group, such as a hydroxy or alkoxy. In yet another example, the first ligand may comprise two primary amine end groups and one secondary amine group. The first ligand may be an amine including an alkyl amine. The alkyl groups can be linear, branched, or cyclic. Bridging alkylene can be used to link multiple nitrogen together. In the amine, the number of carbon atoms can be, for example, 15 or less, or 10 or less, or 5 or less.

The molecular weight of the first ligand, may be, for example, about 1,000 g/mol or less, or about 500 g/mol or less, or about 250 g/mol or less.

In particular examples, the first ligand is ethylenediamine, 1,2-diaminopropane, 1,3-diaminopropane, diaminocyclohexane, or diethyl ethylenediamine.

The second ligand is different from the first ligand and may also volatilize upon heating the metal complex. For example, the second ligand may release carbon dioxide, as well as volatile small organic molecules. The second ligand may be adapted to volatilize when heated without formation of a solid product. The second ligand may volatize upon heating at a temperature of, for example, 250° C. or less, or 200° C. or less, or 150° C. or less. Heating can be done in the presence or absence of oxygen. The second ligand can be anionic. The second ligand may be self-reducing.

The second ligand may be a carboxylate. The carboxylate may comprise a linear, branched or cyclic alkyl group. In one embodiment, the second ligand does not comprise an aromatic group. The second ligand may be an amide represented by —N(H)—C(0)—R, wherein R is a linear, branched or cyclic alkyl group, with 10 or fewer carbon atoms, 8 or fewer carbon atoms, 6 or fewer carbon atoms, or 5 or fewer carbon atoms. The second ligand can also be an N-containing bidentate chelator.

The molecular weight of the second ligand, including the carboxylate, may be, for example, about 1,000 g/mol or less, or about 500 g/mol or less, or about 250 g/mol, or about 150 g/mol or less or less.

In particular examples, the second ligand may be isobutyrate, oxalate, malonate, fumarate, maleate, formate, glycolate, lactate, citrate, or tartrate.

Thus, the metal complex may comprise at least one metal, at least one first ligand, and at least one second ligand, wherein the metal may be silver, gold, platinum, or copper. Exemplary first ligands include amines and sulfur containing compounds, and exemplary second ligands include carboxylic acids, dicarboxylic acids, and tricarboxylic acids. Exemplary solvents include one or more polar protic solvents, such as at least two polar protic solvents selected from the group comprising at least water, alcohols, amines, amino alcohols, polyols, and combinations thereof.

According to certain other aspects, the metal complex may comprise at least one first metal complex having at least one first metal, at least one second metal complex having at least one second metal, at least one third metal complex having at least one third metal, and so forth, wherein each metal complex may comprise stoichiometric amounts of a metal and first and second ligands. For example, the metal complex may comprise two neutral metal complexes formed as detailed above (i.e., having stoichiometric amounts of a metal and first and second ligands).

According to certain other aspects of the present disclosure, the metal complex may be configured to provide a metal alloy (e.g., after curing in the textile substrate). The metal complex may comprise at least one first metal complex, wherein the first metal complex comprises a first metal and at least one first ligand and at least one second ligand, different from the first ligand; and at least one second metal complex, which is different from the first metal complex, and comprises a second metal and at least one first ligand and at least one second ligand, different from the first ligand, for the second metal; and at least one solvent. The (i) the selection of the amount of the first metal complex and the amount of the second metal complex, (ii) the selection of the first ligands and the selection of the second ligands for the first and second metals, and (iii) the selection of the solvent may be adapted to provide a homogeneous composition.

According to yet other aspects, the metal complex may comprise at least one first metal complex having at least one first metal in an oxidation state of (I) or (II), and at least two ligands, wherein at least one first ligand is an amine and at least one second ligand is a carboxylate anion; at least one second metal complex, which is different from the first metal complex, wherein the second metal complex is a neutral complex comprising at least one second metal in an oxidation state of (I) or (II), and at least two ligands, wherein at least one first ligand is a sulfur compound and at least one second ligand is the carboxylate anion of the first metal complex.

According to certain other aspects of the present disclosure, the metal complex may comprise at least one first metal complex, wherein the first metal complex is a neutral, dissymmetrical complex comprising at least one first metal in an oxidation state of (I) or (II), and at least two ligands, wherein at least one first ligand is an amine and at least one second ligand is a carboxylate anion; at least one second metal complex, which is different from the first metal complex, wherein the second metal complex is a neutral, dissymmetrical complex comprising at least one second metal in an oxidation state of (I) or (II), and at least two ligands, wherein at least one first ligand is sulfur compound and at least one second ligand is the carboxylate anion of the first metal complex; at least one organic solvent, and wherein the atomic percent of the first metal is about 20% to about 80% and the atomic percent of the second metal is about 20% to about 80% relative to the total metal content.

Exemplary metals for use in these metal alloys include Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, Au, and Hg. In particular, coinage metals can be used including silver, gold, and copper. Precious metals can be used including gold, iridium, osmium, palladium, platinum, rhodium, ruthenium, and silver. In other preferred embodiments, platinum, nickel, cobalt, and palladium can be used. Still further, lead, iron, tin, ruthenium, rhodium, iridium, zinc, and aluminum can be used. Other metals and elements can be used as known in the art.

The first metal complex is a silver, gold, copper, platinum, nickel, iridium, or rhodium complex. For example, the first metal complex may be a silver complex. The second metal complex is a silver, gold, copper, platinum, nickel, iridium, or rhodium complex. For example, the second metal complex may be a gold complex. Examples of binary combinations of metals to form binary alloys include at least Ag—Au, Pt—Rh, Au—Cu, Zn—Cu, Pt—Cu, Ni—Al, Cu—Al, Pt—Ni, and Pt—Ir.

The metal complexes of the metal alloy can comprise a plurality of ligands including two or more ligands, or just two ligands. There can be, for example, a first ligand and a second ligand, different from each other. The first ligand can provide sigma electron donation, or dative bonding. The first ligand can be in a neutral state, not an anion or cation. Examples of the first ligand include amines, oxygen-containing ligands, and sulfur-containing ligands including oxygenated ethers and thioethers, including cyclic thioethers. Asymmetrical or symmetrical amines can be used. The amines can comprise, for example, at least two primary or secondary amine groups. Monodentate ligands can be used. Polydentate or multidentate ligands can be used. Alkylamino ligands can be used.

The second ligand can be different from the first ligand and can volatilize upon heating the metal complex. For example, it can release carbon dioxide, as well as volatile small organic molecules such as propene, in some embodiments. The second ligand can be a chelator with minimum number of atoms that can bear an anionic charge and provide a neutral complex. The second ligand can be anionic. For example, the second ligand can be a carboxylate, including a carboxylate comprising a small alkyl group. The number of carbon atoms in the alkyl group can be, for example, ten or less, or eight or less, or five or less. The molecular weight of the second ligand can be, for example, about 1,000 g/mol or less, or about 250 g/mol or less, or about 150 g/mole or less.

The metal complexes of the present disclosure can be substantially or totally free of particles, including nanoparticles and microparticles, when in the dried state (powder) or when formulated as an ink in at least one solvent (i.e., particle-free composition comprising the metal complex and at least one solvent).

Direct Printing and Deposition Methods

Methods known in the art can be used to deposit the presently disclosed molecular inks including, for example, pipetting, inkjet printing, lithography or offset printing, gravure or gravure offset printing, flexographic printing, microdispersion direct write printing, screen printing or rotary screen process printing, offset printing, stencil printing, drop casting, slot die, roll-to-roll, stamping, roll coating, spray coating, flow coating, extrusion printing, and aerosol delivery such as spraying or pneumatic or ultrasonic aerosol jet printing. One can adapt the ink formulation and the substrate with the deposition method.

The disclosed molecular inks may be deposited by direct printing methods such as pipetting, stencil printing, rolling, spraying, or inkjet printing. In certain examples, the molecular inks are deposited using inkjet printing.

The disclosed molecular inks may be printed directly onto a surface of the flexible substrate, e.g., surface of a woven or non-woven textile or polymeric film.

Certain flexible substrates may benefit from pre-treating. For example, for textile substrates, pre-treatment such as prewashing the textile and optionally treating by oxygen plasma, corona, and/or chemical etch (e.g., acidic, caustic). Accordingly, the molecular inks of the present disclosure may be printed on the textile substrate after it has been pretreated by oxygen plasma, corona, and/or chemical etch.

Certain flexible substrates may benefit from addition of a coating. For example, cellulose based substrates such as paper and/or cotton textiles may need a coating to reduce ink bleed and enhance conductivity of traces formed thereon. That is, the cellulose or cotton-based substrates may be coated with a transparent layer, such as a polyurethane coating prior to printing the conductive pattern.

One can adapt the viscosity of the disclosed molecular inks to the deposition method. For example, viscosity can be adapted for inkjet printing. Viscosity of the ink formulations measured at 25° C. can be, for example, about 500 cps or less, such as 200 cps or less, or 50 cps or less, or even 25 cps or less. Viscosity of the ink formulations measured at 25° C. can be, for example, at least 50 cps. Viscosity of the ink formulations measured at 25° C. can be, for example, about 50 cps or less, such as about 25 cps or less. According to certain other aspects, the viscosity of the ink formulations measured at 25° C. can be, for example, about 2 cps to about 20 cps, or about 2 cps to about 10 cps. Viscosity of the ink formulations may be tuned through selective ratios of polar protic solvents (e.g., ratio of water to amine).

Alternatively, the viscosity of the disclosed molecular inks can be formulated, for example, to be greater than 15 cps, or 20 cps, or even 25 cps, such as by addition of binders, resins, or other additives or solids that may thicken or increase the viscosity of the ink formulation. For example, one can adapt the concentration of dissolved solids in the ink to about 2,000 mg/ml, or 1,500 mg/ml or less, about 1,000 mg/ml or less, about 500 mg/mL or less, about 250 mg/mL or less, about 100 mg/mL or less, about 50 mg/mL or less, or about 10 mg/mL or less.

Additives may also be included to adapt the wetting properties of the disclosed molecular inks. Additives such as, for example, surfactants, dispersants, colorant (e.g., dye), and/or binders can be used to control one or more ink properties as desired. For example, a hydrophilic binder may aid in wetting certain textiles, and thus may aid in providing a conductive trace that conformally coats the textile fibers (i.e., improve conductivity of the conductive trace). For example, the molecular ink formulations may include up to 10 wt. % of one or more additives, such as up to 8 wt. %, or up to 6 wt. %, or up to 4 wt. %, or up to 2 wt. %, or up to 1 wt. %, or up to 0.1 wt. %, or up to 0.05 wt. %. The compositions may include additives at from 0.001 wt. % to 5 wt. %, such as 0.001 wt. % to 4 wt. %, or 0.001 wt. % to 3 wt. %, or 0.001 wt. % to 2 wt. %, 0.001 wt. % to 1 wt. %, or 0.001 wt. % to 0.1 wt. %, based on the weight of the ink formulation.

According to certain aspects, molecular ink formulations of the present disclosure may be substantially or totally free of additives such as surfactants, dispersants, colorant (e.g., dye), and/or binders.

Nozzles can be used to deposit the precursor, and the nozzle diameter can be, for example, less than 200 micrometers, or even less than 100 micrometers, or even less than 50 micrometers. The absence of particulates can help with prevention of nozzle clogging. The nozzle may deposit the ink in droplets, wherein a drop size may be less than 200 micrometers, such as less than 100 micrometers, or less than 50 micrometers, or even less than 30 micrometers. The nozzle may deposit the ink in droplets, wherein a drop volume is less than 100 picoliter (pL), or less than 50 pL, or less than 25 pL, or even less than 15 pL, or even less than 5 pL. The drops may be deposited at a density greater than 30 drops per inch, such as greater than 60 drops per inch, or greater than 90 drops per inch, or greater than 200 drops per inch, or greater than 500 drops per inch, or greater than 1,000 drops per inch, or greater than 1,500 drops per inch, or greater than 2,500 drops per inch, or greater than 4,000 drops per inch, or greater than 6,000 drops per inch.

The molecular inks may be printed on flexible substrates at ambient conditions, such as at standard room temperatures and pressures.

Figure 6:
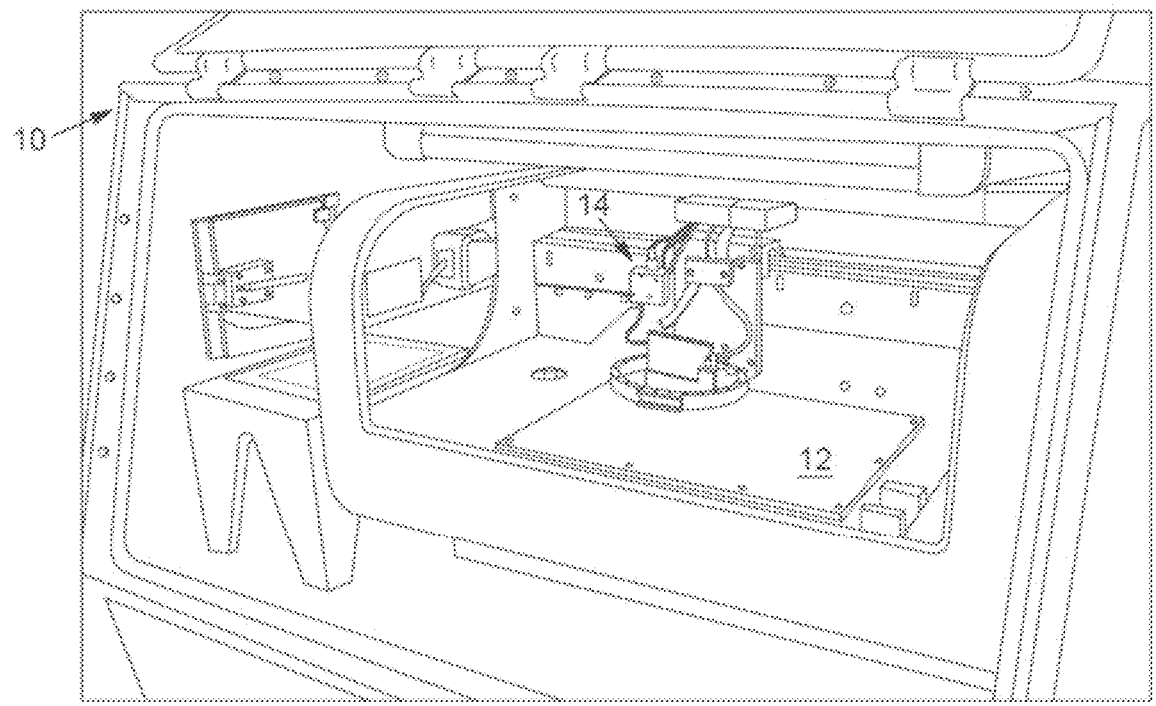
FIG. 6 illustrates an inkjet printer setup useful in methods of the present disclosure.

The flexible substrate may be heated before and/or during deposition of the ink. For example, the flexible substrate may be heated to temperatures of 40° C. to 90° C. With reference to FIG. 6, an exemplary inkjet printer 10 is shown which includes a heated platen 12 and a nozzle assembly 14. In use, the molecular inks of the present disclosure may be loaded to the printer 10 so that droplets of the ink may be deposited. The platen 12 may be heated to temperatures of 30° C. to 90° C., such as 30° C. to 60° C., or 40° C. to 90° C. during printing.

While specific numbers are listed herein for the size and density of the droplets, volume of the droplets, and the nozzle size, these values may vary depending on the printing method chosen, the printer chosen (e.g., nozzle configuration), the viscosity of the molecular ink, and the coverage desired.

Thus, according to certain methods of the present disclosure, the molecular inks may be deposited on a substrate such as a textile that is heated at low temperatures during deposition, followed by a curing step that converts the metal complex in the ink formulation to a metallic structure, wherein the curing step may be by any of the curing steps detailed herein.

According to certain other methods of the present disclosure, the disclosed molecular inks may be deposited on a substrate such as a textile at ambient temperatures (and pressures), followed by a curing step that converts the metal complex in the ink formulation to a metallic structure, wherein the curing step may be by any of the curing steps detailed herein.

The printed textile or fabric can be cured or dried in between prints to avoid fabric saturation. The resistance of the coated fabric is generally within 0.01-500Ω/□ based on the trace dimension (e.g., thickness), molecular ink composition, and printed flexible substrate, e.g., fabric.

An exemplary silver ink formulation may include a silver complex having stoichiometric amounts of first and second ligands, dissolved in two or more polar protic solvents, such as water and any of an alcohol and/or amine. Generally, such an ink solution is formulated to include the silver complex at 250 mg/ml or greater, such as 500 mg/ml. These solutions are clear. Heating the textile during deposition of the molecular ink may reduce the ink bleed outside of the printed region. For example, the conductive traces formed using the inks and methods of the present disclosure may exhibit an ink bleed of less than 0.5 mm, such as less than 0.4 mm, or less than 0.3 mm, or less than 0.2 mm, or even less than 0.1 mm. As used herein, the term "ink bleed" may be taken to mean a measure of the precision of the ink deposition and is referred to in terms of the distance from a defined edge (intended border) of a printed trace that the ink may extend.

An exemplary solution of 500 mg/ml of an ink composition according to aspects of the present disclosure may have a viscosity of about 5-15 cps at 25° C., a density of about 1.0-1.3 g/mL, a pH of at least 10-13, a surface tension of about 15-34 dyne/cm, and a silver content of about 15-25 wt. %. Ink jet printing of such an ink may include depositing the ink as droplets of between 5-200 micrometers at 60-6,000 drops per inch to a flexible substrate heated at between 30° C. to 90° C. on the platen 12 (FIG. 6), such as 65 micrometers at 1270 drops per inch. The textile may then be cured at a temperature of less than 200° C. for a time of less than 30 minutes, such as for between 2-20 minutes at 140° C., or 10 minutes at 140° C. Alternatively, the textile may be cured by exposure to infrared radiation for a time of less than 30 minutes, such as for between 2-20 minutes, or 10 minutes. An exemplary line wide resulting from this method may about 2 mm and may show an ink bleed of less than 0.5 mm, such as less than 0.2 mm, or even less than 0.1 mm. Moreover, the pattern demonstrated a resistivity of less than 10Ω/□, such as less than 5Ω/□, or less than 1Ω/□, or from 0.1Ω/□ to 0.9Ω/□.

The conductive traces of the present disclosure may have sheet resistance values of less than 10.0Ω/□, or less than 8.0Ω/□, or less than 6.0Ω/□, or less than 4.0Ω/□, or less than 2.0Ω/□, or less than 1.0Ω/□, such as from 0.1Ω/□ to 1.0Ω/□. Certain applications of the conductive traces may benefit from increased sheet resistance, such as more than 2.0Ω/□ or 10.0Ω/□, such as resistive heaters.

Exemplary systems that may be used in methods of the present disclosure include Fujifilm Dimatix DMP 2850 and DMP 2931. Using this printer, the molecular inks of the present disclosure may be printed to textiles pre-heated on the platen using a drop size of 5-200 micrometers, or a drop volume of less than 100 pL, at 60-6,000 drops per inch. The textile may then be cured on the platen in the device, such as for 10 minutes at 140° C. or 10 minutes exposure to infrared radiation or removed to an oven or other area for curing, wherein the metal in the metal complex turns to a solid conductive metal. Curing may be by any method disclosed herein.

Key factors affecting the conductivity achievable by the presently disclosed inks and printing methods include compatibility of the ink chemistry with the surface energy of the textile, the textile size and structure (woven, non-woven), pretreatment of the textile, such as with $O_2$ plasma, and the curing methods, such as the in situ heating of the textile during printing which provides high resolution traces, and the low temperature curing (<200° C.; see section below regarding curing). Thus, the presently disclosed inks and methods provide a large advantage over the prior art inks shown in FIGS. 4A-4E, wherein the particles of the ink may clog the nozzles of an inkjet device, and traces formed using the inks are generally non-conductive (i.e., show very high sheet resistance) and non-compatible with many textiles as they require high cure temperatures.

Figure 4B:
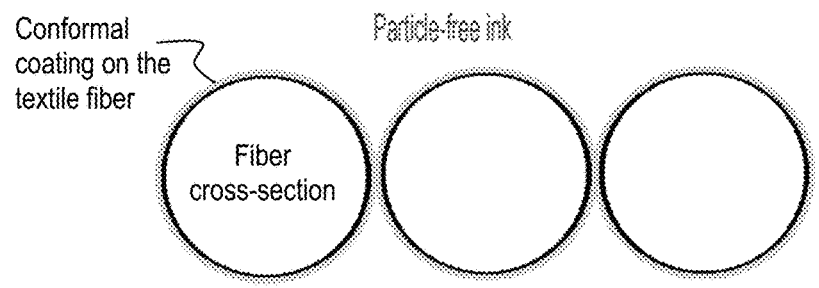
Figure 7A:
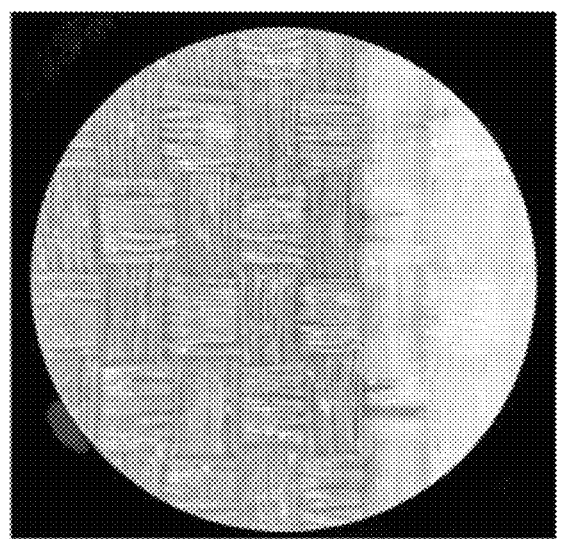
FIG. 7A shows a woven textile having a molecular ink of the present disclosure conformally coated on a portion thereof (coated at left; uncoated at right)
Figure 7B:
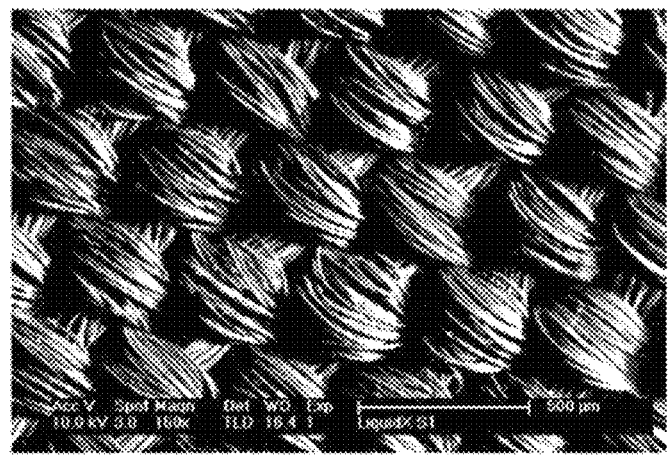
FIGS. 7B and 7C are SEM images of the coated portions of the textile (150× and 800× magnification, respectively).
Figure 7C:
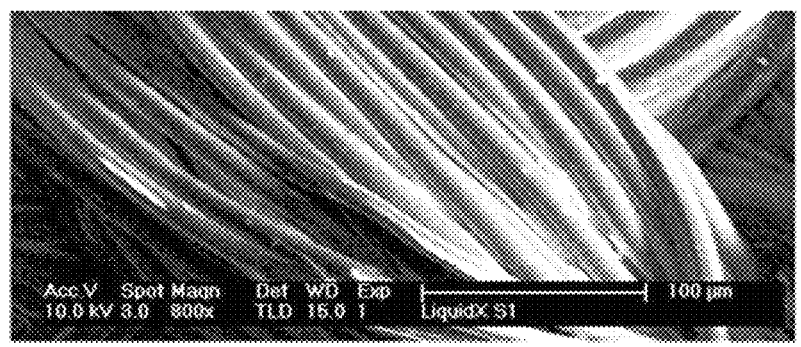

An exemplary textile printed as detailed above is shown in FIGS. 7A-7C. Shown in FIG. 7A is a close-up view of a woven textile substrate having a printed section (left) and a non-printed section (right), wherein printing was on a heated substrate using the molecular inks of the present disclosure. FIGS. 7B and 7C show scanning electron microscopy images (SEM) of the printed textile taken by SEM (150× and 800× magnification). These images demonstrate that the heating the substrate during printing provides better "dying" of the fibers of the substrate. That is, the particle-free inks according to the present disclosure may better penetrate (e.g., soak into the fibers of the textile), or may more completely coat an outer surface (e.g., encapsulate or soak into an outer surface of the textile; conformal coating) of a heated textile substrate, acting as a dye on the textile substrate and improving the conductivity of patterns formed in the heated substrates. Prior art molecular inks, which comprise particles (nanoparticles, flakes, etc.), would not be able to penetrate the textile and were found to sit on top of the textile substrate as shown in FIGS. 4A and 4B. This leaves the prior art inks more susceptible to removal by abrasion and other forces exerted on the textile substrate through standard wear and tear. Thus, the in-situ heat curing promotes better coating around the fabric thread (i.e., conformal coating; see FIG. 4G).

The present inventors have found that the sheet resistance values for textiles (knit, woven, and nonwoven such as Evolon) printed with the molecular inks according to the present disclosure using in situ curing is improved over ex situ curing for most textile substrates. The in-situ curing lowers the sheet resistance, in some cases several orders of magnitude over values measured from ex situ cured conductive traces and reduces the ink bleed. These results were consistent for all numbers of printed layers tested (number of layers in the conductive trace). Thus, methods of the present disclosure, which include heating of the textile during deposition of the ink, such as by ink jet printing, not only leads to improved trace resolution, but also improved conductivity of the trace.

Additionally, the sheet resistance values for knit and non-woven (Evolon) textiles printed with the molecular inks according to the present disclosure were improved by pretreatment by oxygen plasma or corona. Accordingly, methods of the present disclosure, which include heating of the textile before and/or during deposition of the ink, such as by ink jet printing, may also include pretreatment of the textile, and may provide improved conductivity of the trace over untreated textiles.

Flexible Substrates

A wide variety of solid materials can be subjected to deposition (e.g., printing) of the molecular inks of the present disclosure. Organic and inorganic substrates can be used. Flexible substrates such as polymers, organic and synthetic fibers, plastics, metals, wood, paper, leather, ceramics, glasses, silicon, semiconductors, and other solids can be used.

The flexible substrate may be a flexible polymer or polymer film. Exemplary polymer films include polyimide (PI) films such as Kapton®, polyethylene terephthalate (PET) films, polyethersulfone (PES) films, polyetheretherketone (PEEK) films, and polyamide (PA) and polyamide-imide (PAI) films.

In particular examples, the substrate is a textile such as a knit, woven, or nonwoven fabric formed of organic or synthetic fibers. Exemplary fibers of such textile substrates include at least polyester, polyamides, spandex, polyester-spandex, nylon, nylon-spandex, Evolon®, elastane, and other synthetic materials, in addition to organic materials (e.g., cotton, cellulose, silk, wood, wool fibers, leather, suede). Blends of any of these materials are also possible.

The textiles may be pretreated with a reactive gas, such as an $O_2$ plasma or corona, that may improve deposition of the molecular inks thereon and may reduce sheet resistance.

Additionally, the textiles may be prewashed and dried prior to deposition or printing of the molecular inks disclosed herein.

Curing the Molecular Inks

Once the disclosed molecular ink formulations have been printed onto a flexible substrate, at either ambient temperatures or elevated temperatures, they may be cured to form the conductive pattern (i.e., converted to a metallic structure). Curing can include heating the printed substrate, and/or irradiating the printed substrate. In certain examples, the printed substrate may be cured by heating to a temperature of 200° C. or less, such as 150° C. or less, or 100° C. or less, for a time period of less than 60 minutes, such as less than 30 minutes, or less than 15 minutes. In a particular example, the printed substrate is heated to 140° C. for 10 minutes, or exposed to infrared radiation for 10 minutes, to form a conductive pattern with a resistance of less than 1Ω/□.

Sheet resistance values for knit, woven, and nonwoven textiles, wherein the substrate was heated or not during deposition of the molecular inks (i.e., printed on the textile at ambient temperatures and cured; or printed on the textile at elevated temperatures and cured) were tested. The lowest sheet resistance was found for conductive traces on woven polyester, wherein the textile was at ambient or elevated temperatures during printing, while both the knit and nonwoven textiles benefited from printing on a heated substrate.

In certain examples, the conductive trace on the textile substrate may be additionally, or alternatively, cured by exposure to pulsed light, such as by photonic curing, wherein the number of pulses ranges from 2 to 20. Alternatively, or in addition, curing may include irradiating the conductive trace on the textile substrate, such as by exposure to infrared radiation.

Protective Coatings

The conductive traces formed using the molecular inks disclosed herein may be coated with a protective coating, such as a dielectric coating. For example, all or a portion of a trace may be coated with an aqueous dielectric polymer solution. Exemplary polymer solutions include at least acrylic and polyurethane polymers.

The protective coating can be deposited by painting, spraying, or printing (e.g., inkjet printing). The viscosity of the polymeric solutions can be adjusted for the specific textile and deposition method by dilution with appropriate solvents and solvent mixtures. Such coatings may be cured by heat treatment, evaporation of solvents, irradiation (e.g., UV treatment), or any combination thereof. An exemplary coating includes an acrylic-based coating that is printed over the conductive trace and is cured by heating the textile to 160° C. or less, such as 150° C. or less for 30 minutes or less, such as 20 minutes or less.

The composition may be printed by inkjet, gravure, flexographic, or screen-printing techniques, wherein the viscosity of the ink is adjusted for the specific technique, e.g., the viscosity measured at 25° C. may be 2 to 40 centipoise for inkjet printing, or 100 to 400 centipoise for flexographic printing, or 50 to 300 centipoise for gravure printing.

An exemplary protective dielectric coating composition is disclosed in in U.S. Pat. Application Publication No. US 2020/0283653, which includes an aqueous binder, an inorganic nanoparticle having a particle size of less than 250 nm, and one or more polar protic solvents. The aqueous binder may be a polyvinyl alcohol, a hydroxy cellulose, a hydrogel, or a combination thereof. The inorganic nanoparticle may be $SiO_2$ nanoparticles, $Al_2O_3$ nanoparticles, $TiO_2$ nanoparticles, $ZrO_2$ nanoparticles, nanoclay, or a combination thereof. The inorganic nanoparticle may be a colloidal particle. The inorganic nanoparticle may have a particle size of less than 100 nm, or even less than 50 nm. Accordingly, an exemplary protective dielectric coating composition may comprise 2-15 wt. % of an aqueous binder, 1-5 wt. % of a colloidal silica having a particle size of less than 100 nm, and an aqueous solvent, wherein the composition has a viscosity measured at 25° C. of 2 to 400 centipoise.

The coatings may be cured via heat, such as by exposure to 250° C. or less for 30 minutes or less, or photonic curing. The dielectric coating composition may be dried before curing.

Figure 11:
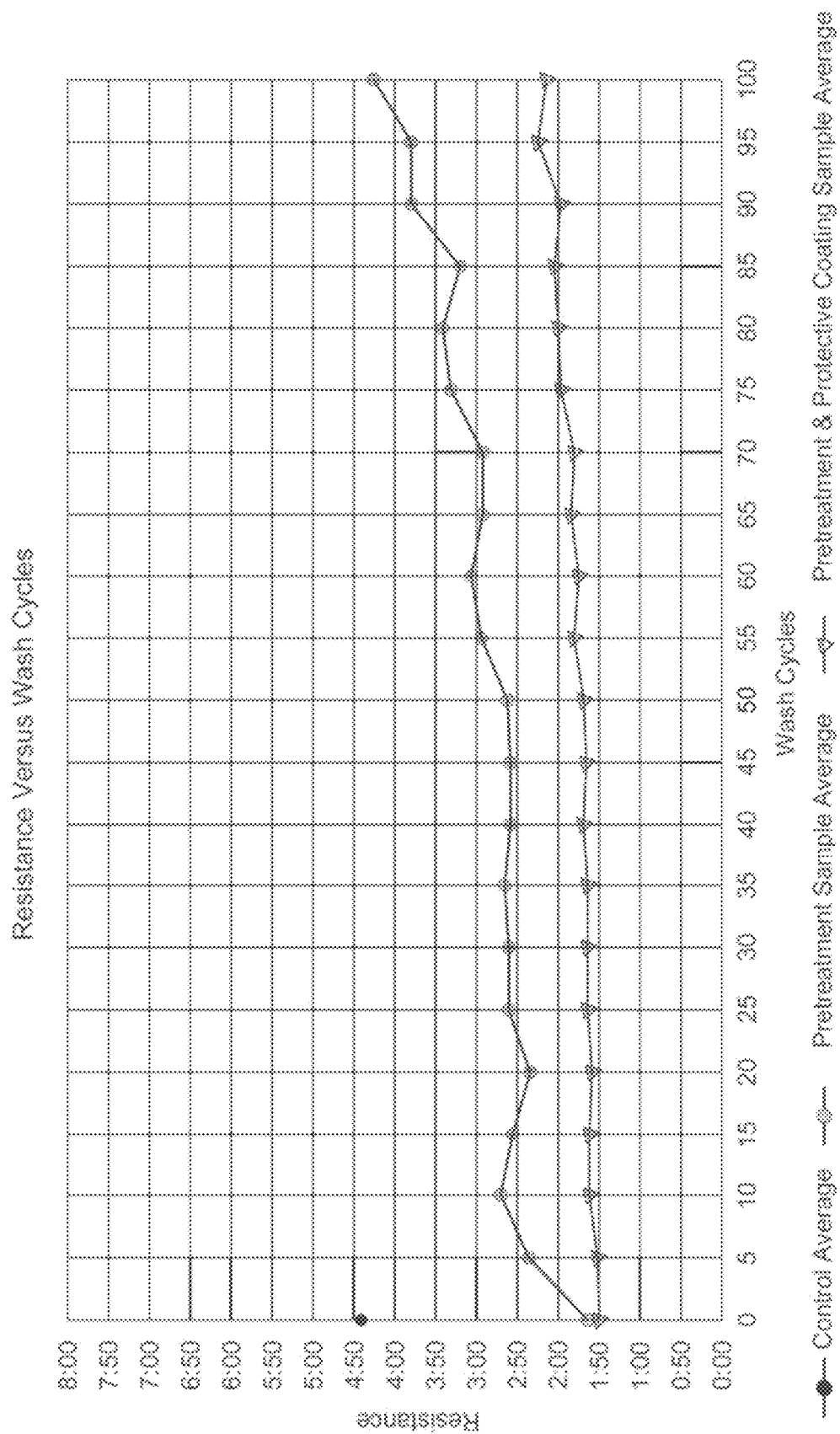
FIG. 11 shows a graph of the resistance (ohms) after multiple wash cycles for a conductive trace on a textile using inks and methods in accordance with certain aspects of the present disclosure.

The coatings may improve washability of the conductive traces, as shown in FIG. 11, and may also improve abrasion resistance of the conductive traces (see Table 5 in examples).

Additional conductive coatings may be provided over contact regions, such as at the contact points or pads of a trace. Such coatings may include conductive polymers and may provide conductive contact with the printed trace while also protecting the trace from abrasion and/or during wash cycles.

Resistive Coatings

The high solubility of the metal complex in the solvent systems disclosed herein provide cured continuous conductive films or traces having high conductivity/low resistance. For example, a silver ink according to the present disclosure provides traces having a resistance of less than 1Ω, wherein the trace comprises at least 90% metal, such as at least 95% metal, or 96% metal, or 97% metal, or 98% metal, or 99% metal, or even as much as 99.5% metal.

The resistivity of the conductive traces may be tuned by addition of a second metal complex in the molecular ink. For example, the present inventors have found that molecular inks comprising at least a second metal complex may provide conductive traces having increased resistivity. The molecular inks capable of forming such resistive coatings may comprise a first metal complex and a second metal complex. Exemplary combinations of metal complexes comprise any combination of silver, gold, platinum, and copper complexes, such as silver complexes and copper complexes, or silver complexes and gold complexes, etc.

The molecular inks may comprise various ratios of the first and second metal complexes, such as 1-99 wt. % or the first metal complex and 99-1 wt. % of the second metal complex. As a specific example, the molecular inks may comprise 99-75 wt. % silver complex, such as a silver amine carboxylate, and 1-25 wt. % of a copper complex, such as a copper amine carboxylate, based on the total weight of metal complex in the molecular ink.

Exemplary mixed metal molecular inks having increased resistivity include those comprising 99-75 wt. % of amine silver carboxylate (e.g., silver diamine carboxylate such as silver diamine isobutyrate or silver diamine oxalate) and 1-25 wt. % of amine copper carboxylate (e.g., copper diamine carboxylate), based on the total weight of metal complex in the molecular ink; and may further comprise a solvent system having one or more polar protic solvents, i.e., water and an amine as indicated hereinabove, and optionally, a surfactant.

Flexible Resistive Heaters

The presently disclosed molecular inks and methods for printing those inks can be used to form electronic elements on flexible substrates, such as resistive heaters that can efficiently deliver warmth in a variety of conditions, including extreme or harsh conditions. Resistive heaters operate by passing electric current through a resistor, which converts the electric energy to thermal energy. The present disclosure provides flexible resistive heaters comprising a flexible substrate having at least one conductive pattern printed thereon with any of the molecular inks disclosed herein, wherein the conductive pattern is configured to carry a current and generate heat.

The resistive heater may further comprise at least one bus printed with the same molecular ink as the conductive trace, or another of the molecular inks disclosed herein, wherein the at least one bus is electrically connected to the at least one conductive pattern and configured to provide connection to a power source. Alternatively, buses may be included as wired components or contacts, wherein such components may be surface mounted (e.g., mounted with conductive epoxy).

The conductive pattern and/or bus may be over-coated with a protective coating, such as any of those discussed hereinabove. An exemplary protective dielectric coating composition is disclosed in U.S. Pat. Application Publication No. US 2020/0283653.

Power may be supplied to the bus from a power source. The power source may be a battery pack capable of supplying the necessary voltage and current to drive the heater. For example, a 24V DC battery with 4 Amp of current capability can be used. The power source may be an electrical outlet, such as a wall outlet. The power source may be a 5-15 V electric system of an automobile. The voltage of the power source can be higher or lower than the voltage supplied to the conductive traces and buses, such as using a DC-DC converter to step the voltage down or up to achieve the desired voltage.

Figure 35:
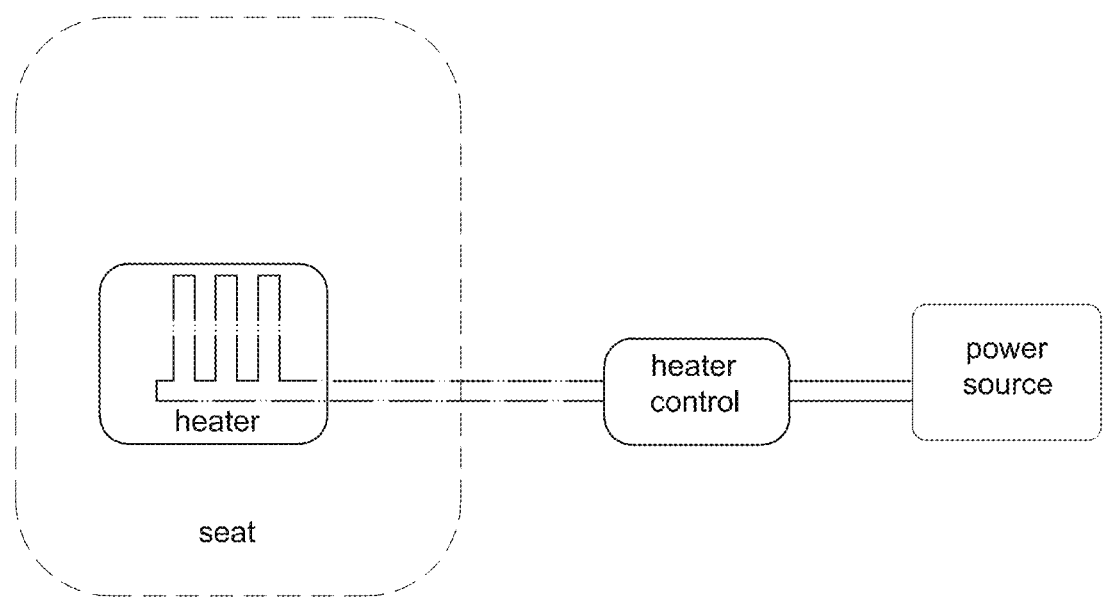
FIG. 35 illustrates a seat heater according to aspects of the present disclosure.

The power source may be controlled by a heater controller (e.g., microcontroller circuit), such as to turn power on or off, or to modulate the power to the bus (and conductive pattern). In some cases, the heater controller draws power from a separate power source, or from the same power source, such as shown in FIG. 35. As such, the power source may supply the required voltage and current to run the heater controller.

The heater controller controls the functions of the heater, controls the heater power supply, provides safety monitoring (e.g., sensors, sensing traces), provides status regarding aspects of the resistive heater, such as status of the power source, (e.g., battery status such as voltage, temperature, etc.; heater resistance; heater current draw; conductive bus voltage drop, etc.), and status of the heater to the user (e.g., heater on, heater level, heater temperature). Exemplary user presented status may include power on/off and power level via illumination of indicator lights, such as the indicators 30 shown in FIG. 28, which indicate status of a resistive heater positioned in a car seat.

The resistive heater may carry a relatively large current through the bus to deliver current to the conductive pattern. If a conductive pattern or bus were to be compromised such as a crack or tear, the current flowing through the remaining part of the pattern or bus might develop a hot spot. To mitigate this potentially hazardous condition, sensing traces can be added to the resistive heater. For example, a sensing trace printed using any of the molecular inks disclosed herein can be connected to either or both buses, or at a point along the conductive pattern, and may be configured to generate a signal indicative of an electrical characteristic of the bus. The sensing trace(s) may measure the voltage at the connection point with the bus, wherein a voltage drop greater than a predetermined level would be indicative of a compromised conductive pattern or bus. The voltage drop can be measured by any sensing circuit, such as an analog-to-digital converter using a microcontroller, a comparator, or the like. A signal indicating bus or conductive pattern integrity error may change the operation of the resistive heater, for example, to power off the heater.

Resistive heaters may find application as wearable heaters or heating elements for use in clothing, or resistive heating elements in the automotive industry (e.g., seat heaters, electric car heaters) or aerospace industry (e.g., printed on flexible substrate attached to a plane wing, printed directly on materials of the plane wing, etc.), and others. In one example, at least the conductive pattern of the resistive heat is printed directly on a textile, such as the underside of a car seat cover (see FIG. 28). Alternatively, the resistive heater may be printed on a flexible substrate, such as the conductive pattern printed on a flexible polymer film that is positioned underneath the material of the seat cover, or under both the seat material and a foam cushion material. When printed on a flexible polymer substrate, the resistive heater may be laminated, adhered, or bonded to another textile, such as to a bottom side of the material of a car seat, or to a foam layer of the cushion of a car seat.

Figure 40:
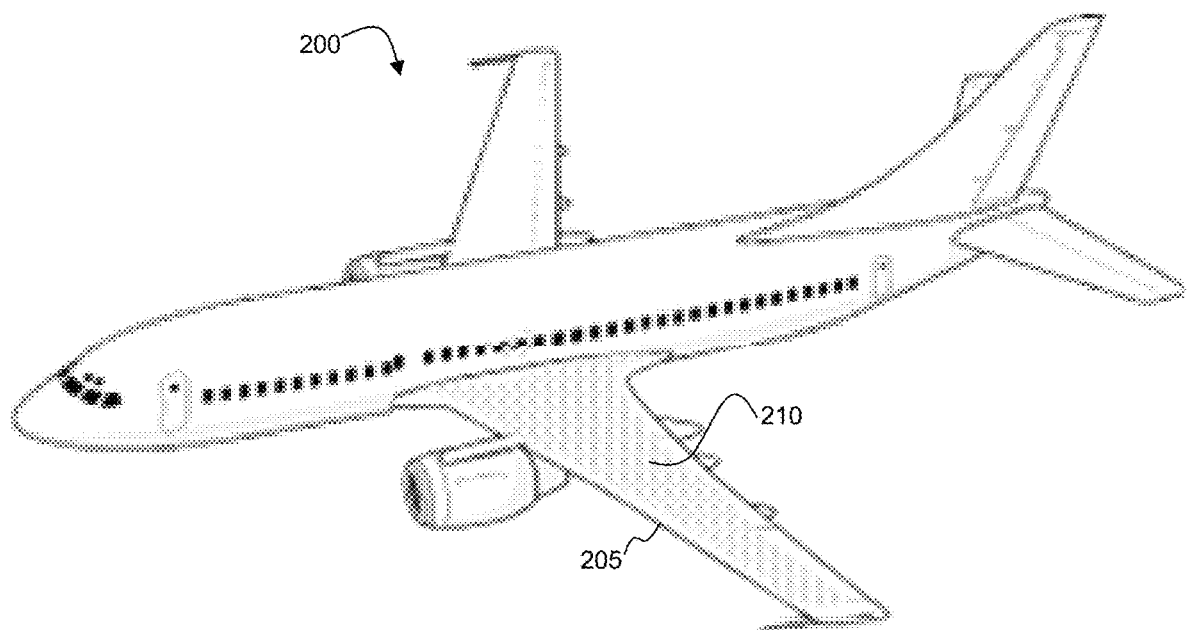
FIG. 40 illustrates placement of a resistive film on an airplane wing according to aspects of the present disclosure.
Figure 41:
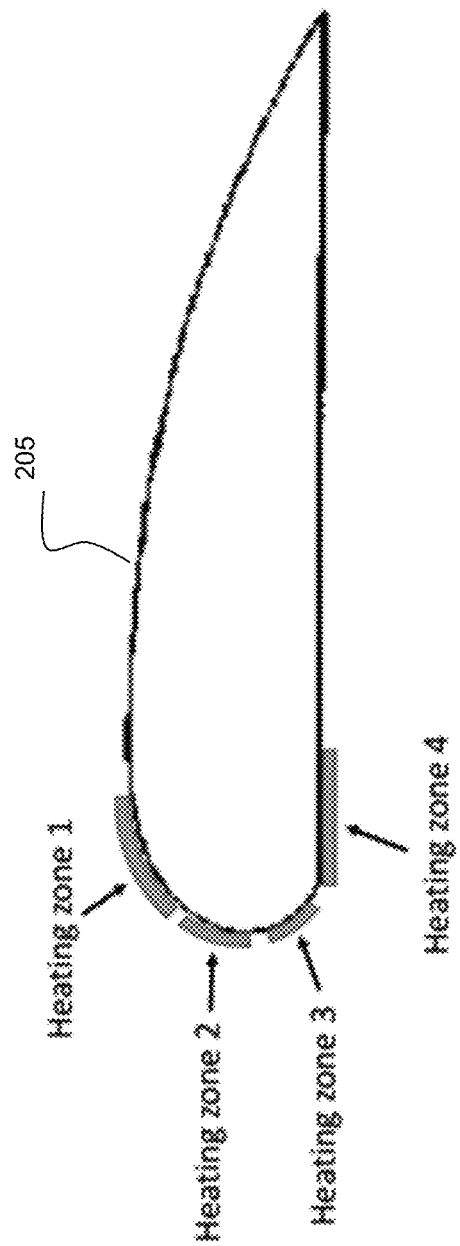
FIG. 41 illustrates placement of a resistive film on the leading edge of an airplane wing according to aspects of the present disclosure.

In another example, and with reference to FIGS. 40 and 41, the molecular inks may be printed on a flexible substrate 210 that is positioned on a surface of an airplane wing 205, such as a top surface, and may be laminated, adhered, or bonded that surface. When positioned on an airplane 200, such as on the wing 205, the substrate comprising the resistive coating(s) or pattern(s) may for a large-scale heaters, such as to provide deicing, and/or may act to dissipate electric energies from lightning strikes and the like. An exemplary placement of resistive coatings and/or films is shown in FIG. 41, wherein the resistive film may be aid in de-icing and as protection against lightning strikes (i.e., lightning generally strikes the sharp edges of an aircraft, such as the nose and/or wing at the leading edge). For example, the molecular inks may be printed on any of the polymeric films disclosed herein, e.g., Kapton film, to form a resistive film which may then be attached to the wing, such as via an adhesive. According to certain aspects, the film may contain one or more zones of differing resistance running parallel to the wing, e.g., heating zones 1-4 as shown in FIG. 41. For example, the lowest resistance (highest heat density) may be placed at the leading edge.

Figure 15:
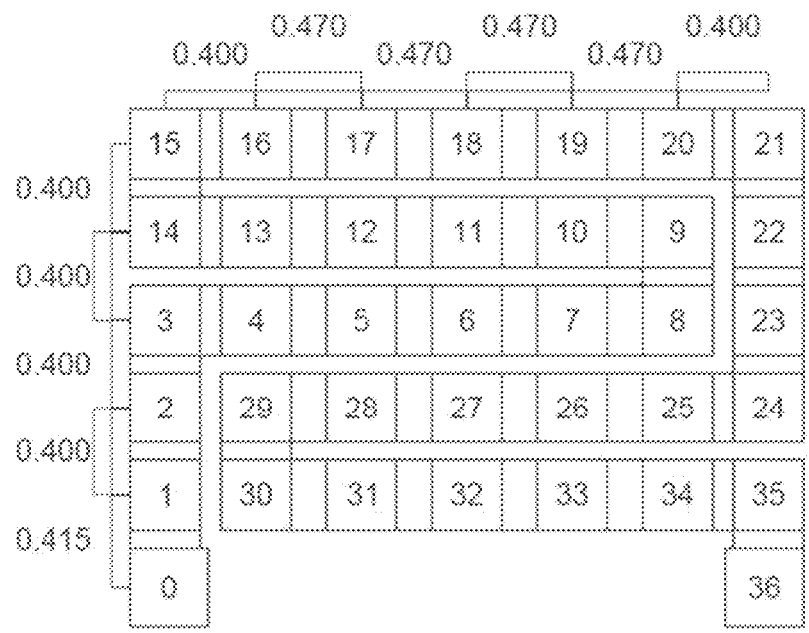
FIG. 15 shows a schematic diagram of an exemplary 5-trace heater element in accordance with certain aspects of the present disclosure, wherein the numbered blocks are test locations for resistance measurements.
Figure 17A:
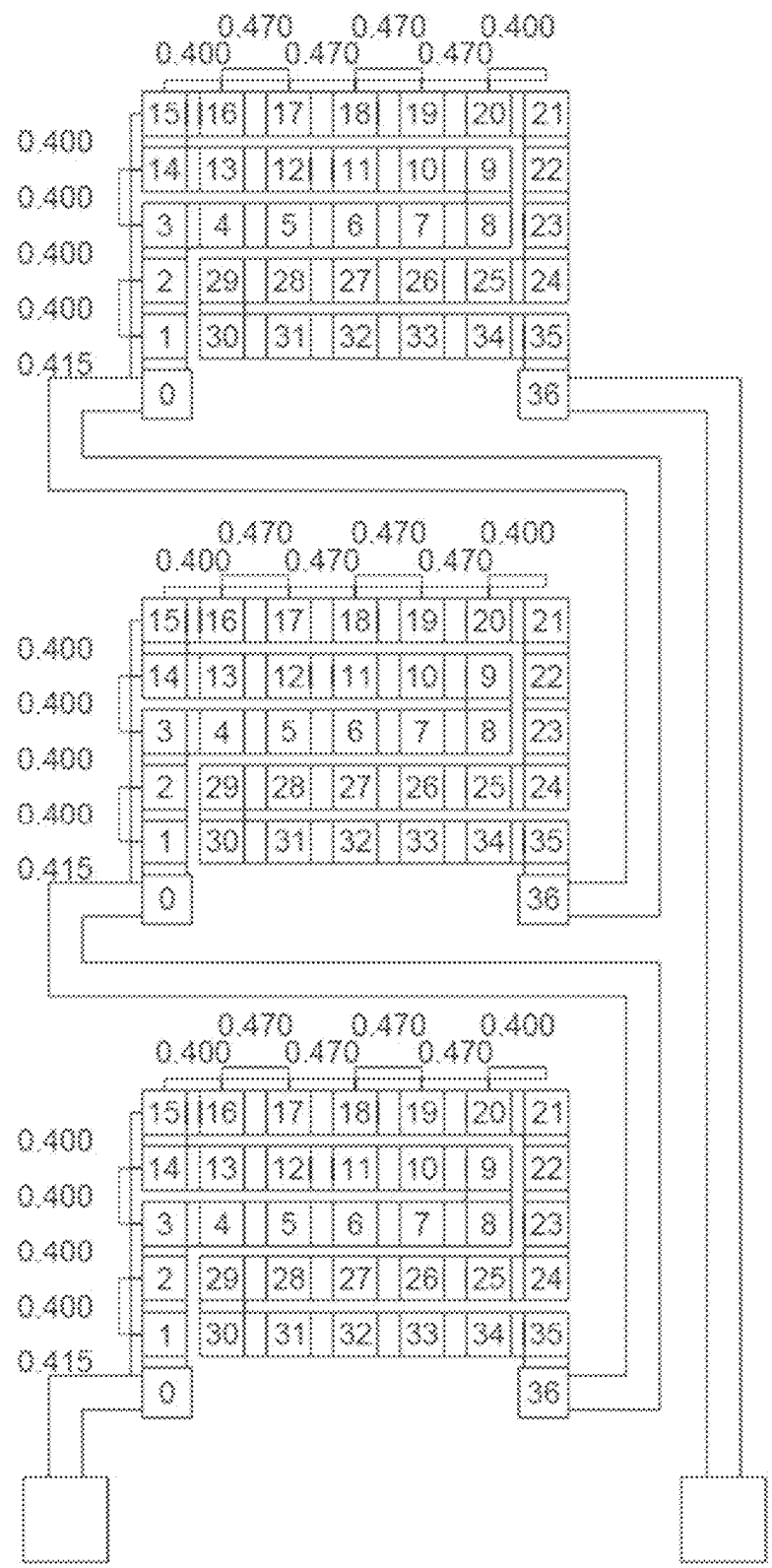
FIGS. 17A and 17B show series and parallel circuits, respectively, of 5-trace heaters formed according to certain aspects of the present disclosure.
Figure 17B:
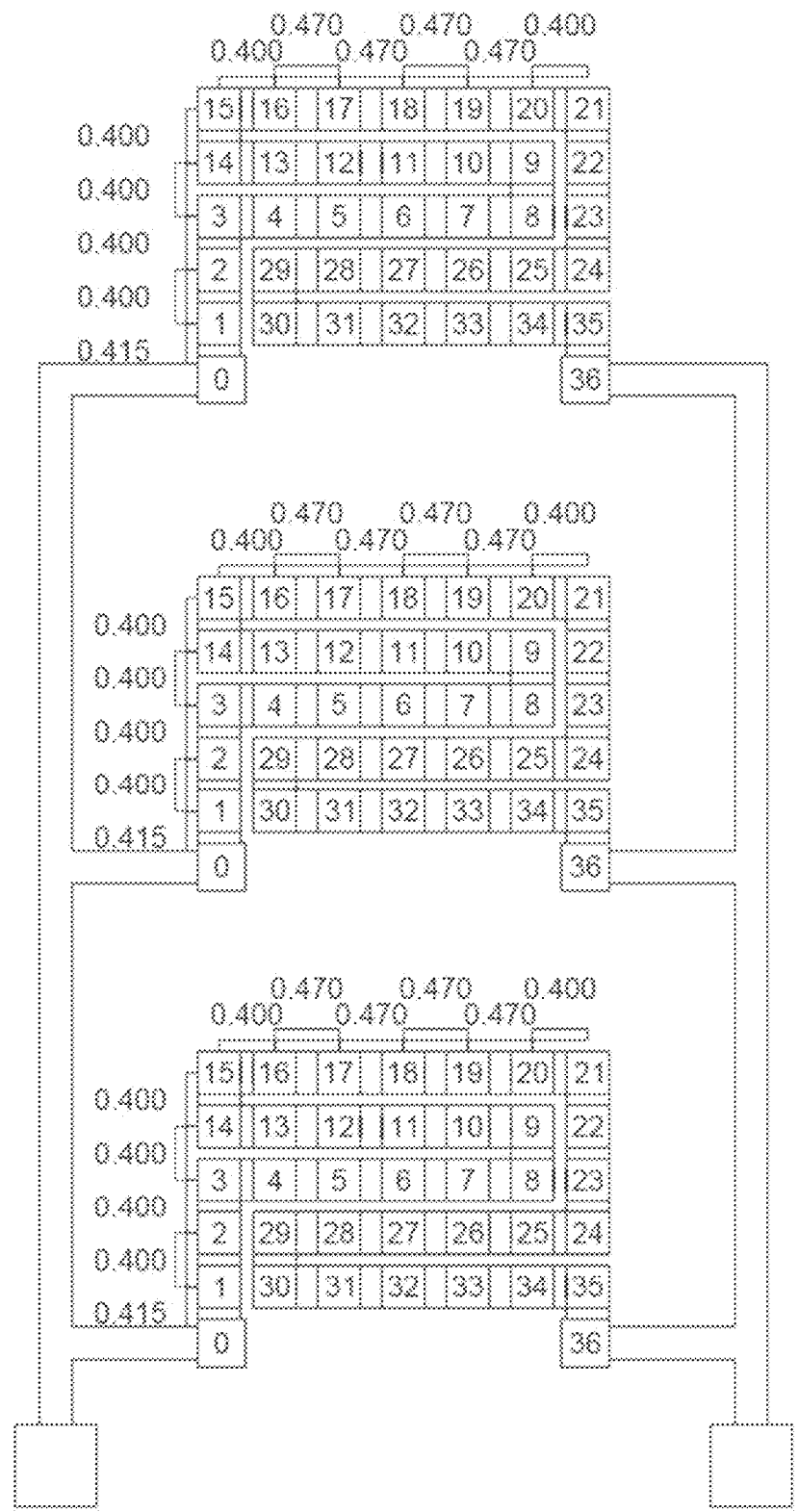

An exemplary 5-trace heater is shown in FIG. 15. These heaters may be placed in series, or parallel, as shown in FIGS. 17A and 17B, respectively.

Figure 16A:
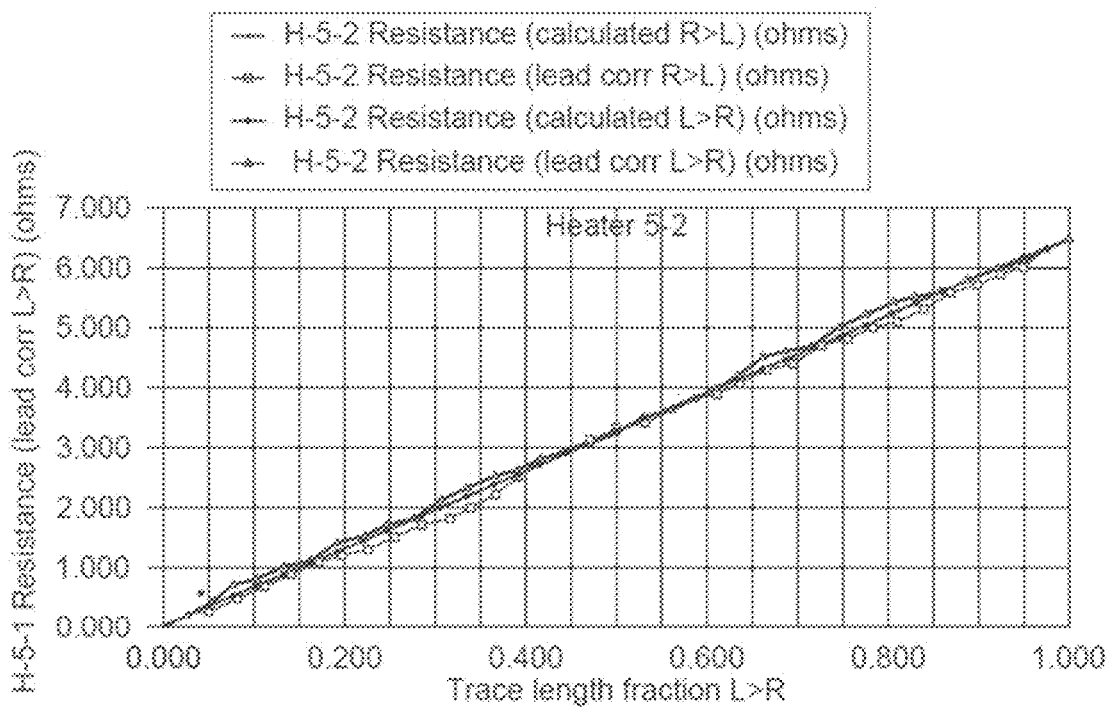
FIG. 16A shows a graph of resistance measurements from 5-trace heaters formed according to certain aspects of the present disclosure, wherein the readings were taken at the locations indicated in FIG. 15, data is normalized to 1.0 for location 36.
Figure 16B:
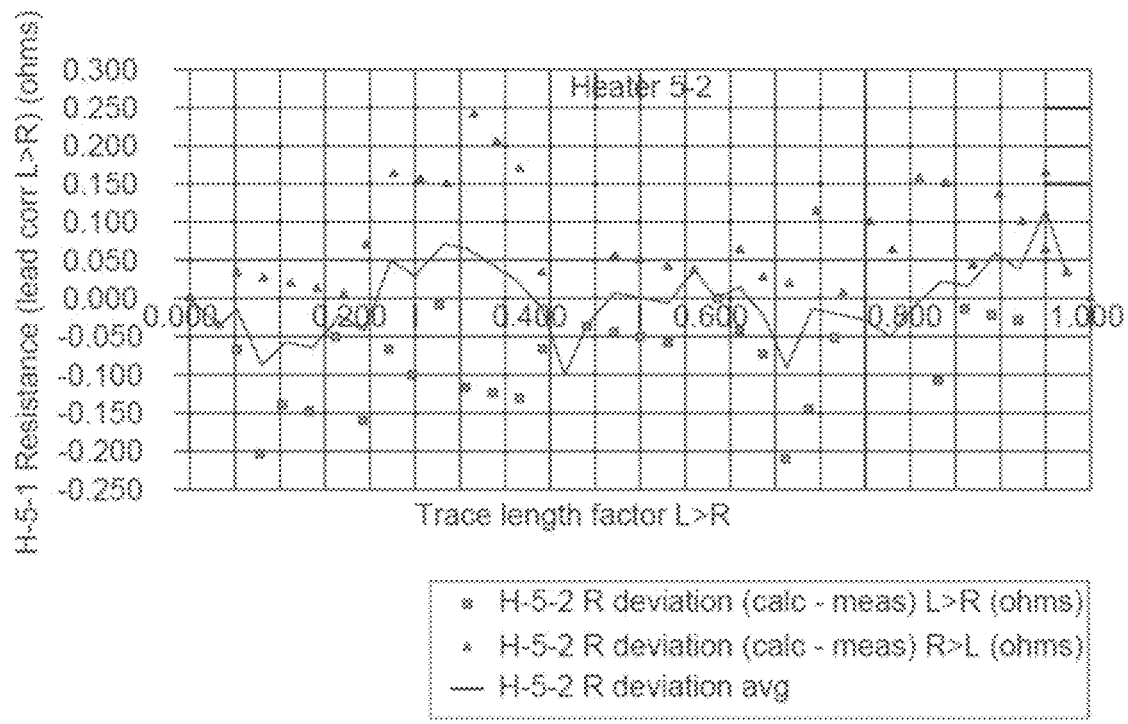
FIG. 16B shows the deviation of the data shown in FIG. 16A from the expected value (dotted lines in FIG. 16A).

Resistance measurements taken at various points along the traces, as shown by the numbered blocks in FIG. 15, were found to vary linearly with respect to trace length (see FIG. 16A for values measure from two 5-trace heaters). In fact, the calculated and measured resistance values at each point were found to be very close (i.e., resistance measured with an alligator clip ground connection and manual tip probe; see FIG. 16B). Similar results were observed for 7-trace heaters. Left-to-right and right-to-left resistance measurements were conducted to investigate print/process-related resistance variations. When normalized for trace length, the measured resistance from 5-trace and 7-trace heaters showed remarkable correlation with the predicted resistance.

An advantage of the presently disclosed resistive heaters is that they are flexible, thin, and heat/cool rapidly. Heating is initiated almost immediately after current is provided to the resistive heater. The upper temperature limit may be limited based on the total voltage supplied to the printed trace, wherein an upper set point was found to have little effect on the heating rate (i.e., heating to 65° C. and 85° C. occurs at the same rate).

Figure 18A:
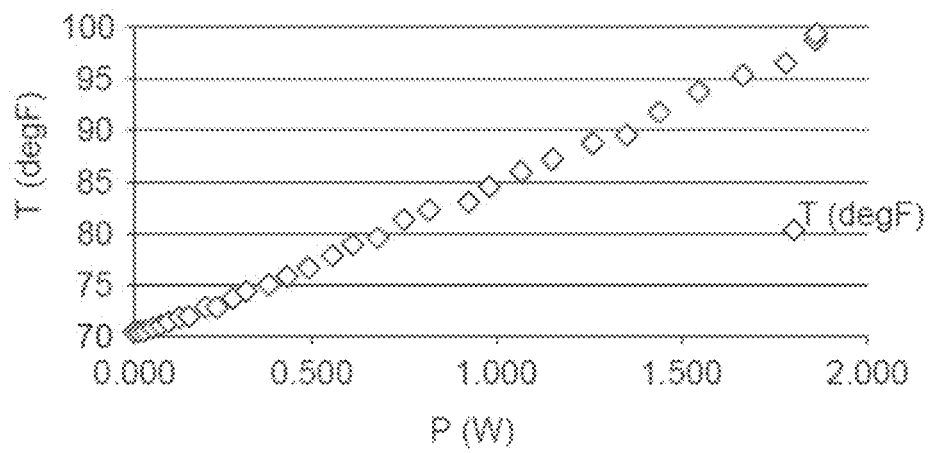
FIGS. 18A-18C show graphs demonstrating the linearity of temperature increase with power increase (FIG. 18A), and the lack of resistance drift over time or temperature (FIGS. 18B and 18C, respectively) for 5-trace heaters formed according to certain aspects of the present disclosure.
Figure 18B:
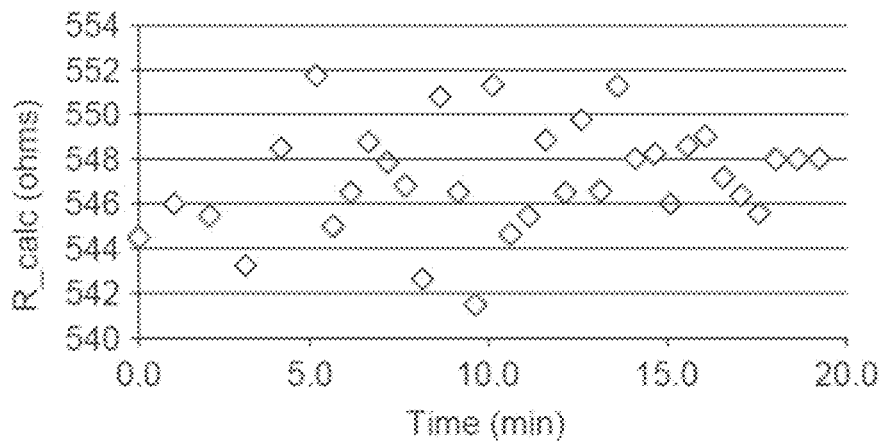
Figure 18C:
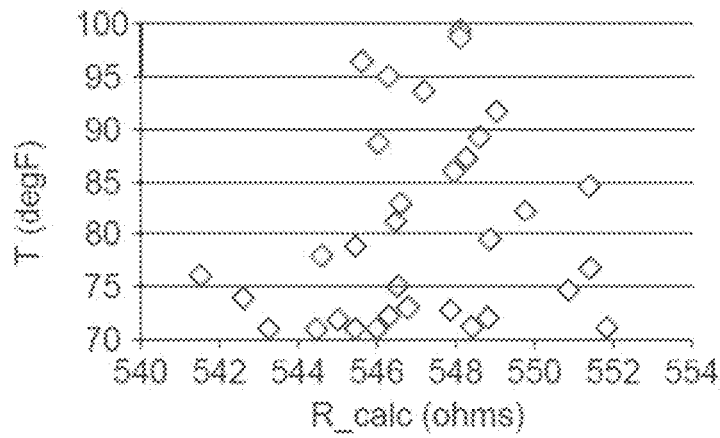

The temperature increases linearly with power until an equilibrium is reached (see FIG. 18A, about 2 watts of power and 100° F.). Moreover, the resistance is not observed to drift with time (FIG. 18B) or temperature (FIG. 18C) for resistive heaters printed using the inks and methods of the present disclosure. Such results are observed uniformly from trace to trace, showing an overall deviation of only 3Ω.

Thus, the resistive heaters may be configured to carry a power density of greater than 400 watts/m$^2$. For example, the resistive heaters of the present disclosure may be capable of carrying a power density of at least 600 watts/m$^2$, such as at least 800 watts/m$^2$, or at least 1,000 watts/m$^2$, at least 1,500 watts/m$^2$, at least 5,000 watts/m$^2$, or even at least 10,000 watts/m$^2$.

Alternatively, the resistive heaters may be configured to carry a power density of less than 400 watts/m$^2$, such as less than 350 watts/m$^2$, or less than 300 watts/m$^2$, or less than 200 watts/m$^2$, or even less than 100 watts/m$^2$. The resistive heaters may be configured to carry a power density of at least 10 watts/m$^2$.

When connected to a 5-15 volt electrical system, such as that of an automobile, the at least one conductive pattern may be configured to have a resistance of 1-30 ohms, and/or to generate 10-1,500 watts/m$^2$ at −40° C. to 60° C., and/or to carry a power density of at least 400 watts/m$^2$, such as up to 1,500 watts/m$^2$, and/or heat at a rate of about 0.1° C./second to about 1° C./second. A thermal output from the resistive heaters will depend on various design factors, such as the metal or alloy or combination of metals and/or metal alloys in the molecular ink, a width of the conductive trace, a thickness of the conductive trace, the resistance of the trace, and any other components in the ink composition (e.g., other conductive polymers, etc.), and thus may be tuned to fit the specific application. Moreover, thermal output may also be modulated by selection of the power source, overall size of the conductive pattern), and selection of the substrate material. Depending on the material used as a substrate, i.e., type of textile or polymeric material, the resistive heaters formed with the molecular inks and methods disclosed herein may reach a temperature in the range of 25° C.-200° C.

One approach to improve the electrical and thermal performance of silver-based resistive heaters is to incorporate other conductive materials, such as a second metal complex. One exemplary second metal complex useful in a silver molecular ink is a copper complex, such as an amine copper carboxylate formed according to the disclosure hereinabove (e.g., resistive coatings). See the examples for additional details on such silver, copper molecular inks.

Another approach to improve the electrical and thermal performance of silver-based resistive heaters such as carbon nanotubes (CNTs), graphene, graphite, metal oxides, and conducting polymers, as fillers. The blending of such conductive filler materials with conductive metals affords a conductive composite with average electrical and thermal conductivity features. More importantly, the composite is expected to exhibit improved film integrity, conformal fabric coating during printing, and lower heater fabrication cost. Since silver is the most conductive metal, the silver-based composites may exhibit reduced electrical resistance with higher heater performance in terms of the maximum heater temperature. Moreover, such composite inks may provide more uniform thermal distribution compared to devices printed with pristine silver films, mainly due to improved interconnection as the conducting polymers fill any voids or cracks.

Thus, use of these additional conductive filler materials may maintain or even improve the flexibility of the final printed substrate, such as textile fabrics and sheets, and may improve the conformal coating of individual fibers in the textile substrate in much the same manner as particle-free silver inks.

Flexible Force Sensors

The presently disclosed molecular inks and methods for printing those inks can be used to print force sensing elements. Accordingly, the present disclosure also relates to a force sensing device comprising at least one electrode layer separated from at least one conductive layer by a gap distance. The at least one electrode layer may comprise at least one electrode printed using the molecular ink on a first flexible substrate. The at least one electrode layer may comprise first and second electrodes that are interdigitally printed on the flexible substrate using the molecular ink. The at least one conductive layer may comprise a conductive trace or region (also referred to herein as a conductive strip) on a second flexible substrate that is printed with any of the molecular inks disclosed herein, a resistive carbon-based ink, a conductive paint, indium tin oxide (ITO), or a combination thereof, or may comprise any of a poly(3,4-ethylenedioxythiophene) polystyrene sulfonate (PEDOT:PSS), a carbon nanotube-based thin film (CNT), a carbon-loaded thermoplastic polymer, carbon-loaded silicone, carbon-loaded polymeric foil, velostat, or any combination thereof.

Figure 19A:
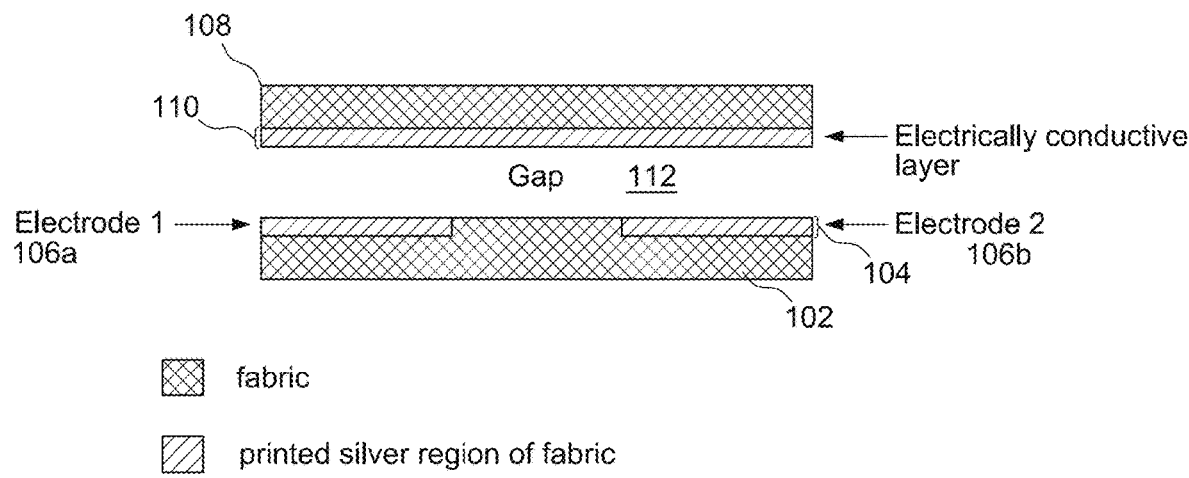
FIG. 19A illustrates a schematic diagram of a cross-section of a force sensor according to certain aspects of the present disclosure.
Figure 24A:
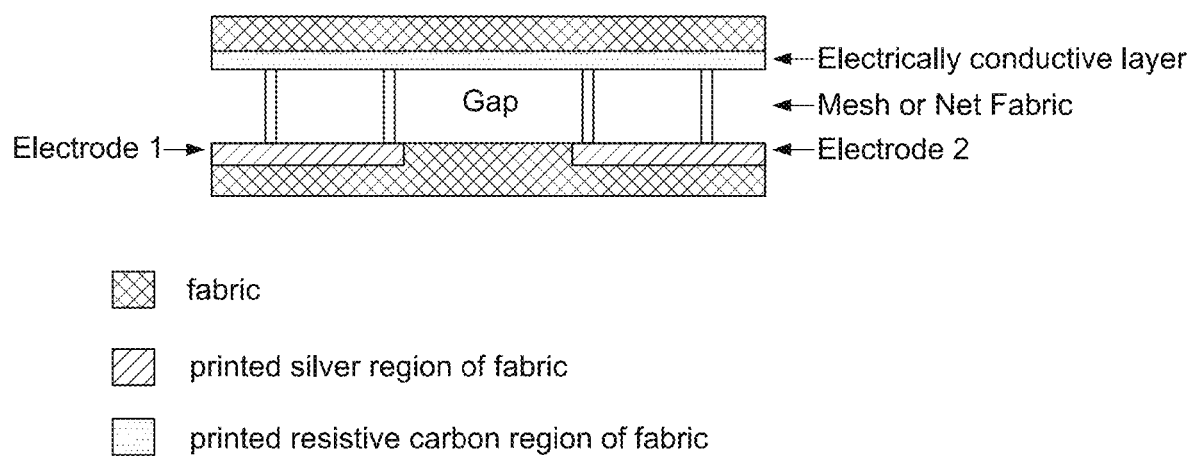
FIG. 24A illustrates a schematic diagram of a cross-section of a force sensor of the present disclosure showing a mesh or net fabric maintaining the gap between an electrode layer and a conductive layer of the force sensor.

With reference to FIG. 19A, the first flexible substrate 102 may comprise first and second electrodes printed thereon (106a and 106b, respectively). Moreover, the first and second substrate (102 and 108, respectively) may be arranged so that the first and second electrode (106a, 106b) on the first substrate 102 directly oppose a printed conductive region 110 on the second substrate 108, and is separated therefrom by a gap 112 formed between these two substrate layers, which provides the piezoresistive property of the sensor. A separation distance may be maintained by a textile that bridges the distance between the conductive layer and the electrode layer. An exemplary textile material includes a mesh fabric or net fabric. (See FIG. 24A).

The separation or gap 112 may also be maintained by embossing one of the substrate layers outside of the region containing the printed electrode(s) and conductive region. The separation may be maintained by a spacer material that frames an open region (frame 107), such as shown in FIG. 24B, wherein the open region comprises all or a portion of the electrode (106a,b on substrate 102) and/or conductive region. Exemplary spacer materials include any of the flexible polymer films disclosed herein or an adhesive. The separation may be maintained by dots, such as spacer beads (109; FIG. 24C). The dots or spacer beads may be held in place with adhesives, may be melted into place (i.e., brief exposure to heat), may be printed onto one of the layers of the pressure sensor, such as the electrode layer and/or the conductive region. Any combination of methods and materials disclosed herein to maintain separation between the various substrate layers, and thus the distance between the electrode and conductive regions, is possible and within the scope of the present invention. Selection of the elements and specific design consideration regarding spacing and size of the elements may depend on the size of the force sensor, i.e., printed electrodes, and the selection of the substrates, e.g., highly flexible substrates may benefit from additional separation elements to maintain the preferred separation distance between the substrate layers.

The separation between the various substrate layers, i.e., the gap, may be used to maintain a "no contact" distance between the electrode(s) and the conductive layer, such that compression of the force sensor (compression of the various layers of the force sensor so that they touch) will bring the substrate layers into contact and reduce the electrical resistivity of the force sensor. Exemplary separation distances may be at least 1 micron, such as at least 10 microns, or at least 20 microns, or at least 40 microns, or at least 60 microns, or at least 80 microns, or at least 100 microns, or even at least 150 microns. An exemplary separation distance maintained by a separation frame formed by a PET polymer film is about 180 microns (~0.18 mm).

Figure 19B:
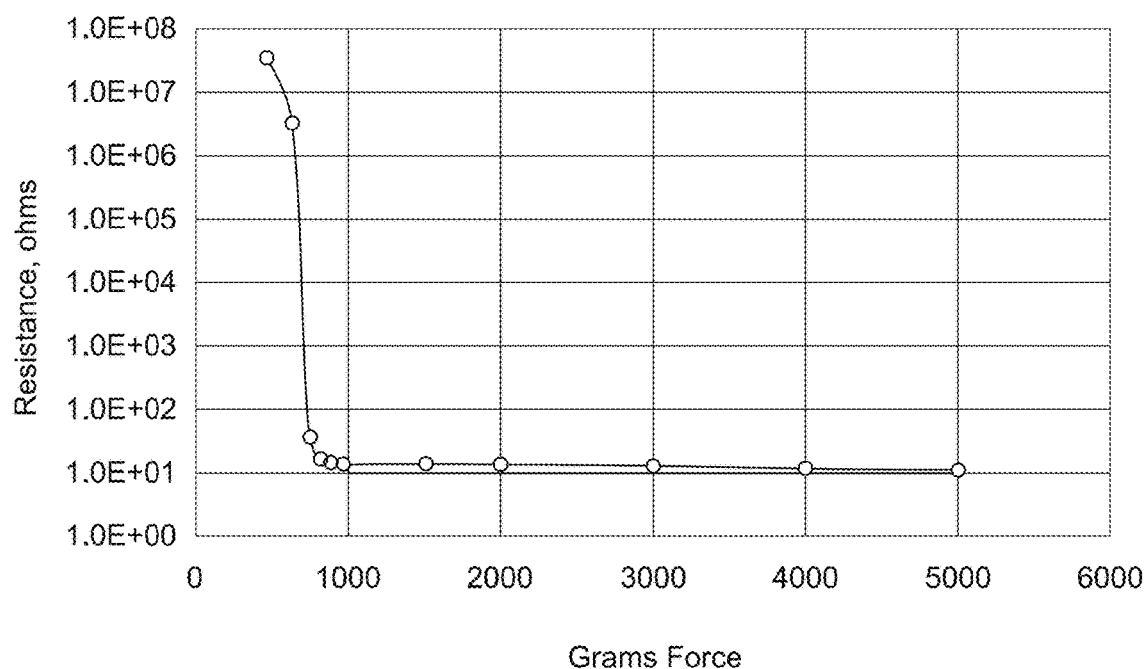
FIG. 19B is a graph showing the electrical resistance as a function of normal force exerted on the sensor elements of a force sensor as configured in FIG. 19A.

Each of the printed conductive region and the first and second electrodes may be printed using a molecular ink, such as any of the molecular inks disclosed herein. For example, when a particle-free silver ink is used to print the conductive region and the first and second electrodes on a non-woven fabric, the resistance drops proportionately with an amount of applied force (see FIG. 19B).

As shown in FIG. 25A, the at least one electrode layer may comprise at least two conductive traces printed on the first flexible substrate 102, thus forming the first and second electrodes (106a, 106b), wherein the conductive traces are interdigitally configured. Shown in FIG. 25B is a conductive layer on a second flexible substrate 108 positioned over the at least one electrode on the first flexible substrate 102.

Figure 20A:
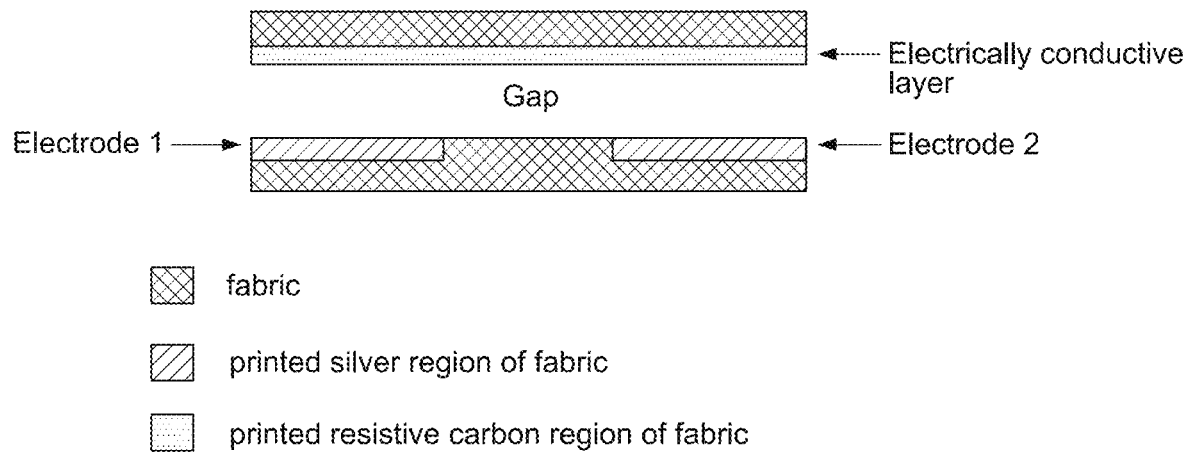
FIG. 20A illustrates a schematic diagram of a cross-section of a force sensor of the present disclosure.
Figure 20B:
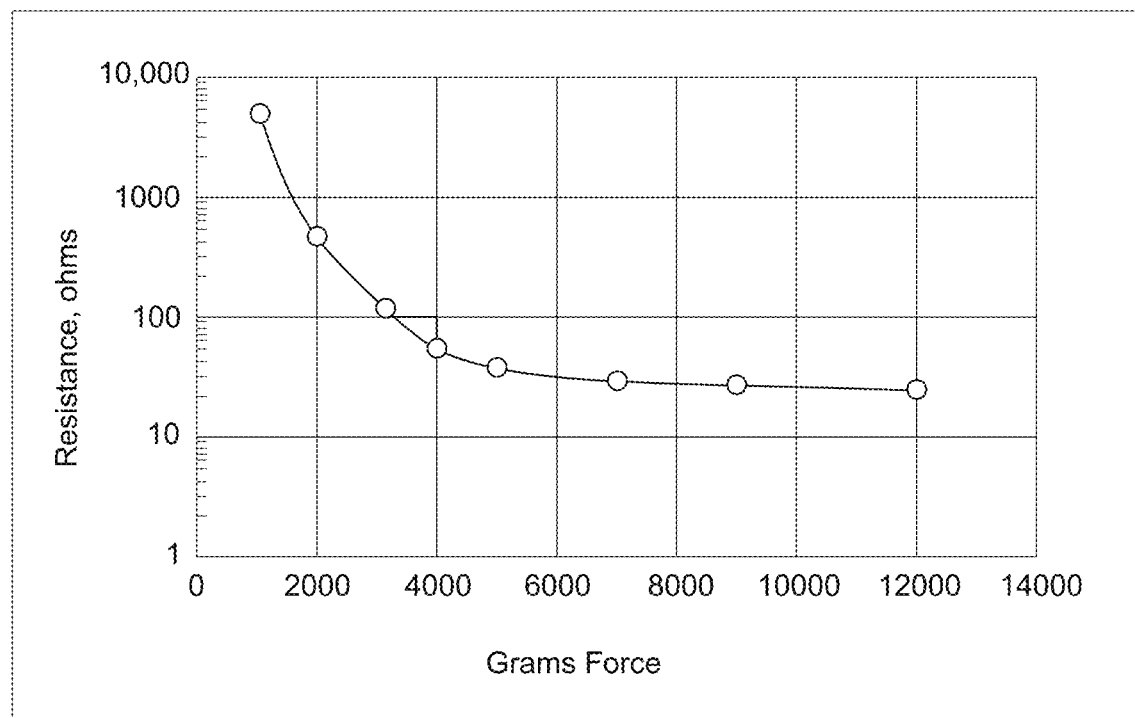
FIGS. 20B and 20C are graphs showing the electrical resistance as a function of normal force exerted on the sensor elements of a force sensor as configured in FIG. 20A printed with low or high resistivity carbon ink, respectively.
Figure 20C:
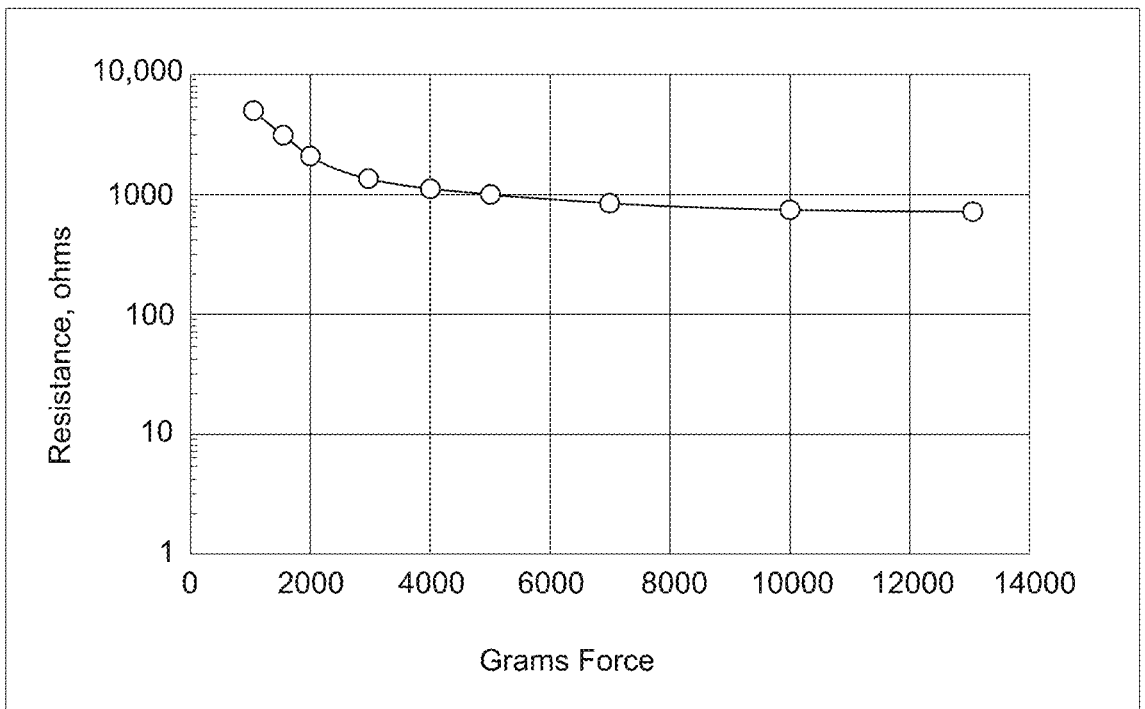

FIG. 20A depicts another configuration for a force sensor of the present disclosure. The conductive layer on the second flexible substrate may be printed with a conductive carbon-based ink. As shown in FIG. 20B, when the conductive layer is printed with a low resistivity carbon ink, the force required to generate a proportionate signal is much lower than when the electrically conductive layer is printed with a high resistivity carbon ink, as shown in FIG. 20C.

Figure 21:
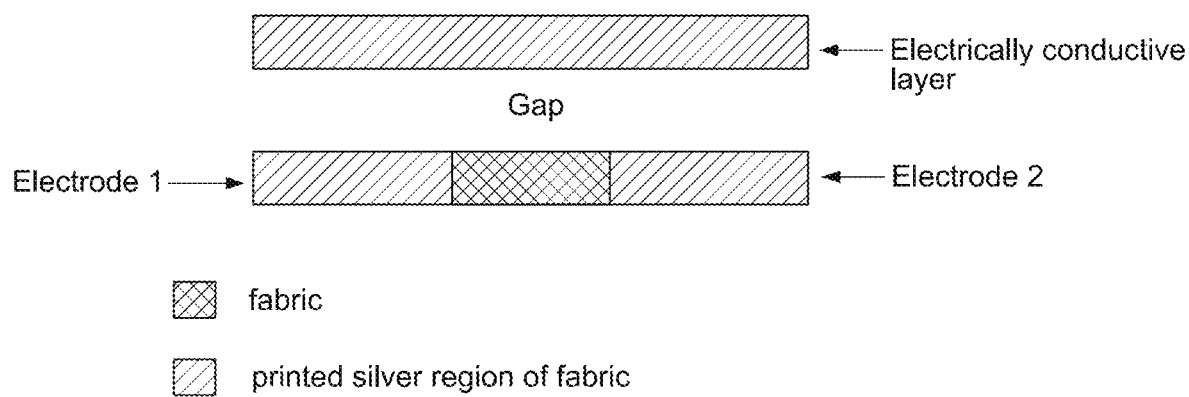
FIG. 21 illustrates a schematic diagram of a cross-section of a force sensor of the present disclosure.
Figure 22:
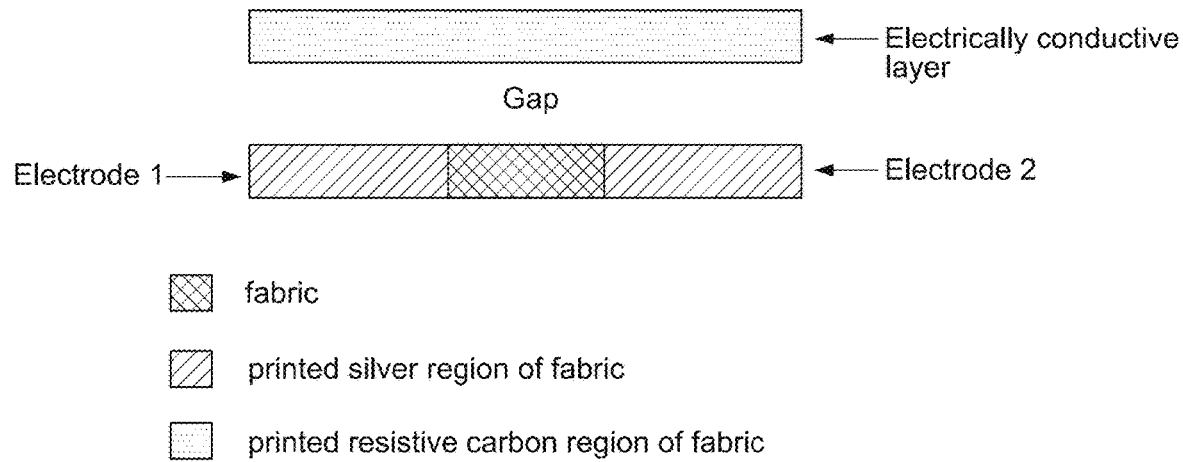
FIG. 22 illustrates a schematic diagram of a cross-section of a force sensor of the present disclosure.

Additional configurations of force sensing devices according to aspects of the present disclosure are shown in FIGS. 21 and 22, wherein the conductive layer and first and second electrodes occupy a full thickness of the flexible substrate. That is, layers 104 and 110 that are shown in FIG. 19A to occupy only a portion of the thickness of the substrates may occupy a full thickness of the substrate, such as shown in FIGS. 21 and 22.

Figure 23A:
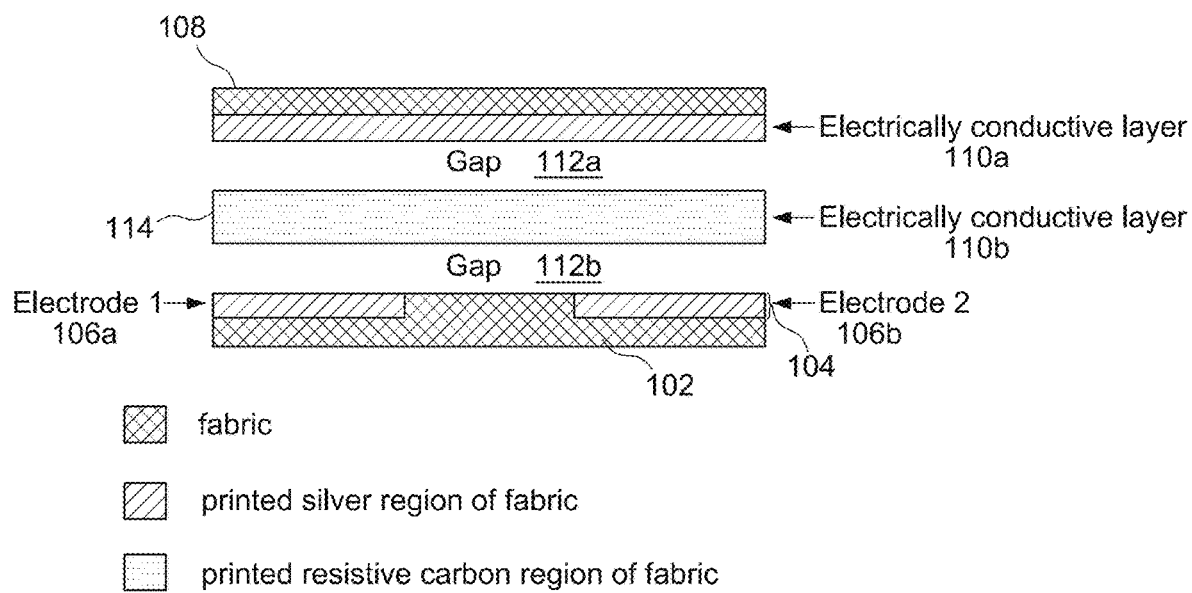
FIG. 23A illustrates a schematic diagram of a cross-section of a force sensor of the present disclosure.

As shown in FIG. 23A, the force sensing device may comprise two electrically conductive layers (110a, 110b), wherein a first electrically conductive layer is printed on the second flexible substrate with a particle-free conductive metal ink, and a second electrically conductive later is printed on a third flexible substrate 114 with a carbon ink. The various layers may be arranged to provide two separation regions or gaps as shown in FIG. 23A (e.g., two air gaps, 112a, 112b as shown, such as separation provided by a mesh fabric, frame, embossed region, dots, etc.).

The force sensing device may comprise a conductive layer and/or electrode layer printed on a textile, wherein the printed electrically conductive material comprises a range of between ten percent and one hundred percent of the thickness of the textile substrate. The force sensing device may comprise an electrode layer printed on a textile substrate, wherein the printed electrodes are printed equidistant from one another.

As shown in FIGS. 19A, 20A, 21, and 22, a force sensing device may comprise two layers of substrate (e.g., fabric), one conductive layer and one electrode layer, wherein the electrically conductive material on the conductive layer faces the printed electrodes on the electrode layer. The conductive layer and electrode layer may both be printed with a particle-free conductive metal ink (e.g., particle-free silver ink), as shown in FIGS. 19A and 21. The conductive layer may be printed with a resistive carbon ink where the electrode layer may be printed with the particle-free conductive metal ink, as seen in FIGS. 20A and 22. Alternatively, a force sensing device may comprise two layers of conductive metal ink printed on a substrate, such as fabric, and one electrode layer, wherein a conductive layer printed with piezoresistive carbon ink lays between a conductive layer printed with a particle-free conductive metal ink and an electrode layer printed with a particle-free conductive metal ink (See FIG. 23A).

Figure 23B:
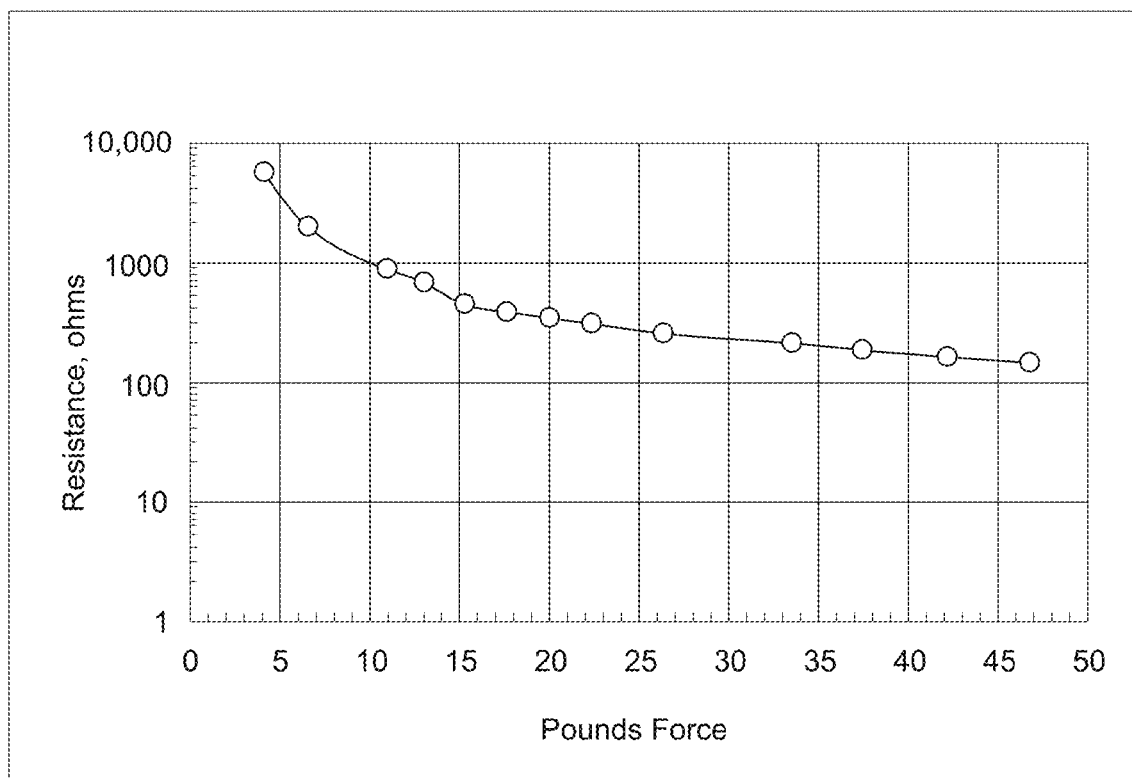
FIG. 23B is a graph showing the electrical resistance as a function of normal force exerted on the sensor elements of a force sensor as configured in FIG. 23A.

A force sensor configured as shown in FIG. 23A may have a range of electrical resistance of from 100 to 10,000Ω when met with up to 45 pounds of force (see FIG. 23B).

The various layers of the force sensor, such as electrode layer and the conductive layer, may be bonded by a hot melt bonding film, pressure sensitive bonding film, pressure sensitive adhesive, or by sewing, such as outside of the region comprising the first and second electrodes. For example, any of the hot melt bonding film, pressure sensitive bonding film, or pressure sensitive adhesive may be used to form a frame that maintains the separation distance of the gap and may also function to bond the layers of the force sensor together.

As a force is applied to the force sensor, the at least one electrode and conductive layer are brought into closer proximity, thus reducing the electrical resistivity of the force sensor. This change in electrical resistivity may be communicated with a control circuitry. Accordingly, the force sensing devices disclosed herein may further comprise a control circuitry, a communications device (transceiver), and a controller, wherein at least one signal path may connect the at least one printed electrode to the control circuitry.

Figure 32:
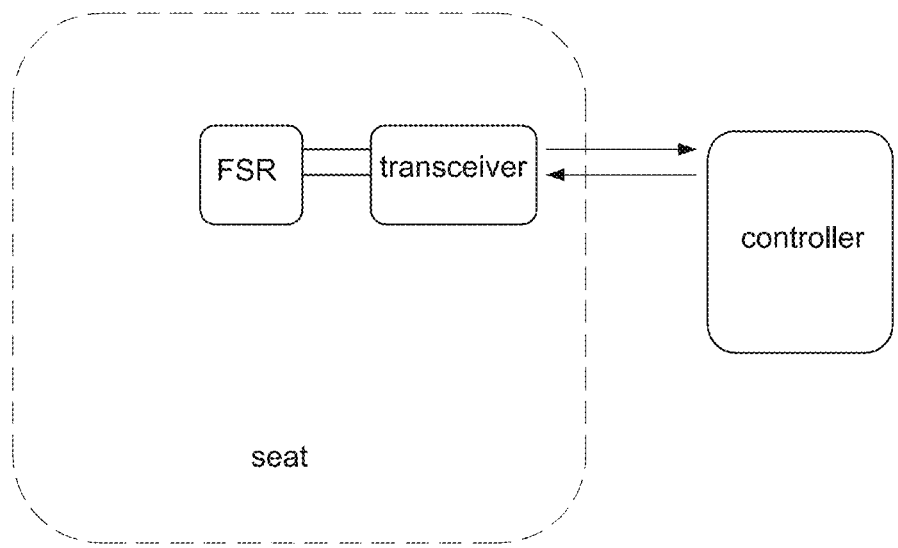
Figure 33:
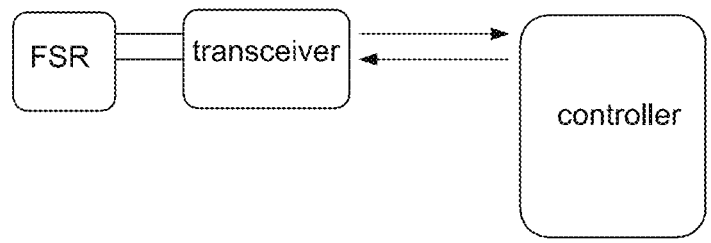

Accordingly, compression of the flexible substrate initiates an electrical signal, i.e., a change in the resistance, which travels to a transceiver in electrical communication with a controller (see FIG. 33). The control circuitry may have wired or wireless communications circuitry for supporting communications between the transceiver and external electronic devices, such as an output of force sensor measurements readable on an external, connectable device like a computer, phone, tablet or otherwise. The external electronic device may be a computer, cellular telephone, a head-mounted device, a display, a gaming unit, a set-top box, a system including two or more of these devices, or other electronic equipment, and may include software to translate the signal received from the force sensing device. As shown in FIG. 32, the force sensor and transceiver may be part of a seat, such as an automobile seat.

The force sensing device may be printed on a flexible substrate such as any of the substrates indicated herein. For example, the flexible substrate may be a knit, woven, or non-woven substrate or textile. The textile may be made of polyester, polyamides, spandex, nylon, Evolon®, elastane, cotton, cellulose, silk, wood, linen, wool, leather, or blends thereof. The flexible substrate may comprise paper, parchment, leather, and plastic films and containers.

Accordingly, the force sensing device may comprise a textile having at least one conductive trace printed thereon, wherein at least a portion of the at least one conductive trace is over-coated with a protective dielectric coating. The at least one conductive pattern may exhibit an ink bleed of less than 0.5 mm, and a resistance of less than 10Ω/□. The particle free conductive trace may comprise two or more layers of the molecular ink.

Figure 26A:
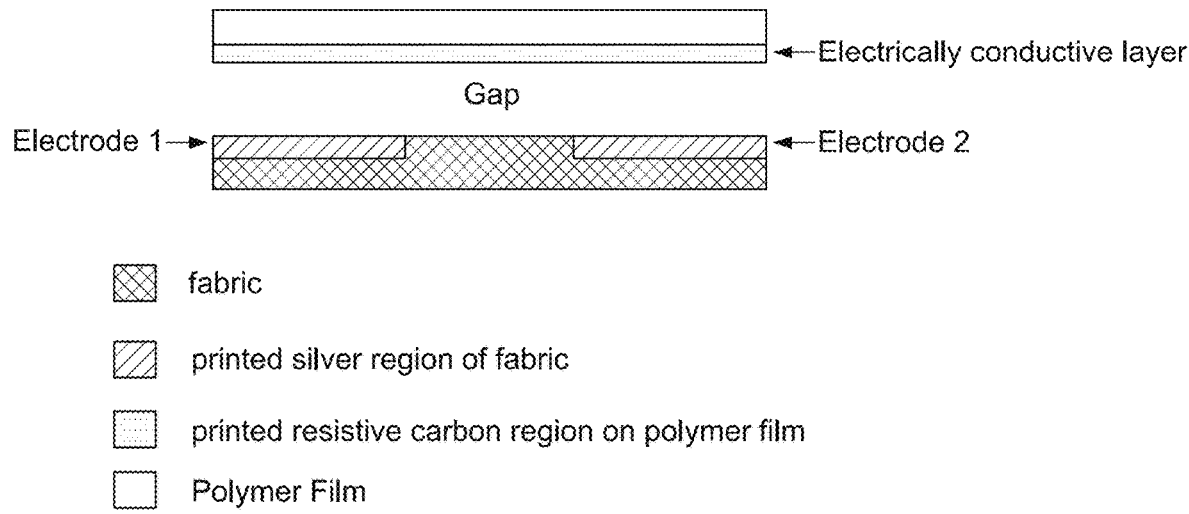
FIG. 26A illustrates a schematic diagram of a cross-section of a force sensor of the present disclosure.
Figure 26B:
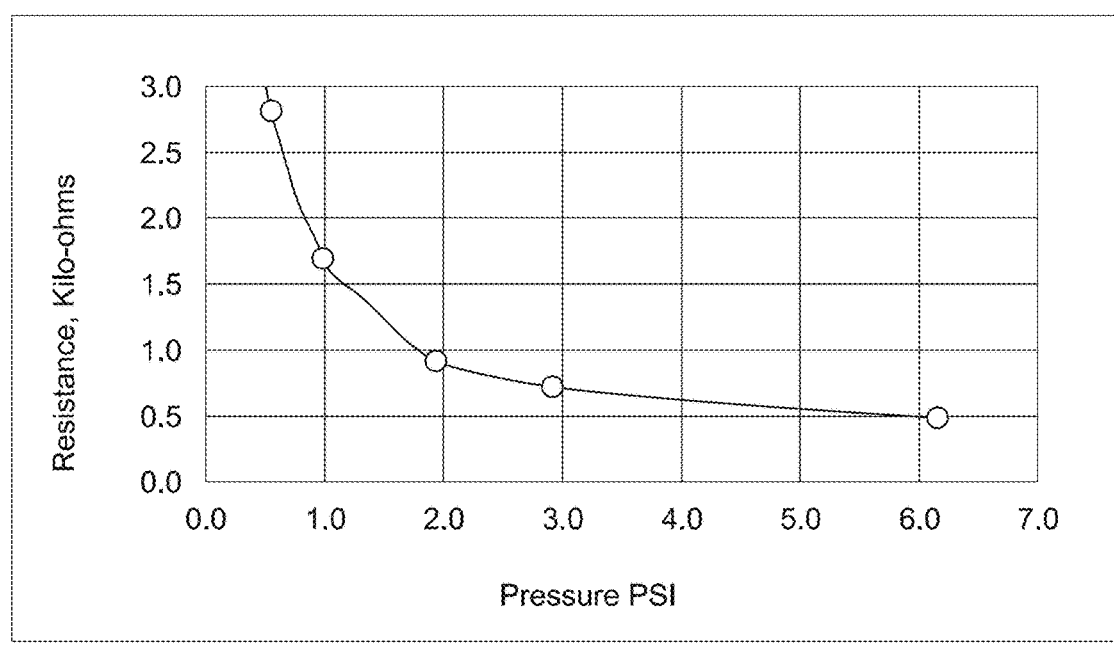
FIG. 26B is a graph showing the electrical resistance as a function of normal force exerted on the sensor elements of a force sensor as configured in FIG. 26A.
Figure 27A:
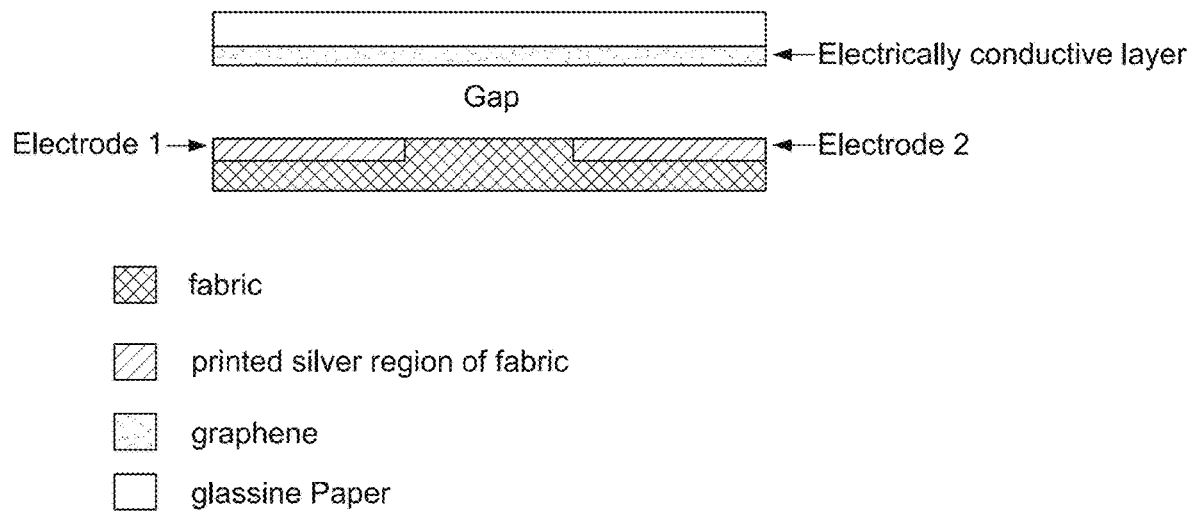
FIG. 27A illustrates a schematic diagram of a cross-section of a force sensor of the present disclosure.
Figure 27B:
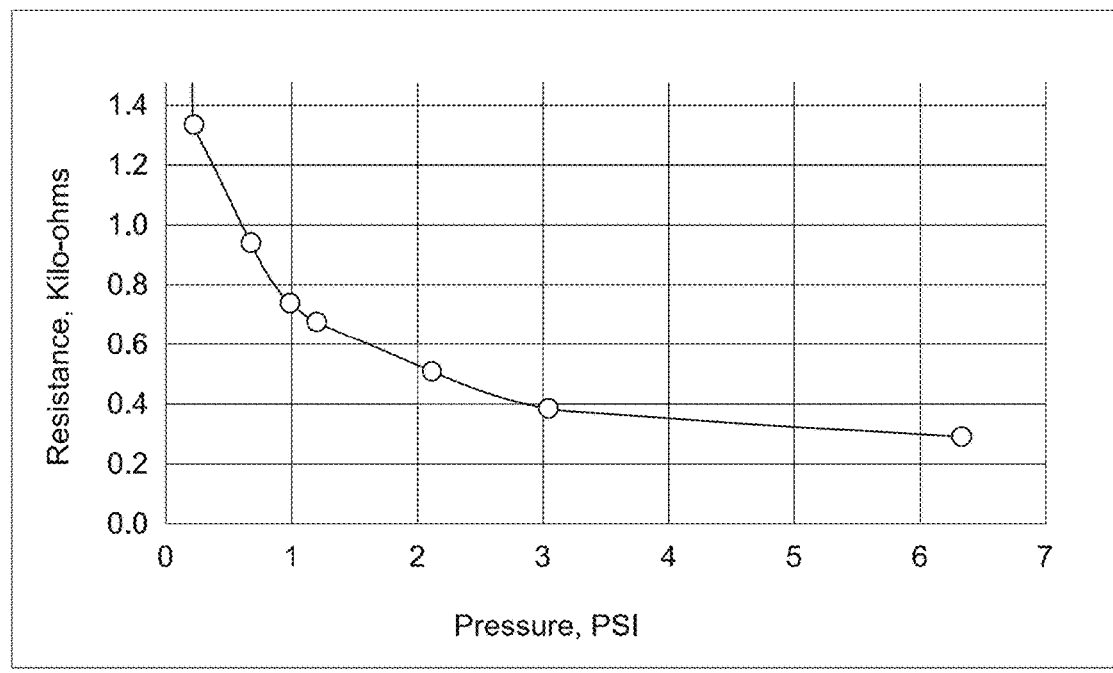
FIG. 27B is a graph showing the electrical resistance as a function of normal force exerted on the sensor elements of a force sensor as configured in FIG. 27A.

The conductive layer and electrode layer may each be printed directly onto a flexible substrate. Accordingly, the electrode layer may comprise first and second electrodes interdigitally printed on a flexible substrate using a particle-free conductive metal ink, and the conductive layer may be printed on a flexible polymer film (FIG. 26A) or glassine paper (FIG. 27A) using a conductive carbon-based ink. Exemplary performance data for each of these latter examples are shown in FIGS. 26B and 27B respectively.

While various examples of the present force sensors are described as including one or more conductive layers printed with any of the molecular inks disclosed herein, or with a carbon-based ink, other conductive materials may be used and are within the scope of the present invention. For example, the at least one conductive layer may be printed with the presently disclosed molecular ink, a resistive carbon-based ink, a conductive paint, indium tin oxide (ITO), or a combination thereof, or may comprise any of a poly(3, 4-ethylenedioxythiophene) polystyrene sulfonate (PEDOT: PSS), a carbon nanotube-based thin film (CNT), a carbon-loaded thermoplastic polymer, carbon-loaded silicone, carbon-loaded polymeric foil, velostat, or any combination thereof, wherein specific selection of the material may provide different force resistance responses.

The force sensors disclosed herein include use of a particle-free conductive metal ink that conformally coats the fibers of the flexible substrate, thus providing excellent flexibility for the force sensors on the present disclosure. As such, the at least one electrode printed with these inks may demonstrate a resistance of less than 10Ω/□.

Moreover, the methods used to print the particle-free conductive metal inks provides conductive traces having an ink bleed of less than 0.6 mm, such as less than 0.5 mm, or less than 0.4 mm, or less than 0.3 mm, or even less than 0.2 mm. As such, these force sensors may be designed to be very small and may be positionable in a wide range of flexible electronics.

Exemplary uses of the present disclosure include: devices for measuring or controlling force, devices for sensing/measuring impact, measuring blood pressure and similar diagnostics, measuring muscular strength, seat or bed occupant detection, electrical switches, robot feedback/control, tactile sensing/signaling, tactile feedback, monitoring patient respiration, bed/body pressure (bed sore prevention), bandage pressure monitor, pressure from foot or show monitoring, or sensor arrays for force mapping.

Figure 28:
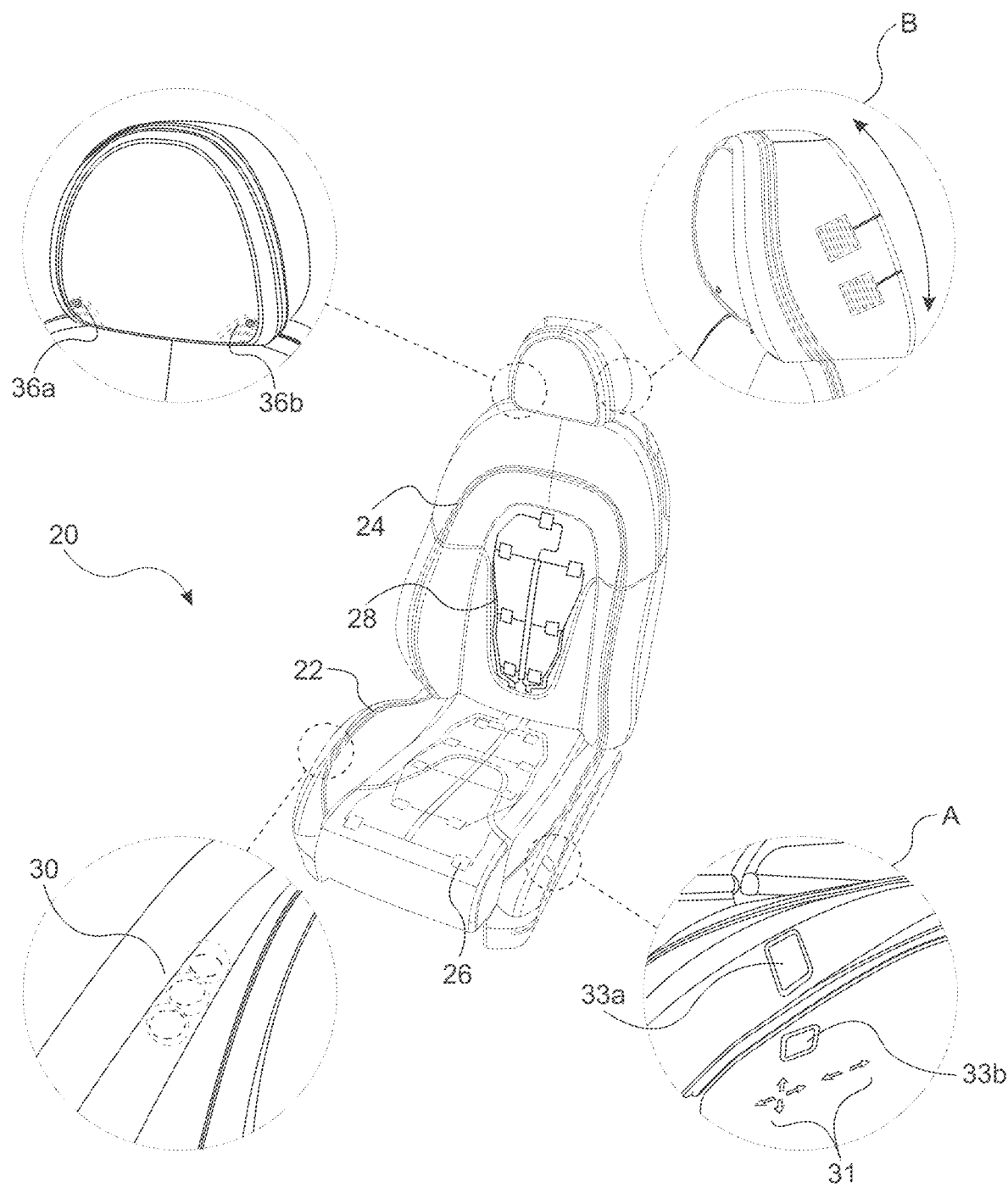
FIG. 28 illustrates a schematic diagram of an automobile seat having integrated force sensors and heating elements to provide force sensor controlled conductive heating of the present disclosure.
Figure 29A:
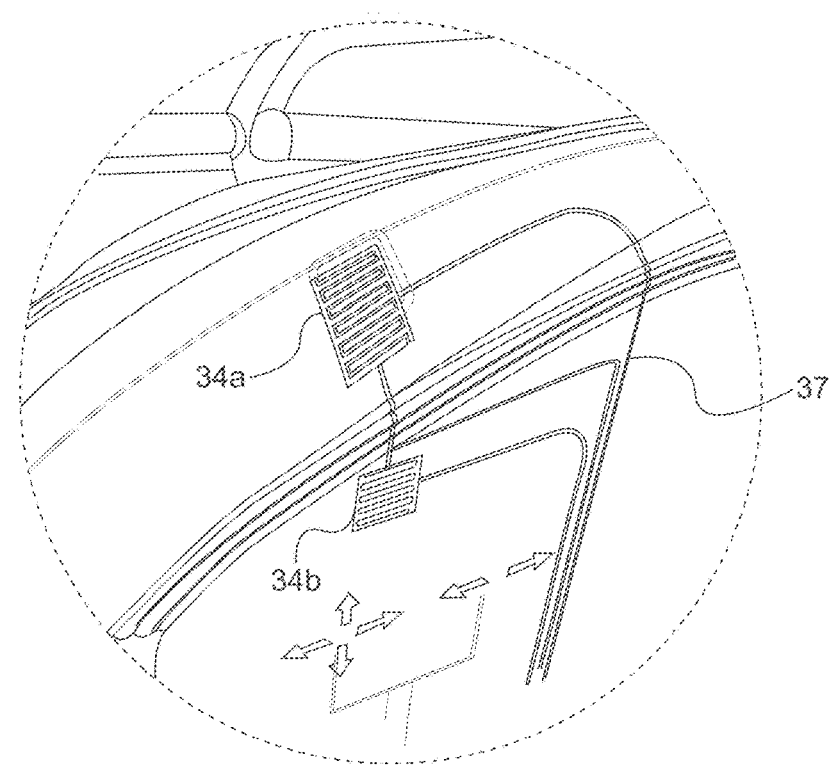
Figure 29B:
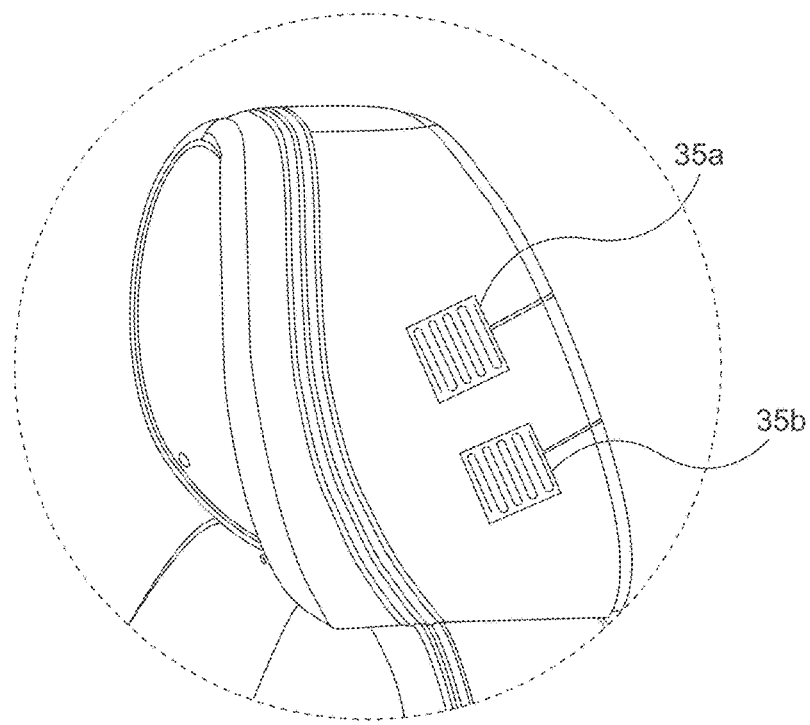

For example, the flexible force sensor may be printed on a flexible substrate or textile that will be configured as a seat cover for a car seat (see FIG. 28). As such, the flexible force sensor 26 may sense whether a person is seated in that particular seat, i.e., by compression of the conductive and electrode layers of the force sensor, and may adjust certain systems of the car accordingly, e.g., enabling the air bag system, activation or deactivation of heaters within a seat, and the like. Such signals may be sent along a control circuitry 28 to other systems in the car seat or in the automobile. In one example, the force sensors 26 may be positioned at an edge of a seat (see exploded view in A) and may allow a user to adjust a position of the seat base 22 and/or back 24. See for example exemplary positions of force sensors 33a and 33b on a side of a car seat. An exploded view of sensors shown in section B of FIG. 28, showing the conductive traces and connecting circuitry of the force sensors 33a and 33b printed on an underside of the flexible textile of the car seat is shown in FIG. 29A. Also shown is the control circuitry 37 for force sensors 33a,b that may communicate forces applied thereon to a transceiver and/or controller (see FIG. 32), so that desired motions of the seat may be initiated (i.e., move the seat base up/down or forward/backward; move the seat back forward/backward; etc.).

The flexible force sensor may be set to detect particular weights or forces, such as of a weight of a passenger or driver when positioned in the car seat. For example, the sensor may be calibrated to detect when a person or object is under the requisite weight associated with airbag deployment and adjust the car's system accordingly. Multiple sensors may be used in a seat back to determine a height and/or weight of a person in the car seat, and may pre-adjust systems of the car automatically, e.g., seat position, mirror positions, and the like. A combination of sensors may be used to determine characteristics of a specific individual (passenger or driver), and systems of the car may be set to correspond to that individual (passenger or driver recognition) so that later entry to the car may reset those systems to correspond to that individual's preferences. See for example FIG. 31.

Force Sensor Controlled Resistive Heater

It is well known nowadays to equip automotive vehicles with comfort related functional components such as heaters for seating area heating, backrest heating, arm-rest heating, steering wheel heating, gearshift lever heating, or heating of other interior surface areas, additional lighting, and positional controls for the seating area, headrest, and even steering wheel. Seat heaters, for example, use electrode elements arranged in the vehicle in close vicinity to the occupant within the passenger compartment. Usually these electrode elements, such as seat heating mats, are arranged into the seating surface of the occupant seat in contact with or proximate to the occupant, such as in the seat surface area, the seat backrest, an armrest, and/or the steering wheel or gearshift lever. In order to hide the electrode elements for the occupant, the electrode elements are normally arranged below a seat trim, below a covering, or below other surfaces delimiting the vehicle passenger compartment.

These electronic elements should not impair the comfort of the passenger, i.e., it is important that the electrode elements cannot be sensed below the trim or covering by the passenger. Moreover, such electrode elements would also need to be highly flexible and, especially if integrated into a surface such as a seating surface of a vehicle seat, highly permeable to air and humidity.

The presently disclosed inks and methods for printing these inks to form conductive traces, and thus electronic elements printed directly on a flexible substrate, such as a breathable textile, offer the flexibility and manufacturing ease needed to provide such elements hidden from the user. These inks, when deposited and cured, do not affect fabric feel and flexibility. Accordingly, the present disclosure provides force sensors, resistive heaters, and combinations of such elements, that fulfill the above-mentioned requirements.

Figure 34:
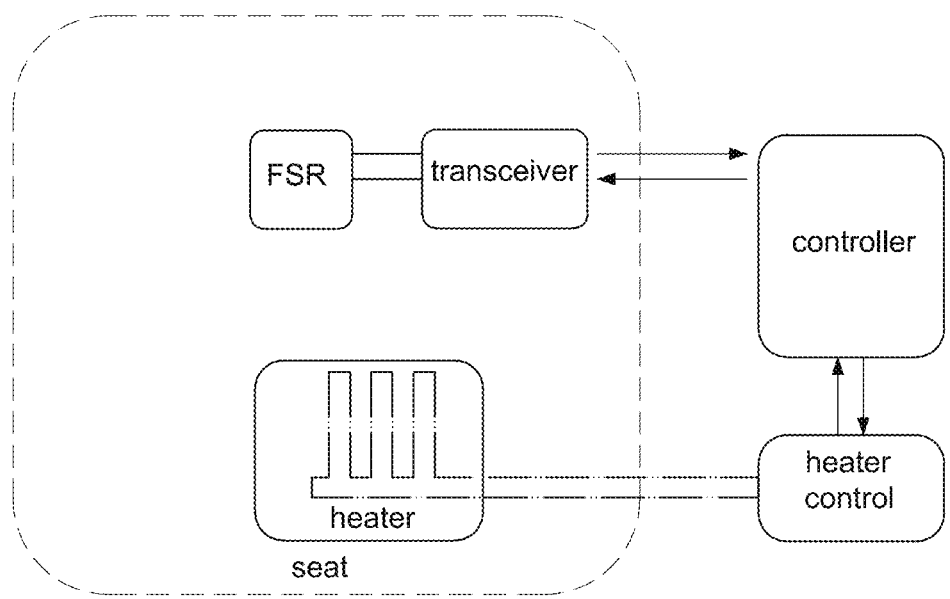
FIG. 34 illustrates a configuration for force sensor control of a seat heater according to aspects of the present disclosure.

Specifically, and with reference to FIG. 34, the present disclosure provides a device comprising force sensitive resistors in addition to one or more resistive heaters. These two components may be combined to provide a device for sensor control of a resistive heater, wherein the device generally comprises at least one heating layer including a resistive heater, such as any of the resistive heaters disclosed herein, at least one sensing element including a force sensor, such as any of the force sensors disclosed herein, and electronic elements configured relay power to the resistive heater and sense contact with the force sensor.

The device may further include a controller configured to receive electrical signals from the various sensing element(s), and responsive of these signals, send control signals to the resistive heater. In this way, individual forces on the sensing element(s) may provide feedback to the controller that may provide fine-tuned control of the heating element(s). For example, should a user manually turn on a heater but not be positioned in the seat, the controller may register the signals from the individual force sensors (or lack thereof) and turn the heater off, such as via communication with a heater controller (see FIG. 34). Should a user shift in a seat so that contact is no longer made with a back portion of the seat, as sensed by at least one of the force sensors, the controller may turn off the heater in the back portion of the seat. Such control may provide means to conserve battery use, an aspect that is especially relevant in electric vehicles, wherein the motor is powered by a battery.

FIG. 28 illustrates one exemplary arrangement of elements that provide sensor controlled responsive elements, such as resistive heaters, lighting, and even motors that enable movement. For example, an exemplary car seat 20 may include a force sensor controlled resistive heater. The resistive heater generally comprises a first flexible substrate, such as a textile covering on a seat base 22 and/or seat back 24, having at least one conductive pattern printed thereon with a first molecular ink. The conductive pattern is configured to carry a current and generate heat. The resistive heater may further include at least one bus printed with the first molecular ink or another of the molecular inks disclosed herein, wherein the bus is electrically connected to the at least one conductive pattern and configured to provide connection to a power source.

The resistive heater may be controlled, i.e., powered on, off, or powered at varied levels, based on signals sent from the various force sensors 26. As indicated herein, a force sensor 26 generally comprises an electrode layer having at least one electrode printed on a second flexible substrate with a second molecular ink, and separated from a conductive layer by a gap having a separation distance, wherein the flexible force sensor is configured to initiate an electrical signal upon compression of the electrode and conductive layers in a direction perpendicular to a longitudinal extent of the force sensor (see at least FIGS. 19A, 20A, 21, 22, 23A, 24, 26A, 27A).

The force sensor further includes a control circuitry 28 connected to the at least one electrode of the force sensor and configured to carry the electrical signal from the force sensor to a communications device. The communications device may be part of the seat, such that the signals may be carried over conductive traces printed with the inks and methods of the present disclosure or may be carried over wired connections. Alternatively, the signals may be communicated to components external to the seat via wired or wireless communication paths.

The communication of signals from the force sensor elements 26, i.e., electrical signal indicating a change in resistance at the force sensor element such as when the various layers of the sensor element are compressed, may be communicated to control supply of power from a power source to the resistive heater. For example, a resistive heater in the car seat base and/or back may be deactivated (e.g., turned off) when the force sensor fails to detect a person seated in the car seat (see force sensors 26a and control circuitry 28a in car seat base of FIG. 30). The resistive heater in the car seat back may be deactivated when the force sensor fails to detect a person contacting the back of the car seat (see force sensors 26a and control circuitry 28a in car seat base of FIG. 30). The resistive heater in the car seat base and/or back may be deactivated when an exterior temperature is above a setpoint, such as above 80° C., even if the force sensor detects a person is in the car seat (e.g., avoid accidental activation of seat heaters). The resistive heater in the car seat base and/or back may be automatically activated (e.g., turned on or up) when the force sensor detects a person in the car seat and the exterior temperature falls below a setpoint (e.g., below 50° C., or below 32° C.). Similarly, a resistive heater in a steering wheel or gear shift cover may be activated or deactivated as described above for the car seat based on these signals from the force sensors in the car seat.

The resistive heater may be controlled based on additional sensors, such as one or more thermistors in the car seat configured to detect a temperature of contact points of a person seated in the car seat. See for example the contact points in the base 29a and back 29b of the car seat 20 in FIG. 31, wherein a person seated in the seat may activate the systems of the seat, such as the seat heater and/or temperature of the heater, etc. For example, in addition to the force sensors 26 discussed above, the seat may additionally include thermistors that detect and approximate a temperature of the seat and/or a person in the seat. Information from the force sensors and/or thermistors may be transmitted 43/44 to a console 42, where a user may select specific actions based on that information, such as achieving a specific temperature setpoint or raising/lowering the seat temperature. Such a configuration may be useful to avoid automatic heating of a heavy object placed in the car seat (i.e., not allow activation of automatic heating features of a seat when a person is not seated), and/or may increase or decrease a temperature of the seat by supplying additional or less power to the resistive heater that is positioned in the seat. This may be useful for reducing the temperature of the seat after it has heated so that the person in the seat remains comfortable, or to maintain a specific setpoint temperature of the seat, such as a user preferred temperature setpoint (e.g., set at a console 42 of the automobile).

Indicator lights 30 may be included on the car seat, such as on a side of the seat base, as shown in FIG. 28, that may indicate that the heater is activated (e.g., by illumination of at least one light) and a temperature level (e.g., high, medium, low by illumination of respective first, second, and third lights).

Figure 30:
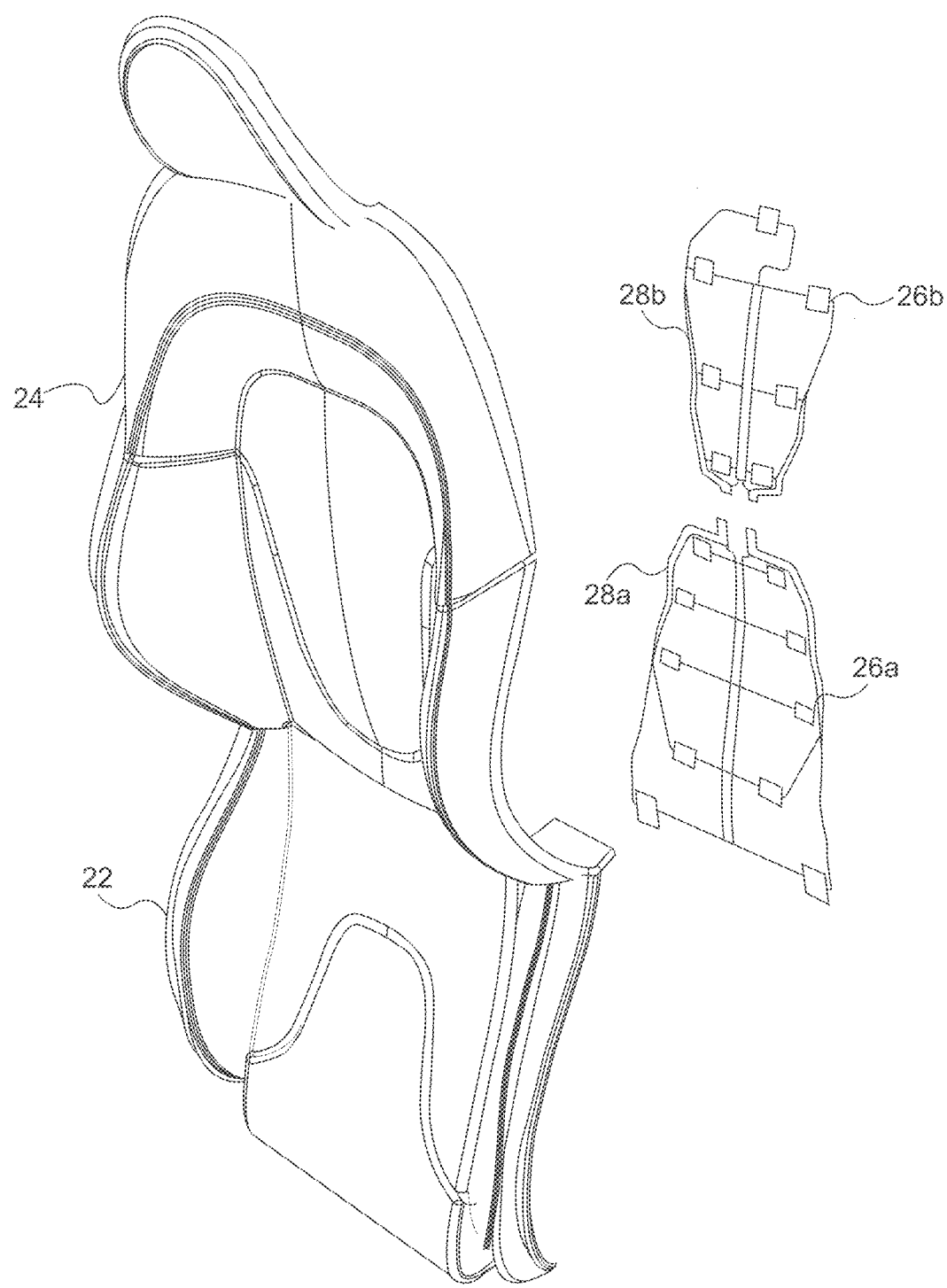
FIG. 30 illustrates exemplary positions of sensors and electrical connections in a car seat according to aspects of the present disclosure.

Moreover, as shown in FIG. 30, positioning a plurality of force sensors (26a, 26b) within a base and back of a car seat may provide feedback on a weight and/or height of a person seated thereon. Such information may be communicated to a controller (e.g., 42 of FIG. 31), and may allow systems of the car to be automatically adjusted, e.g., seat position, mirror positions, and the like, based on detected characteristics and/or on determine characteristics of a specific individual (passenger or driver).

Additional Flexible Printed Electronic Elements

Figure 14:
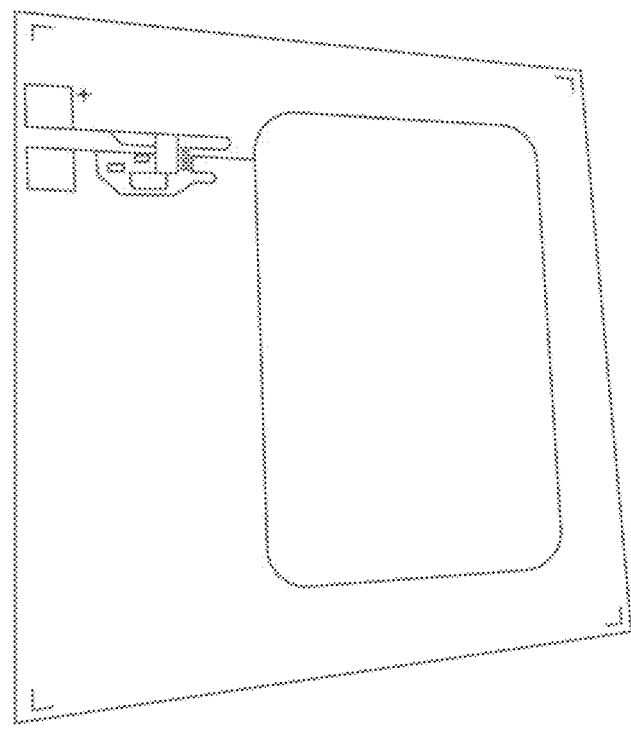
FIG. 14 shows a picture of a flexible electronic proximity sensor printed using inks and methods in accordance with certain aspects of the present disclosure.

The present disclosure is also directed to additional electronic elements or components printed on flexible substrates, such as textiles (e-textiles) or polymeric films having printed thereon at least one conductive trace or pattern using inks and/or methods disclosed herein. The traces may terminate in contact pads or connectors for connection to a current, such as a power supply or battery. Various hardware elements may be connected to portions of the trace or pattern to form electric devices. As such, the conductive patterns on the flexible substrates may be formed as a trace or pattern that may provide a sensor (e.g., optical, thermal, humidity, gas, pressure, acceleration, strain, force, and proximity), a conductor, an electrode, a circuit, an interconnect, a light, an antenna, a resistive heating element, a switch, a transparent conductive element, a battery, or any combination thereof. An exemplary flexible electronic comprising a proximity sensor according to the present disclosure is shown in FIG. 14. Such a proximity sensor 34 may be included, for example, in an automobile as shown in FIG. 28, section B. For instance, the conductive traces of the proximity sensor (see 35a, 35b of FIG. 29C) may be printed on an underside of the textile of a headrest of a car seat and may be configured to detect motion, such as the motion of a person's hand. The sensor may be configured to activate or deactivate motors upon detection of specific motions, such as activate motors that raise or lower the head rest (e.g., swipe up to move the headrest upward and swipe down to move the headrest down).

The flexible electronics, e.g., e-textiles, may be incorporated into or may be wearable electronic devices. The flexible electronics may find use in many different industries for a wide range of uses, such as in the medical industry for health monitoring or as anti-microbial dressings, and in industrial settings as smart clothing or devices for gas sensing or filtration. The flexible electronics may find use in smart garments, such as for fitness monitoring, hygiene improvement, or as flexible energy storage devices (e.g., batteries, supercapacitors).

Figure 31:
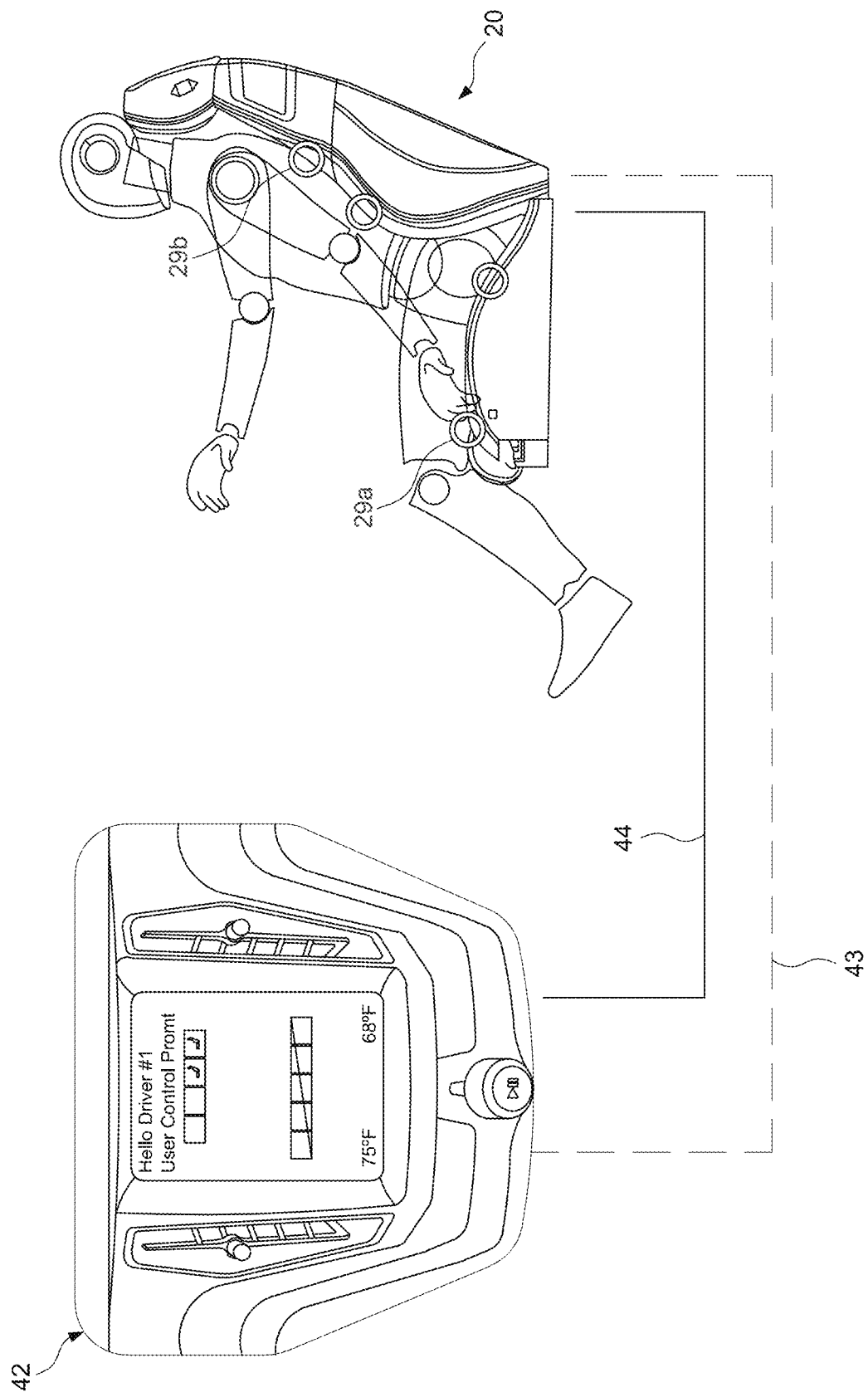
FIG. 31 illustrates communication between a controller in a console of an automobile and force sensors and/or heating elements in a car seat according to aspects of the present disclosure.

Also shown in FIG. 28 are lights included in the headrest (e.g., LED lights 36a, 36b). Such lights may be electrically connected by conductive traces printed using inks and methods of the present disclosure or may comprise traditional wired connections. These lights may be controlled by proximity sensors, such as shown in FIG. 14 and discussed hereinabove, and/or by capacitive touch sensors printed using the inks and methods of the present disclosure, and/or by communications from a controller in a console 42 of an automobile (FIG. 31).

Further exemplary flexible electronics may include, for example, a directional compass, one or more gyroscopes, one or more accelerometers, pressure gauges, strain gauges, temperature gauges, and fiber optics. The sensors employed in such flexible electronics may be used to monitor parameters of a user wearing the flexible electronic device, such parameters may include heart rate, respiration rate, skin temperature, and body position and movement. Moreover, flexible electronics may be used to measure a user's full-body biomechanics such as joint angles, angular velocity, angular acceleration, and range of motion.

These flexible electronics are found to have greatly improved wear performance, e.g., bendability, washability, strain resistance, etc., over flexible electronics formed using the inks and methods of the prior art. For example, the conductive patterns on a fabric substrate may withstand at least 50 wash cycles, such as at least 70 wash cycles, or even 100 wash cycles with air drying (see FIG. 11 and examples). For example, the resistance of the conductive traces formed using the inks and methods of the present disclosure may increase only slightly after multiple wash cycles, such as by less than 50% after 50 washes, or less than 30% after 50 washes, or less than 15% after 50 washes, or less than 70% after 100 washes, or less than 60% after 100 washes, or less than 40% after 100 washes, or less than 30% after 100 washes, or less than 20% after 100 washes, wherein a wash cycle is defined as in according to AATCC 61-2013 (laundering). As shown in FIG. 11, the protective coating may improve the washability of the flexible electronics disclosed herein.

The flexible electronics may be abrasion resistant (up to 500 cycles by standard ASTM testing methods) and may be sweat resistant (moisture resistant).

The flexible electronics may be strain resistant. For example, knit e-textiles may be stretched by up to 50%, or up to 100%, without connection loss, generally showing a small increase in conductivity with an increase in stretching of the textile substrate (see FIG. 12 and examples).

Figure 13:
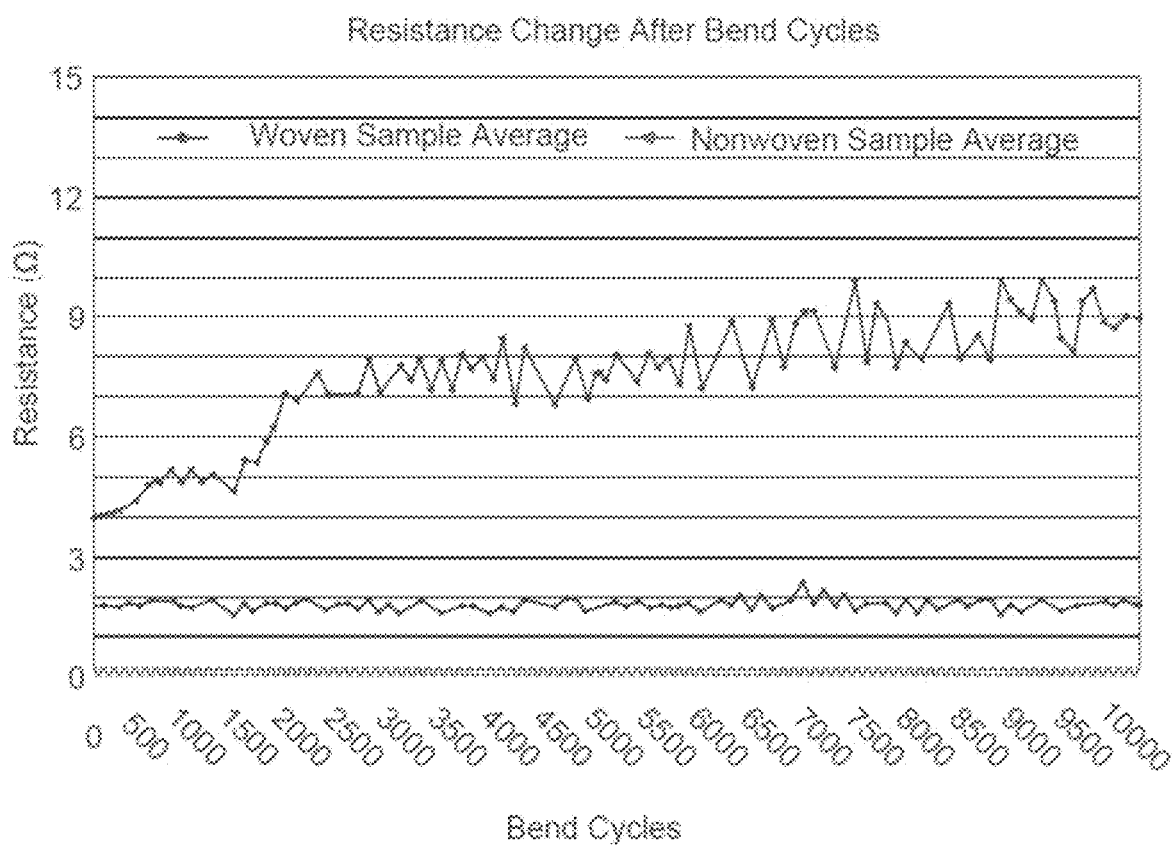
FIG. 13 shows a graph of the change in resistance with increased bending cycles for a conductive trace on a textile using inks and methods in accordance with certain aspects of the present disclosure.

The flexible electronics may be bendable, showing less than a 10% loss in conductivity after up to 10,000 bend cycles using standard ASTM testing methods (see FIG. 13).

While specific embodiments of the disclosure have been described in detail, it should be appreciated by those skilled in the art that various modifications and alternations and applications could be developed in light of the overall teachings of the disclosure. Accordingly, the particular arrangements, systems, apparatuses, and methods disclosed are meant to be illustrative only and not limiting as to the scope of the disclosure.

EXAMPLES

Production of a Molecular Ink

Exemplary molecular inks comprising silver complexes comprising a carboxylate second ligand (e.g., silver carboxylate) may be formed by reaction of a metal oxide or metal-acetate and a carboxylic acid in a reaction that affords analytically pure compounds and proceeds in quantitative yields.

As example, silver acetate was reacted with a carboxylic acid (isobutyrate and cyclopropate). The elemental analysis of the two silver complexes were C, 24.59; H, 3.72 and C, 24.68; H, 2.56 for the isobutyrate and cyclopropate, respectively. Theoretical values are C, 24.64; H, 3.62 and C, 24.90; H, 2.61 for the isobutyrate and cyclopropate, respectively.

The metal-second ligand salt was then reacted with an excess of the first ligand to form the metal complex. In a typical preparation, silver isobutyrate was prepared as described above, and placed in a 25 mL one-neck 14/20 round bottom flask containing a Teflon coated magnetic stir bar. To this was added 13 eq. ethylenediamine (amounts as shown in Table 1 below). The reaction proceeded for 2 h at room temperature with stirring, filtered to remove any particulates, and the unreacted ethylenediamine was removed by rotary evaporation at 40° C. to yield a white powder. Additional wash steps can be included. The isolated metal complex-ethylenediamine silver isobutyrate—was then dissolved to at least 100 mg/ml in a mixture of polar protic solvents (water, propylene glycol, and isopropanol) to form a molecular ink that is clear (see Table 2).

TABLE 1

| Diamine Amount (ethylenediamine) | Silver (I) Carboxylate Amount (silver isobutyrate) | Yield |
|---|---|---|
| 184 g, 3059 mmol, 13 equiv. | 46 g, 235 mmol, 1 equiv. | 59 g (99%) |

TABLE 2

| Isolated Metal Complex | Water | Propylene glycol | Isopropanol |
|---|---|---|---|
| 2.20 g (30%) | 3.08 g (42%) | 0.77 g (11%) | 1.25 g (17%) |

Purity of the Metal Complex

Preparation of the metal complexes was found to require an excess of the first ligand reactant with the metal-second ligand (see table above; 13-fold excess second ligand used to produce the metal complex). As example, most silver (I) carboxylates are insoluble in most conventional solvents. A 1:1 reaction (1:1 silver isobutyrate:ethylenediamine) gave a dark colored product with a large amount of insoluble material, presumably unreacted silver (I) isobutyrate, when formulated in a polar protic solvent system. Thus, the metal complexes formed by the 1:1 reaction likely failed to promote complete conversion of all reactants to products and failed to form continuous conductive films on a substrate.

A 1:6 reaction (1:6 silver isobutyrate:ethylenediamine), on the other hand, formed crystals spontaneously from a filtered solution of the reaction. Moreover, while the metal complex did dissolve in the polar protic solvent system, the presence of excess unreacted diamine was found to have a significant impact on the density, viscosity, and surface tension of the ink formulations. The 1:6 product formulated as an ink shows poor sheet coverage and extremely high sheet resistance (>600,000Ω/□).

The 1:13 reaction product listed in the table above, which was purified to remove excess unreacted amine (first ligand), showed excellent sheet coverage and demonstrated a sheet resistance of less than 1Ω/□. The purified product, dissolved in a polar protic solvent system as shown in Table 2, showed a density of 1.12 g/mL, a viscosity of 8.55 cps, and a surface tension of 22.9 dyne/cm.

Accordingly, an important step in producing the molecular inks of the present disclosure is removal of any unreacted second ligand, especially in view of the large excess used to formulate the final metal complex. When purified as detailed above, the product (yield 99%) is colorless. Unpurified products, however, tend to be dark colored, which is likely associated with normal darkening of diamines when exposed to open air. In general, amines absorb moisture and carbon dioxide resulting in formation of unstable carbamates. Such speciation of amines may destabilize diaminosilver (I) carboxylates, which often results in premature silver metallization, dark coloration and particle formation. Hence, removal of any residual amines is important to promote stability of diaminosilver (I) carboxylates, especially if concomitant preparation of zero-particulate diaminosilver (I) carboxylate compositions is required.

Stoichiometric Ratio of Ligands and Metal in the Metal Complex

Figure 9:
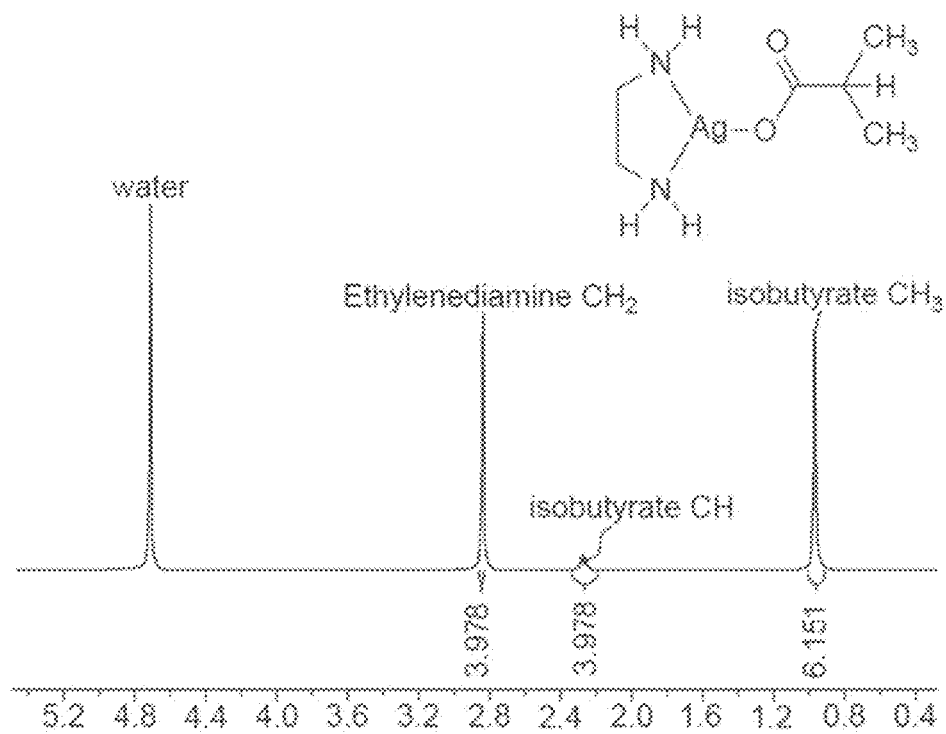
FIG. 9 shows a proton nuclear magnetic resonance ($^1$H-NMR) scan of an exemplary metal complex (ethylenediaminosilver(I) isobutyrate in $D_2O$) of the present disclosure, and (upper right) the structure of an exemplary metal complex of a molecular ink of the present disclosure.

The metal complex was found to comprise stoichiometric amounts of the first and second ligands and the metal. Structural analysis using proton NMR showed that the ethylenediamine silver isobutyrate powder dissolved in $D_2O$ consists of stoichiometric amounts of the ethylenediamine ligand coordinated to silver isobutyrate. A $^1$H-NMR spectrum of the metal complex in $D_2O$ (see FIG. 9; $^1$H-NMR scan on a Bruker AV-360 spectrometer) showed the expected three proton-carbon (CH) peaks: 1 for the two ethylenediamine $CH_2$ groups (4 protons total), 1 for the single isobutyrate CH group (1 proton), and 1 for the two isobutyrate $CH_3$ groups (6 protons total). These were assigned as: 0.93 ppm isobutyrate $CH_3$, 2.25 ppm isobutyrate CH, and 2.81 ppm ethylenediamine $CH_2$. The proton integral ratio of 3.978 ethylenediamine $CH_2$:0.928 isobutyrate CH:6.151 isobutyrate $CH_3$ is consistent with 1 ethylenediamine:1 silver isobutyrate, or stoichiometric amounts of the metal, and each of the ethylenediamine and isobutyrate ligands.

Figure 10:
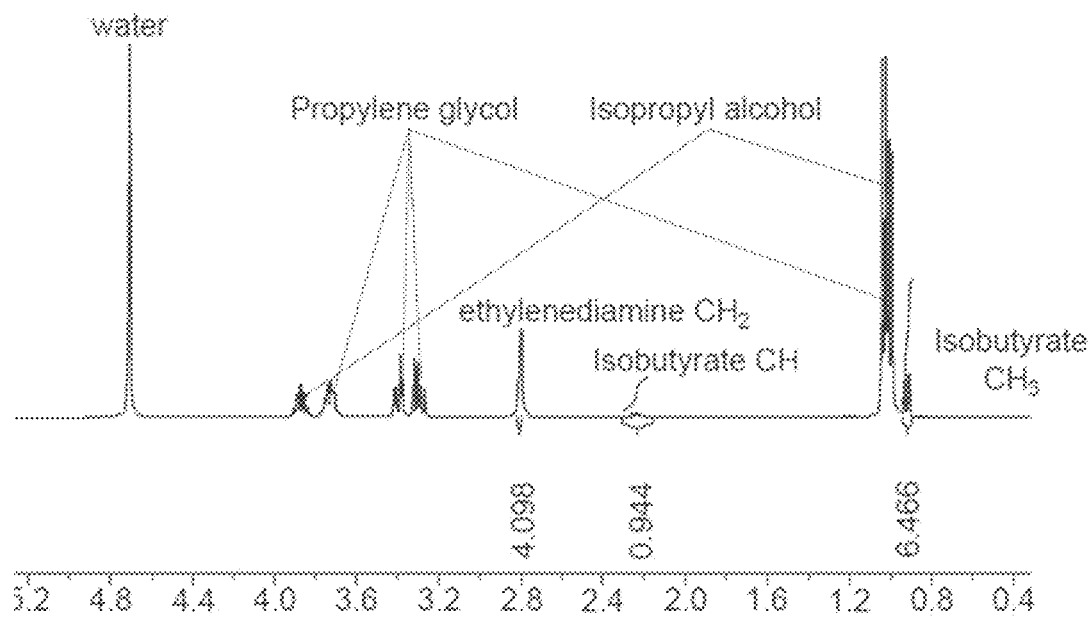
FIG. 10 shows a proton nuclear magnetic resonance ($^1$H-NMR) scan of an exemplary molecular ink comprising a particle free solution of a metal complex dissolved in a solvent (ethylenediaminosilver(I) isobutyrate dissolved in polar protic solvents and in $D_2O$) of the present disclosure.

In order to verify that the metal complex, when dissolved in two or more polar protic solvents to form the ink, maintains a stoichiometric ratio of the first and second ligands and the metal, further $^1$H-NMR experiments were performed for the metal complex dissolved in a mixture of three polar protic solvents as listed above (water, propylene glycol, isopropanol), and $D_2O$. The spectra in FIG. 10 shows well-resolved peaks for the various polar protic solvents as well as the metal complex (ethylenediamine silver (I) isobutyrate), which are assigned as: 0.93 ppm (doublet, isobutyrate $CH_3$), 2.25 ppm (septet, isobutyrate CH), and 2.81 ppm (singlet, ethylenediamine $CH_2$).

The strong similarity between the chemical shifts of the metal complex in the NMR solvent (FIG. 9) and in the composition comprising the metal complex and two or more polar protic solvents (FIG. 10) suggests excellent compatibility between the metal complex and the polar protic solvent system. The ethylenediamine silver (I) isobutyrate proton ratios of 4.098 ethylenediamine $CH_2$: 0.944 isobutyrate CH: 6.446 isobutyrate $CH_3$ are in good agreement with theoretical ratios of 4 ethylenediamine $CH_2$:1 isobutyrate CH: 6 isobutyrate $CH_3$; which demonstrates that dissolving the metal complex in a polar protic solvent carrier does not impact the coordination environment around the metal (i.e., silver). This result further corroborates the fact that the chemical composition of the metal complex remains unchanged when dissolved to form the ink composition (i.e., stoichiometry remains unchanged).

Formulation of Molecular Inks

Various polar protic solvent systems were tested to demonstrate the flexibility of the solvent choice for formulation of the molecular inks of the present disclosure (see Tables 3 and 4 below). For example, a diamine silver (I) isobutyrate complex was formulated in solvent systems comprising at least two polar protic solvents. Representative ink formulations using different combinations of polar protic solvents, and data showing that the ink formulations produce continuous, highly conductive films (sheet resistance of 0.04-0.09Ω/□) when formulated in the polar protic solvents are shown in Tables 3 and 4.

TABLE 3

Metal Complex Formulated in Polar Protic Solvent Systems

| composition | metal complex | water | Glycol ethylene glycol | Glycol propylene glycol | Glycol ether (dowanol) | Alcohol ethanol | Alcohol isopropanol |
|---|---|---|---|---|---|---|---|
| A | 2.20 g | 3.08 g | — | 0.77 g | — | — | 1.25 g |
| B | 2.01 g | — | — | 0.77 g | — | — | 4.25 g |
| C | 2.03 g | 4.27 g | — | 0.78 g | — | — | — |
| D | 2.03 g | 4.26 g | 0.75 g | — | — | — | — |
| E | 2.00 g | 3.00 g | — | 0.27 g | — | — | 1.75 g |
| F | 2.01 g | 3.07 g | — | 0.13 g | — | — | 1.91 g |
| G | 2.00 g | 3.06 g | — | 1.5 g | — | — | 0.51 g |
| H | 2.00 g | 3.02 g | 0.75 g | — | — | — | 1.26 g |
| I | 2.02 g | 3.03 g | — | 0.76 g | — | 1.26 g | — |
| J | 2.04 g | 3.03 g | — | 0.76 g | 1.26 g | — | — |
| K | 2.09 g | 3.01 g | — | 0.51 g | 0.76 g | — | 0.76 g |

TABLE 4

| composition | Density (g/mL) | Viscosity (cP) | Surface Tension (dyne/cm) | Sheet Resistance (Ω/□) |
|---|---|---|---|---|
| A | 1.12 | 8.55 | 22.9 | 0.05 |
| B | 0.937 | 10.8 | 23.3 | 0.04 |
| C | 1.15 | 4.60 | 25.3 | 0.08 |
| D | 1.15 | 3.77 | 24.7 | 0.08-0.09 |
| E | 1.09 | 6.99 | 23.6 | 0.06 |
| F | 1.08 | 6.71 | 22.7 | 0.06 |
| G | 1.14 | 8.83 | 23.3 | 0.05 |
| H | 1.11 | 7.02 | 23.5 | 0.08 |
| I | 1.11 | 21.3 | 23.8 | 0.06 |
| J | 1.14 | 8.25 | 23.5 | 0.9-01 |
| K | 1.12 | 8.21 | 22.7 | 005-0.06 |

Molecular Inks Comprising Two Different Metal Complexes

A molecular ink comprising two different metal complexes was formed, with the goal to provide a molecular ink that provides tunable resistivity of cured films formed therefrom. For example, a molecular ink comprising soluble silver complex and copper complex was formulated in a polar protic solvent system. The use of soluble metal complexes, i.e., metal complexes that provide molecular inks absent particles, circumvents agglomeration and settling issues related to commercial resistive inks based on particle dispersion, i.e., carbon, graphite, graphene. This provides a more reliable, robust manufacturing process since ink instability can lead to production down-time due to nozzle blockage, cause inconsistent or poor-quality prints, and potentially requiring replacement of a high-cost print-head.

The present inventors have found that the resistivity of the mixed metal complex molecular ink may be tunable by adjusting the ratio of two metal complexes. An exemplary mixed metal complex molecular ink according to the present disclosure comprises a silver complex and a copper complex, such as a silver diamine carboxylate complex and a copper diamine carboxylate complex. According to certain aspects, the copper diamine carboxylate may be formed in situ from a copper carboxylate and diamine solvent. Using molecular inks comprising varied ratios of silver complex to copper complex to print a substrate, a gradient of resistivity, or different patterns of resistivity may be formed. For example, a heating device printed with molecular inks having a gradient of resistivity may form a gradient heat flux.

Figure 36:
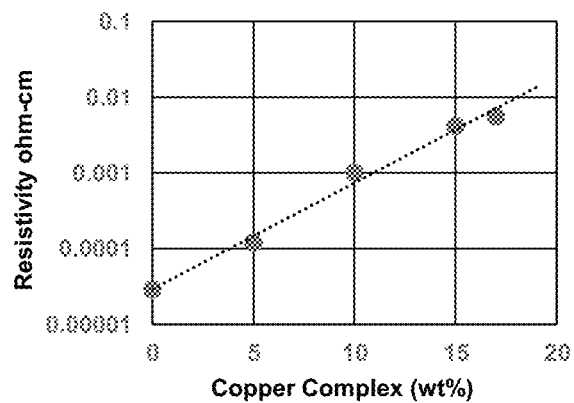
FIG. 36 shows a graph of resistivity for molecular inks comprising varied ratios of silver and copper complexes.

As shown in FIG. 36, the molecular ink comprising both silver complexes and copper complexes shows an exponential correlation between resistivity of a cured film and the weight percent copper complex relative to the total weight of the two metal complexes, e.g., silver complex and copper complex. The mixed metal complex molecular ink shown in FIG. 36 comprise mixtures of silver diamine oxalate and copper diamine carboxylate that are printed on a Melinex ST505 polymer substrate using methods of the present disclosure and cured at 140° C. for 30 minutes. By blending the two metal complexes, the film resistivity can be adjusted within a range of $3 \times 10^{-5}$ to $6 \times 10^{-3}$ ohm-cm as shown. This range encompasses values that have been reported for carbon (3.5×10-3) and natural graphite (1.2×10-4).

Figure 37:
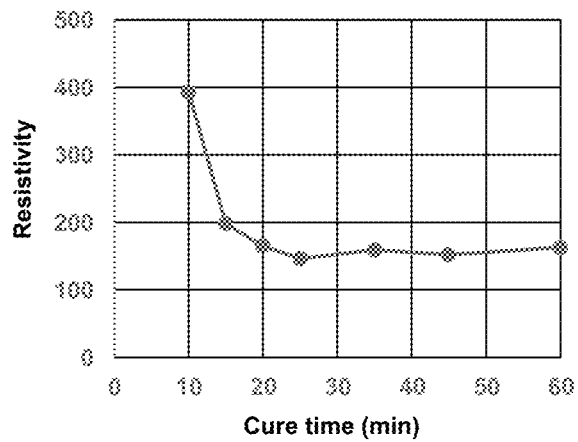
FIGS. 37 and 38 show graphs of sheet resistance as a function of cure time for molecular inks according to aspects of the present disclosure.
Figure 38:
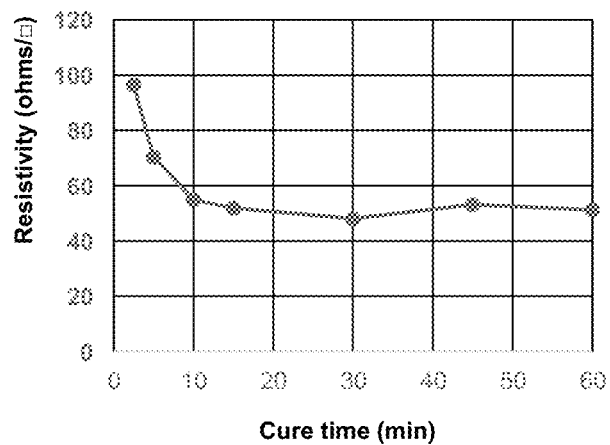

Film curing conditions were tested to find a temperature low enough to allow formation of resistive films on polymer substrates, such as PET and Kapton. The minimum thermal cure time required to form the resistive film was characterized by determining sheet resistance as a function of cure time at constant temperature. Two samples were tested under different cure conditions: (A) a film prepared with an ink containing 10 wt. % copper complex was coated on PET and cured at 140° C.; and (B) a film prepared with an ink containing 15% copper complex was coated on Kapton and cured at 180° C. FIG. 37 shows resistivity stabilizing around 160 ohm/sq after 20 minutes cure time for the film comprising 10 wt. % copper (sample A), while FIG. 38 shows resistivity stabilizing around 50 ohm/sq after 15 minutes cure time for the film comprising 15 wt. % copper (sample B).

The flexibility, adhesion, and electrical properties for a cured film formed from a molecular ink comprising both silver and copper complexes were also tested. The film properties generated from the ink indicated good adhesion to both PET film and Kapton polyimide film. An adhesion rating of 5B, which indicates no removal of coating, resulted when tested by crosshatch tape test (ASTM D3359). A mandrel test with a 50 mm bend radius confirmed the coating was conformable without cracking or delamination of the resistive film. No change in resistivity was observed after the bend test.

Figure 39:
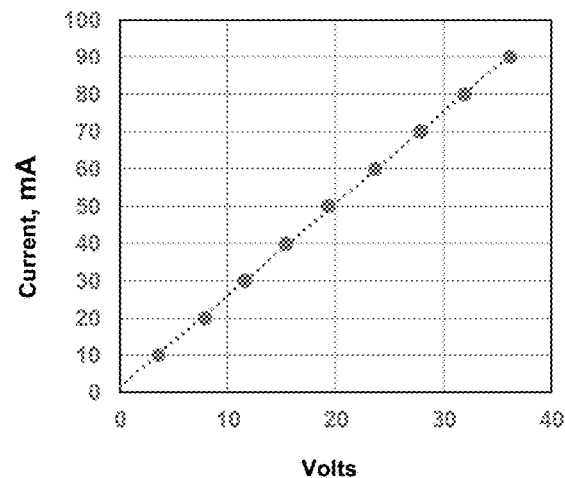
FIG. 39 shows a current-voltage graph for resistive films printed using molecular ink according to aspects of the present disclosure.

Current-voltage plots for resistive films made with blends of reactive silver complex and copper complex showed that all the film resistors obey Ohm's law. For these measurements, 7 mm×25 mm films were coated on PET, cured, then tested at ambient conditions. FIG. 39 shows a typical example in which the film was printed using an ink containing 15% copper complex. The calculated resistance for this film was 390 ohms, with a maximum power output of 3.3 watts, and maximum power density of 1.4 W/cm2.

Inkjet printability was demonstrated for ink containing 10% by weight of copper complex. A test pattern consisting of five 50 mm long lines with widths of 50 microns, 100 microns, 500 microns, 1 mm, and 2 mm was printed on both PET and Kapton®. The printer used was a Susse IP410 industrial printer equipped with a Konica Minolta KM512-SHX print-head. Print conditions were 70° C. print platen temperature, 150 mm/s print speed, 2161×1993 DPI. The ink was deposited in 3 layers, then cured at 140° C. for 25 minutes. Electrical resistance, ohms, for the printed lines are listed in Table 5. Also shown in Table 5 are electrical resistance values measure for traces printed with a molecular ink comprising only silver metal complexes. In general, resistance decreased as line width increases. Average line broadening was 49 microns (see measured width listed for the silver ink) and resistance was reduced by 3 to 4 orders of magnitude.

TABLE 5

| | Silver/Copper Ink | | Silver Ink | |
|---|---|---|---|---|
| | PET | Kapton | Melinex | |
| Pattern width (μ) | Resistance (ohms) | Resistance (ohms) | Measured width (μ) | Resistance (ohms) |
| 50 | $1.5 \times 10^6$ | $4.0 \times 10^6$ | 101 | 114 |
| 100 | $7.8 \times 10^4$ | $1.5 \times 10^4$ | 140 | 55 |
| 500 | $4.4 \times 10^4$ | $6.0 \times 10^3$ | 540 | 11.5 |
| 1000 | $1.2 \times 10^4$ | $4.0 \times 10^3$ | 1052 | 5.9 |
| 2000 | $1.2 \times 10^4$ | $3.2 \times 10^3$ | 2024 | 3.3 |

A three-zone heating device was assembled using three inks containing differing amounts of copper complex, 6.0 wt. %, 7.4 wt. %, and 9.0 wt. %, based on the total amount of silver complex and copper complex in the molecular ink. The molecular inks were coating on PET film and thermally cured at 140° C. for 25 minutes. Cured films had sheet resistance of 3.5 ohm/sq, 5.0 ohm/sq, and 10.0 ohm/sq respectively. Each zone was 1 inch×2.5 inch, and the three zones were electrically connected at opposing ends using a silver paste bus bars. A potential of 5 volts was applied and the current was determined to be 570 mA, 400 mA, and 200 mA for the three zones. Power density was calculated to be 0.18 W/cm$^2$, 0.12 W/cm$^2$, and 0.06 W/cm$^2$ respectively. The surface temperatures of the three zones after equilibration at ambient conditions were 111° C., 77° C., and 59° C. These data are summarized in Table 6.

TABLE 6

| Resistive film zone | A | B | C |
|---|---|---|---|
| Copper complex, wt. % | 6.0 | 7.4 | 9.0 |
| Sheet resistance, ohm/sq | 3.5 | 5.0 | 10.0 |
| Voltage | 5.0 | 5.0 | 5.0 |
| Current, mA | 570 | 400 | 200 |
| Power density, W/cm$^2$ | 0.18 | 0.12 | 0.06 |
| Surface temperature, ° C. | 111 | 77 | 59 |

Washability of Molecular Inks

The molecular inks of the present disclosure were printed on various textiles to form conductive traces using ink jet printing methods as disclosed hereinabove. The trace remained uncoated or was coated with a transparent UV curable polyurethane coating. Sheet resistance for these patterns was tested according to AATCC 61-2013 (laundering). As shown in FIG. 11, very little change in the conductivity for the traces was observed after up to 50 washes. The coated trace shows good conductivity after as many as 100 wash cycles, while the native (uncoated) traces showed good conductivity after as many as 70 wash cycles. The control samples completely lost conductivity after only 5 wash cycles.

Analysis of various textiles according to AATCC 61-2013 demonstrated that a conductive trace comprising 8 layers of printed ink showed less than a 3Ω increase in resistance after 100 wash cycles. When an abrasion resistant coating was included over the trace, the resistance only increased by less than 0.7Ω.

Strain Resistance

Figure 12:
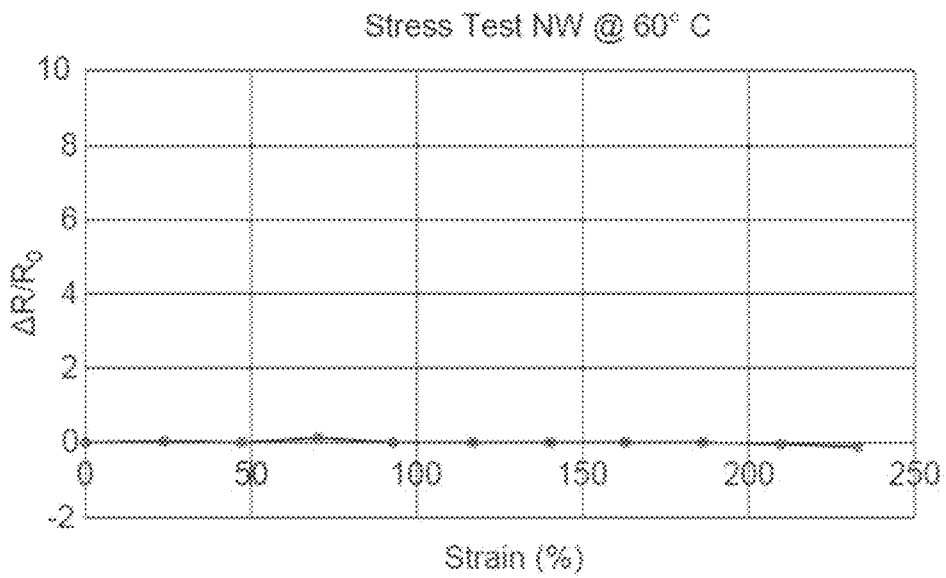
FIG. 12 shows a graph of the change in resistance with increased strain (stretch) for a conductive trace on a textile using inks and methods in accordance with certain aspects of the present disclosure.

Woven fabrics were printed using inks and methods according to the present disclosure and subjected to strain resistance measurements. Shown in FIG. 12 are results for electromechanical stretch testing under various amounts of stretching (0% to 230%). For conductive traces of the prior art, strain induces film cracking which reduces conductivity (see FIG. 5). Using inks and methods according to the present disclosure, the trace conductivity was little affected by the increased strain until the breakpoint of the textile (i.e., textile rips into two pieces). This unusual behavior is demonstrated by a very slight increase in the average spot temperature of the trace (as measured using FLIR; data not shown), where the spot temperature correlates to the amount of heat generated when electrons flow through a stretched conductive fabric; the higher the temperature, the more heated generated by the flowing electrons.

Bendability of the printed traces was also tested, as shown in FIG. 13, and only a small loss of conductivity (<10%) was observed for bending of a conductive trace printed on woven textiles using inks and methods of the present disclosure (10,000× bends in the trace; tested according to ASTM D522-Mandel Bend Test). Nonwoven textiles showed reduced performance after 1,300 bends, which is likely a function of breakdown of the textile and not the conductive trace.

Abrasion Resistance

A woven substrate was printed with a molecular ink according to the present disclosure and coated with an ablation resistance coating (Ablative Resistant Coating NSN 8030-00-164-4389) or left uncoated. Sheet resistance was measured for several textile samples after coating (control), 10×, 20×, and 30× rubbing (see Table 7).

TABLE 7

| Sample | Resistance Ω | | | | |
|---|---|---|---|---|---|
| | Before coating | After coating | After rubbing 10X | After rubbing 20X | After rubbing 30X |
| Uncoated | 6-8 | — | 62-101 | 132-138 | 300-382 |
| Coated | 6-8 | 6-7 | 9-10 | 11-12 | 12-13 |

The following aspects are disclosed in this application:

Aspect 1: A molecular ink comprising a particle-free metal complex composition comprising at least one metal complex and a solvent, and optionally, a conductive filler material.

Aspect 2: The ink according to aspect 1, wherein the at least one metal complex comprises: at least one metal, at least one first ligand which is a sigma donor to the metal and volatilizes upon heating the metal complex, and at least one second ligand, which is different from the first ligand and also volatilizes upon heating the metal complex, wherein the at least one metal, the at least one first ligand, and the at least one second ligand are provided in stoichiometric amounts in the metal complex.

Aspect 3: The ink according to aspect 1 or 2, wherein the at least one metal, the at least one first ligand, and the at least one second ligand are provided in stoichiometric amounts in the molecular ink.

Aspect 4: The ink according to any one of the preceding aspects, wherein the molecular ink forms nanoparticles after curing to form a conductive metal.

Aspect 5: The ink according to any one of the preceding aspects, wherein the solvent comprises a hydrocarbon solvent or one or more polar protic solvents substantially free from a hydrocarbon solvent, wherein the one or more polar protic solvents comprise one or more of water, an alcohol, and an amine.

Aspect 6: The ink according to any one of the preceding aspects, wherein the at least one metal complex and the conductive filler are provided in the molecular ink in a ratio of 50:50 metal complex to conductive filler, such as 60:40 metal complex to conductive filler, or 70:30 metal complex to conductive filler, or 80:20 metal complex to conductive filler, or 90:10 metal complex to conductive filler, or 99:1 metal complex to conductive filler.

Aspect 7: The ink according to any one of the preceding aspects, wherein the solvent comprises an alcohol or amine, a glycol, a conductive filler solubilizer, and water.

Aspect 8: The ink according to aspect 7, wherein the conductive filler solubilizer comprises N-methyl-2-pyrrolidone.

Aspect 9: The ink according any one of the preceding aspects, wherein the metal complex has a solubility measured at 25° C. of at least 250 mg/ml in the at least one solvent.

Aspect 10: The ink according to any one of the preceding aspects, wherein the conductive filler comprises one or more of a conductive polymer, a metal oxide, or a carbon-based material.

Aspect 11: The ink according to aspect 10, wherein the conductive polymer comprises one or more of polypyrrole (PPy), poly[3,4-ethylenedioxythiophene] (PEDOT), polyacetylene, polythiophene (PT), polyphenylene, polyaniline (PANT), or polyphenylene ethylene.

Aspect 12: The ink according to aspect 10, wherein the carbon-based material comprises one or more of graphene, carbon black, graphite, or carbon nanotubes.

Aspect 13: The ink according to any one of the preceding aspects, comprising: 10-40 wt. % of the conductive filler material and the metal complex provided in a ratio of metal complex to conductive filler material of 50:50 to 99:1; 2-10 wt. % of an alcohol or amine; 2-15 wt. % of glycol; 10-25 wt. % of a conductive filler solubilizer; and 40-70 wt. % of water.

Aspect 14: The ink according to any one of the preceding aspects, further comprising from 0.1% to 5% of an additive selected from one or more of a binder, a surfactant, a dispersant, and a dye.

Aspect 15: The ink according to any one of the preceding aspects, wherein the ink has a viscosity measured at 25° C. of 25 cps or less, such as 20 cps or less.

Aspect 16: A method for forming a flexible printed electronic element or device, the method comprising: depositing a molecular ink according to any one of aspects 1 to 15 on a flexible substrate to form at least one pattern; and curing the molecular ink in the at least one pattern to form at least one conductive pattern.

Aspect 17: The method according to aspect 16, wherein the flexible substrate comprises a knit, woven, or nonwoven fabric comprising fibers of polyester, polyamides, spandex, nylon, Evolon®, elastane, cotton, cellulose, silk, wood, wool, leather, or blends thereof, and wherein the molecular ink conformally coats fibers of the textile.

Aspect 18: The method according to aspects 16 or 17, wherein the substrate is heated to a temperature of about 30° C. to about 90° C., such as about 40° C. to about 80° C. before and/or during deposition of the molecular ink.

Aspect 19: The method according to any one of aspects 16 to 18, wherein depositing the molecular ink comprises printing two or more layers.

Aspect 20: The method according to any one of aspects 16 to 19, wherein the at least one conductive pattern is deposited by inkjet printing and exhibits an ink bleed of less than 0.5 mm, such as less than 0.2 mm.

Aspect 21: The method according to any one of aspects 16 to 20, wherein the at least one conductive pattern exhibits a resistance of less than 10Ω/☐, such as less than 5Ω/☐, or less than 2Ω/☐, or even less than 1Ω/☐.

Aspect 22: The method according to any one of aspects 16 to 21, wherein the curing is by heating at a temperature of less than 200° C. for a time of less than 20 minutes, exposure to 2-20 pulses of pulsed light, exposure to infrared radiation, or any combination thereof.

Aspect 23: The method according to any one of aspects 16 to 22, wherein the textile substrate is pretreated with oxygen plasma, corona, a protective coating, or combination thereof.

Aspect 24: The method according to any one of aspects 16 to 23, further comprising, after curing the molecular ink: coating at least a portion of the conductive pattern with a protective dielectric coating.

Aspect 25: The method according to any one of aspects 16 to 24, wherein the flexible substrate is a flexible synthetic or organic substrate.

Aspect 26: The method according to any one of aspects 16 to 25, wherein the flexible substrate is a polymer film selected from the group consisting of polyimide, polyethylene terephthalate, polyethersulfone, polyetheretherketone, polyamide, polyamideimide film, and combinations thereof.

Aspect 27: The method according to any one of aspects 16 to 26, wherein the flexible printed electronic element or device functions as a sensor, an electrode, a circuit, an interconnect, a light, an antenna, a resistive heating element, a switch, a battery, or any combination thereof.

Aspect 28: A flexible resistive heater produced by any one of the methods of aspects 16 to 27, the heater comprising: a flexible substrate having at least one conductive pattern printed thereon and configured to carry a current and generate heat, wherein at least a portion of the conductive pattern is optionally over-coated with a protective dielectric coating.

Aspect 29: A flexible resistive heater comprising: a flexible substrate having at least one conductive pattern printed thereon and configured to carry a current and generate heat, wherein the at least one conductive pattern is printed with a molecular ink according to any one of aspects 1 to 15, and at least a portion of the conductive pattern is optionally over-coated with a protective dielectric coating.

Aspect 30: The resistive heater according to aspect 28 or 29, further comprising at least one bus printed with the molecular ink, the at least one bus electrically connected to the at least one conductive pattern and configured to provide connection to a power source.

Aspect 31: The resistive heater according to any one of aspects 26 to 28, wherein the flexible substrate is a polymer film selected from the group consisting of polyimide, polyethylene terephthalate, polyethersulfone, polyetheretherketone, polyamide, polyamideimide film, and combinations thereof; or wherein the flexible substrate comprises a knit, woven, or nonwoven fabric comprising fibers of polyester, polyamides, spandex, nylon, Evolon®, elastane, cotton, cellulose, silk, wood, wool, leather, or blends thereof (e.g., silicone leather).

Aspect 32: The resistive heater according to any one of aspects 26 to 29, wherein, when connected to a 5-15 volt electrical system, the at least one conductive pattern is configured to have a resistivity of 1-30 ohms; generate 10-400 watts per square meter at −40° C. to 60° C.; heat at a rate of about 0.1° C./second to about 1° C./second; and/or carry a power density of at least 400 watts per square meter.

Aspect 33: A flexible force sensor produced by any one of the methods of aspects 16 to 27, the force sensor comprising: an electrode layer comprising at least one electrode printed on a flexible substrate with a molecular ink and a conductive layer, where in the electrode layer and the conductive layer are separated by a gap having a separation distance, wherein the flexible force sensor is configured to initiate an electrical signal upon compression of the electrode layer and conductive layer in a direction perpendicular to a longitudinal extent of the force sensor (reduction of the separation distance of the gap so that the conductive layer and the electrode layer come into contact).

Aspect 34: A flexible force sensor comprising: an electrode layer comprising at least one electrode printed on a flexible substrate with a molecular ink according to any one of aspects 1 to 15; and a conductive layer, wherein the electrode layer and the conductive layers are separated by a gap having a separation distance, wherein the flexible force sensor is configured to initiate an electrical signal upon compression of the electrode layer and the conductive layer in a direction perpendicular to a longitudinal extent of the force sensor (reduction of the separation distance of the gap so that the conductive layer and the electrode layer come into contact).

Aspect 35: The force sensor according to aspect 33 or 34, further comprising a control circuitry connected to the at least one electrode and to a communications device, wherein the control circuitry is configured to carry the electrical signal.

Aspect 36: The force sensor according to any one of aspects 33 to 35, the electrode layer comprises at least two electrodes printed on a first side of the flexible substrate.

Aspect 37: The force sensor according to aspect 36, wherein the conductive layer comprises an electrically conductive strip on a first side of a second flexible substrate, wherein the conductive strip of the conductive layer faces the at least two electrodes of the electrode layer.

Aspect 38: The force sensor according to any one of aspects 33 to 37, wherein the conductive layer and the electrode layer are separated by a gap having a separation distance.

Aspect 39: The force sensor according to any one of aspects 33 to 38, wherein the gap is maintained by a mesh fabric, embossing on one of the substrate layers, a material frame, such as a polymer film comprising an opening in the region of the electrode, dots or beads, or any combination thereof.

Aspect 40: The force sensor according to any one of aspects 33 to 39, wherein the electrode layer and the conductive layer are bonded by a hot melt bonding film, pressure sensitive bonding film, pressure sensitive adhesive, or by sewing, such as outside of the region separated by the gap (i.e., edges of the force sensor), or outside of the region comprising at least the first and second electrodes.

Aspect 41: The force sensor according to any one of aspects 33 to 40, wherein the conductive strip is printed with a molecular ink according to any one of aspects 1 to 15, a resistive carbon-based ink, a conductive paint, indium tin oxide (ITO), or a combination thereof, or wherein the conductive strip comprises any of a poly(3,4-ethylenedioxythiophene) polystyrene sulfonate (PEDOT:PSS), a carbon nanotube-based thin film (CNT), a carbon-loaded thermoplastic polymer, carbon-loaded silicone, carbon-loaded polymeric foil, velostat, or any combination thereof.

Aspect 42: The force sensor according to aspect 41, wherein the resistive carbon is one of high resistivity or low resistivity carbon.

Aspect 43: The force sensor according to any one of aspects 33 to 42, wherein the flexible substrate is a polymer film selected from the group consisting of polyimide, polyethylene terephthalate, polyethersulfone, polyetheretherketone, polyamide, polyamideimide film, and combinations thereof; or wherein the flexible substrate comprises a knit, woven, or nonwoven fabric comprising fibers of polyester, polyamides, spandex, nylon, Evolon®, elastane, cotton, cellulose, silk, wood, wool, leather, or blends thereof (e.g., silicone leather).

Aspect 44: A sensor controlled device comprising: at least one sensor according to any one of aspects 33 to 43; an electrical device; and a control circuitry connected to the at least one electrode of the force sensor and configured to carry the electrical signal from the force sensor to a communications device, wherein the communications device is configured to control supply of power from a power source to the electrical device based at least in part on the electrical signal from the force sensor.

Aspect 45: The sensor-controlled device according to aspect 44, wherein the electrical device comprises one or more of a motor, a resistive heater, and a light.

Aspect 46: A force sensor controlled resistive heater comprising: a resistive heater comprising a first flexible substrate having at least one conductive pattern printed thereon with a first molecular ink according to any one of aspects 1 to 15 and configured to carry a current and generate heat, and at least one bus printed with the molecular ink, the bus electrically connected to the at least one conductive pattern and configured to provide connection to a power source; a force sensor comprising an electrode layer having at least one electrode printed on a second flexible substrate with a second molecular ink according to any one of aspects 1 to 15, and a conductive layer, wherein the electrode layer and the conductive layers are separated by a gap having a separation distance, wherein the flexible force sensor is configured to initiate an electrical signal upon compression of the electrode layer and the conductive layer in a direction perpendicular to a longitudinal extent of the force sensor (reduction of the separation distance of the gap so that the conductive layer and the electrode layer come into contact); and a control circuitry connected to the at least one electrode of the force sensor and configured to carry the electrical signal from the force sensor to a communications device, wherein the communications device is configured to control supply of power from the power source to the resistive heater based at least in part on the electrical signal from the force sensor.

Aspect 47: The sensor-controlled heater according to aspect 46, wherein at least a portion of the at least one conductive pattern of the resistive heater is over-coated with a protective dielectric coating.

Aspect 48: The sensor controlled heater according to aspect 46 or 47, wherein, when connected to a 5-15 volt electrical system, the at least one conductive pattern is configured to have a resistivity of 1-30 ohms; generate 10-400 watts per square meter at −40° C. to 60° C.; heat at a rate of about 0.1° C./second to about 1° C./second; and/or carry a power density of at least 400 watts per square meter.

Aspect 49: The sensor-controlled heater according to any one of aspects 46 to 48, wherein the electrode layer of the force sensor comprises at least two electrodes printed on a first side of the second flexible substrate.

Aspect 50: The sensor controlled heater according to any one of aspects 47 to 49, wherein the conductive layer of the force sensor comprises an electrically conductive strip on a first side of a third flexible substrate, wherein the conductive strip of the conductive layer faces the at least two electrodes of the electrode layer.

Aspect 51: The sensor-controlled heater according to any one of aspects 47 to 50, wherein the conductive strip of the force sensor is printed with the first or second molecular ink, a resistive carbon-based ink, a conductive paint, indium tin oxide (ITO), or a combination thereof, or may comprise any of a poly(3,4-ethylenedioxythiophene) polystyrene sulfonate (PEDOT:PSS), a carbon nanotube-based thin film (CNT), a carbon-loaded thermoplastic polymer, carbon-loaded silicone, carbon-loaded polymeric foil, velostat, or any combination thereof.

Aspect 52: The sensor-controlled heater according to aspect 51, wherein the resistive carbon is one of high resistivity or low resistivity.

Aspect 53: The sensor-controlled heater according to any one of aspects 47 to 52, wherein the conductive layer and electrode layer of the force sensor are separated by a gap having a separation distance.

Aspect 54: The sensor controlled heater according to any one of aspects 47 to 53, wherein the gap is maintained by a mesh fabric, embossing on one of the substrate layers, a material frame, such as a polymer film comprising an opening in the region of the electrode, dots or beads, or any combination thereof.

Aspect 55: The sensor controlled heater according to any one of aspects 47 to 54, wherein the first, second, and third flexible substrates are individually selected from the group consisting polyimide, polyethylene terephthalate, polyethersulfone, polyetheretherketone, polyamide, and polyamide-imide films, and combinations thereof; or wherein the first, second, and third flexible substrates are individually selected from a knit, woven, or nonwoven fabric comprising fibers of polyester, polyamides, spandex, nylon, Evolon®, elastane, cotton, cellulose, silk, wood, wool, leather, or blends thereof (e.g., silicone leather).

Aspect 56: A sensor controlled resistive heater comprising: a resistive heater according to any one of aspects 28 to 32; a plurality of force sensor according to any one of aspects 33 to 43; and a control circuitry comprising a communication device and a controller, the control circuitry connected to the at least one electrode of the force sensor and configured to carry the electrical signal from the force sensor to a communications device, wherein the communications device is configured to communication with a controller to modulate a function of the resistive heater.

Aspect 57: The sensor-controlled heater according to aspect 56, wherein the controller is configured to control supply of power from the power source to the resistive heater based at least in part on the electrical signal from the force sensor Aspect 58: The sensor-controlled heater according to aspect 56, wherein the modulated function includes turning power to the resistive heater on, off, or varying the power supplied to the resistive heater.

What is claimed is:
1. A particle free molecular ink comprising:
   75-99 wt. % of a first metal complex comprising a metal, at least one first ligand, and at least one second ligand;
   1-25 wt. % of a second metal complex comprising a metal, at least one first ligand, and at least one second ligand; and
   two or more polar protic solvents,
   wherein the wt. % is based on the total weight of the first and second metal complex in the molecular ink, and
   wherein the first metal complex comprises silver diamine carboxylate and the second metal complex comprises copper diamine carboxylate.
2. The molecular ink of claim 1, wherein for each of the first and second metal complexes, the metal, the at least one first ligand, and the at least one second ligand are provided in stoichiometric amounts in the molecular ink.

3. The molecular ink of claim 1, wherein the silver diamine carboxylate comprises silver diamine oxalate or silver diamine isobutyrate.

4. The molecular ink of claim 1, comprising:
80-99 wt. % silver diamine carboxylate and 1-20 wt. % copper diamine carboxylate.

5. The molecular ink of claim 1, wherein the two or more polar protic solvents comprise water and an amine.

6. The molecular ink of claim 5, further comprising 0.01 to 2 wt. % of a surfactant based on the total weight of the molecular ink.

7. A method for forming tuning the resistivity of a resistive coating, the method comprising:
depositing the molecular ink of claim 1 by inkjet printing on a flexible substrate; and
curing the molecular ink to form a conductive pattern by heating at a temperature of less than 200° C. for a time of less than 20 minutes, exposure to 2-20 pulses of pulsed light, exposure to infrared radiation, or any combination thereof.

8. The method of claim 7, wherein depositing the molecular ink comprises printing two or more layers of the molecular ink on the flexible substrate.

9. The method of claim 7, wherein the flexible substrate is a textile that is pretreated with oxygen plasma, corona, a protective coating, or a combination thereof.

10. The method of claim 7, wherein the flexible substrate comprises a knit, woven, or nonwoven fabric comprising fibers of polyester, polyamides, spandex, nylon, Evolon®, elastane, cotton, cellulose, silk, wood, wool, leather, or blends thereof.

11. The method of claim 7, wherein the flexible substrate is a polymeric film.

12. The method of claim 11, wherein the polymeric film comprises polyimide film, polyethylene terephthalate film, polyethersulfone film, polyetheretherketone film, polyamide film, or polyamideimide film.

13. The method of claim 9, wherein the flexible substrate is heated to a temperature of 30° C. to 90° C. during deposition of the molecular ink.

14. The method of claim 9, wherein the cured molecular ink exhibits a resistivity of 0.5-200 ohm/sq based on the amount of second metal complex comprising copper in the molecular ink.

15. A flexible resistive heater comprising:
a flexible substrate having at least one conductive pattern printed thereon and configured to carry a current and generate heat,
wherein the at least one conductive pattern is printed on the flexible substrate with a molecular ink according to claim 1, and
wherein the flexible substrate is a flexible textile or polymer film.

16. The resistive heater of claim 15, wherein the at least one conductive pattern comprises greater than 99% metal.

17. The resistive heater of claim 15, wherein the at least one conductive pattern exhibits a resistivity of 0.5-200 ohm/sq.

18. The resistive heater of claim 15, further comprising at least one bus printed with the molecular ink, the at least one bus electrically connected to the at least one conductive pattern and configured to provide connection to a heater controller and a power source.

19. The resistive heater of claim 15, wherein the flexible textile comprises a knit, woven, or nonwoven fabric comprising fibers of polyester, polyamides, spandex, nylon, Evolon®, elastane, cotton, cellulose, silk, wood, wool, leather, or blends thereof, and wherein the polymer film comprises a polyimide, polyethylene terephthalate, polyethersulfone, polyetheretherketone, polyamide, or polyamideimide.

20. A resistive heater for deicing an airplane wing comprising the flexible resistive heater of claim 15 printed on a flexible polymeric film and adhered to the leading edge of an airplane wing.

21. The resistive heater of claim 15, wherein the at least one conductive pattern comprises greater than 90% metal.

22. A flexible resistive film for dissipating electric energy, the film comprising:
a flexible substrate having at least one conductive pattern printed thereon and configured to carry a current,
wherein the at least one conductive pattern is printed on the flexible substrate with a molecular ink according to claim 1, and
wherein the flexible substrate is a flexible textile or polymer film.

23. A resistive film for deicing an airplane wing comprising the flexible resistive film of claim 22 printed on a flexible polymeric film and adhered to the leading edge of an airplane wing.

* * * * *